United States Patent [19]
Aoki

[11] Patent Number: 6,121,664
[45] Date of Patent: Sep. 19, 2000

[54] SEMICONDUCTOR MEMORY DEVICE

[75] Inventor: Hitoshi Aoki, Kasaoka, Japan

[73] Assignee: Sharp Kabushiki Kaisha, Osaka, Japan

[21] Appl. No.: 08/811,785

[22] Filed: Mar. 6, 1997

[30] Foreign Application Priority Data

Mar. 12, 1996 [JP] Japan ..................................... 8-055235

[51] Int. Cl.⁷ .............................................. H01L 31/119
[52] U.S. Cl. .......................... 257/390; 257/391; 257/622; 438/257; 438/259
[58] Field of Search ................... 257/390, 391, 257/622; 438/257, 259

[56] References Cited

U.S. PATENT DOCUMENTS

| | | | |
|---|---|---|---|
| 4,974,042 | 11/1990 | Ashida et al. | 357/23.12 |
| 5,453,392 | 9/1995 | Hong et al. | 437/49 |
| 5,578,857 | 11/1996 | Hong et al. | 257/391 |
| 5,859,460 | 1/1999 | Ju et al. | 257/391 |

FOREIGN PATENT DOCUMENTS

| | | |
|---|---|---|
| 53-41188 | 4/1978 | Japan . |
| 357036858 | 2/1982 | Japan ..................................... 257/390 |
| 63-131568 | 6/1988 | Japan . |

*Primary Examiner*—William Mintel
*Attorney, Agent, or Firm*—Nixon & Vanderhye P.C.

[57] ABSTRACT

A semiconductor memory device includes: a semiconductor substrate; a plurality of first transistors formed over the semiconductor substrate in a matrix configuration, each of the first transistors having a channel region; a plurality of second transistors formed over the semiconductor substrate in a matrix configuration, each of the second transistors having a channel region; and a plurality of word lines formed in parallel in a first direction, each of the word lines functioning as a word line and a gate electrode. At least two channel regions of the plurality of first transistors make contact in the first direction; and at least two channel regions of the plurality of second transistors make contact in a second direction.

32 Claims, 50 Drawing Sheets

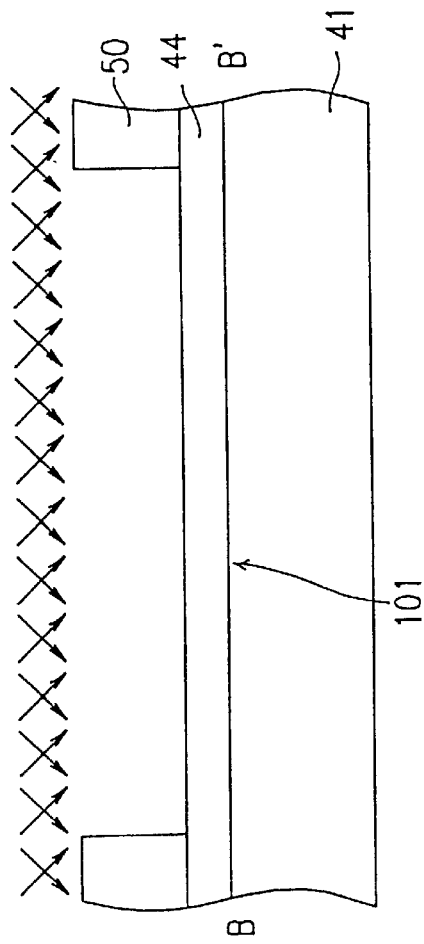
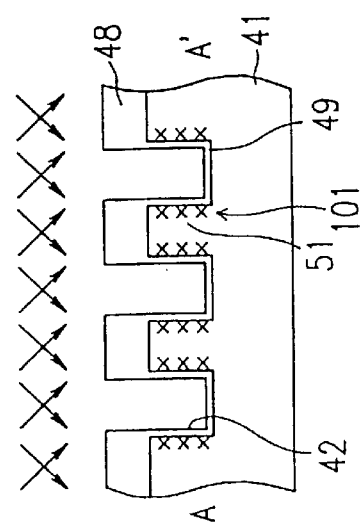
FIG.27B
FIG.27A

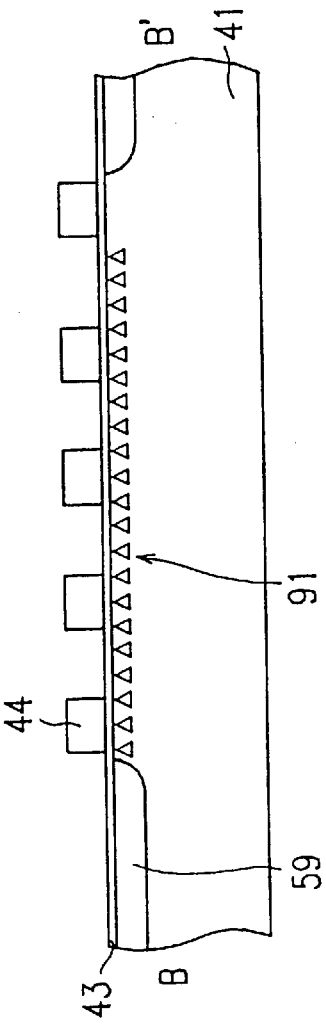
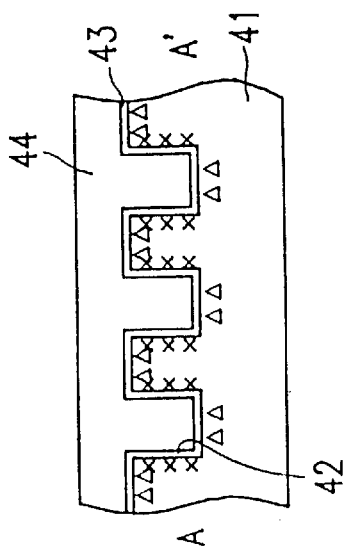

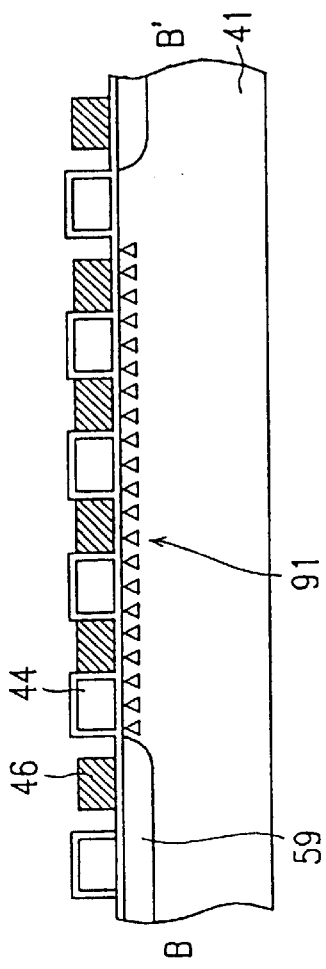
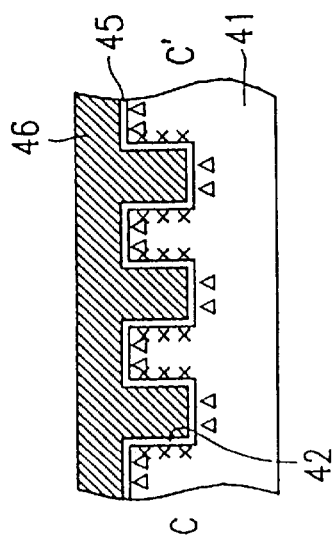
FIG.33B
FIG.33A

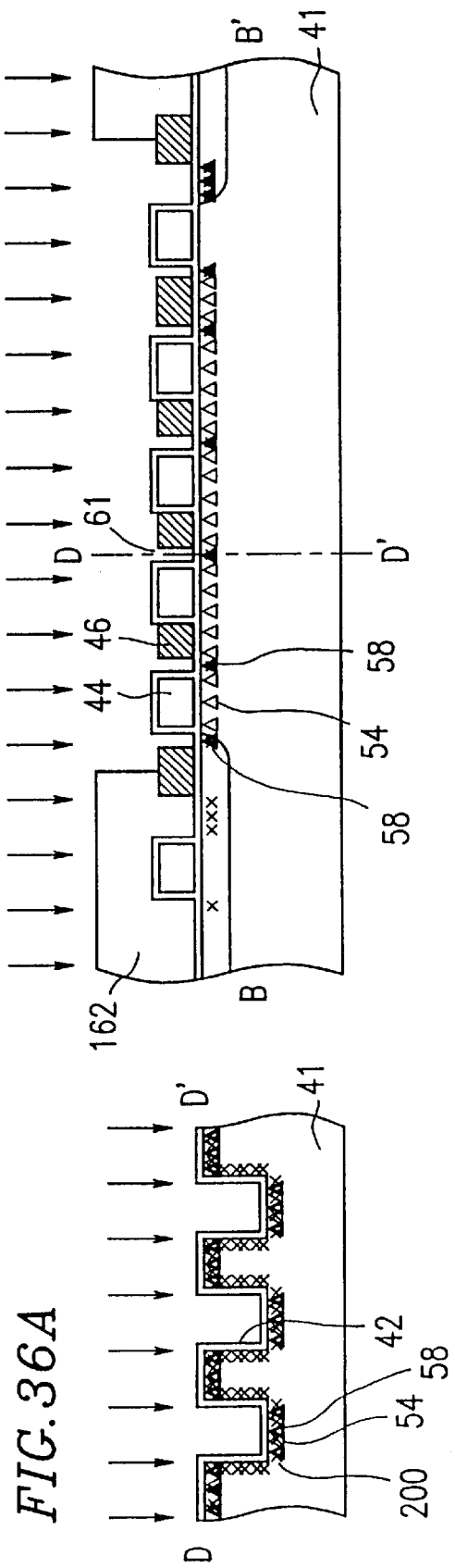

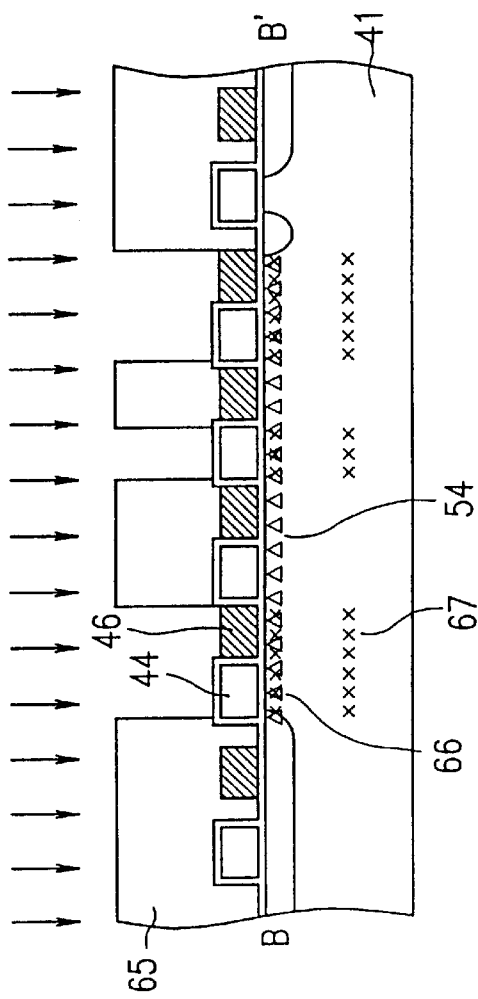
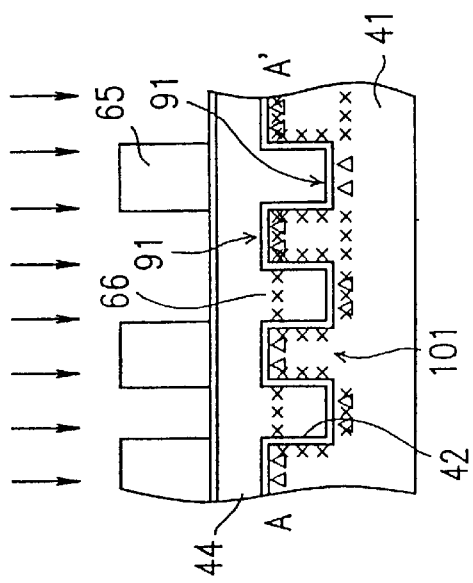
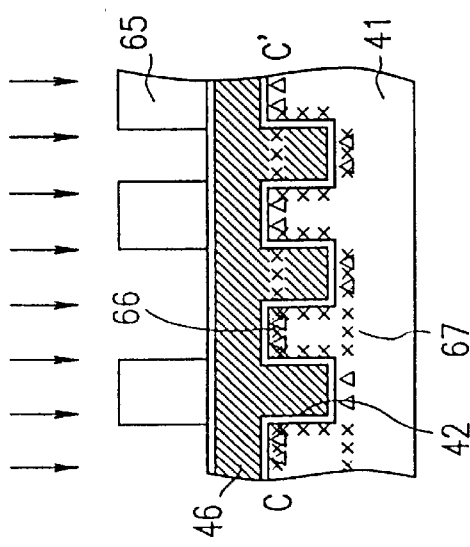

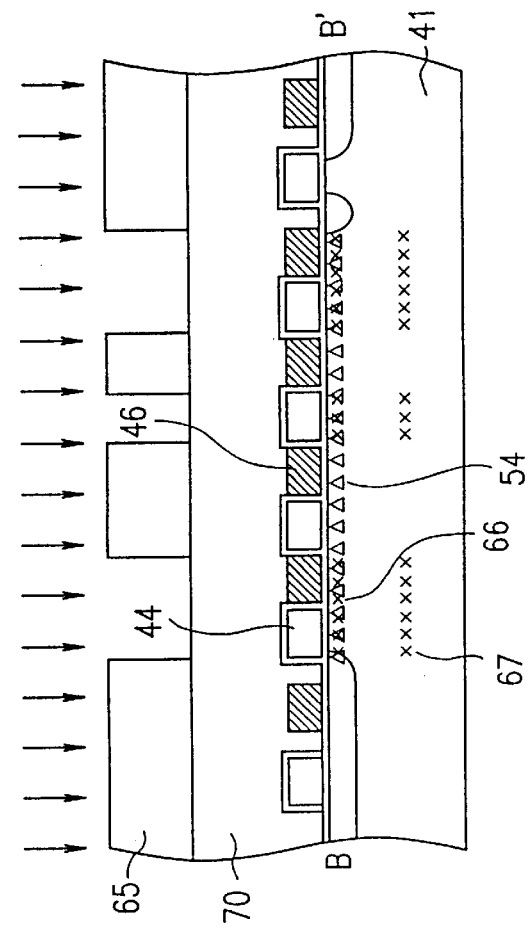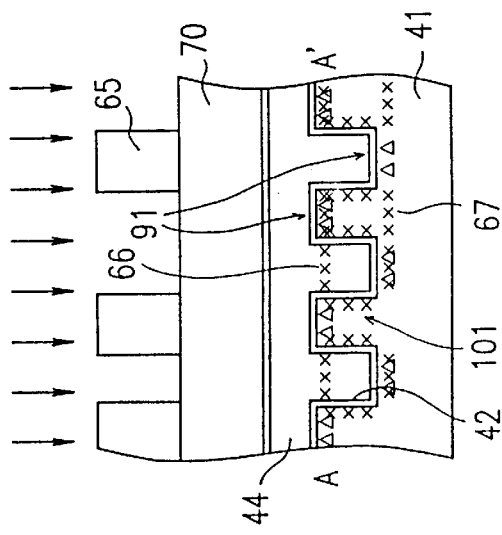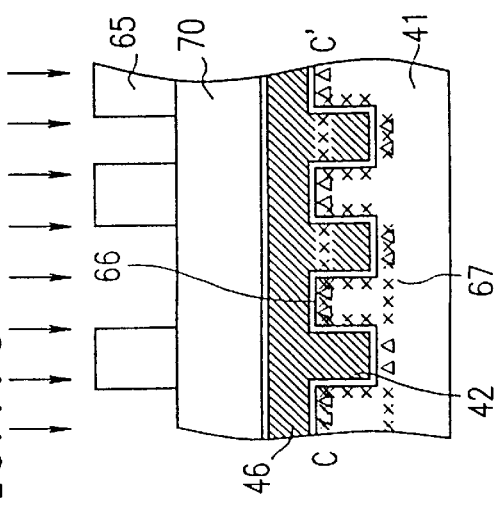

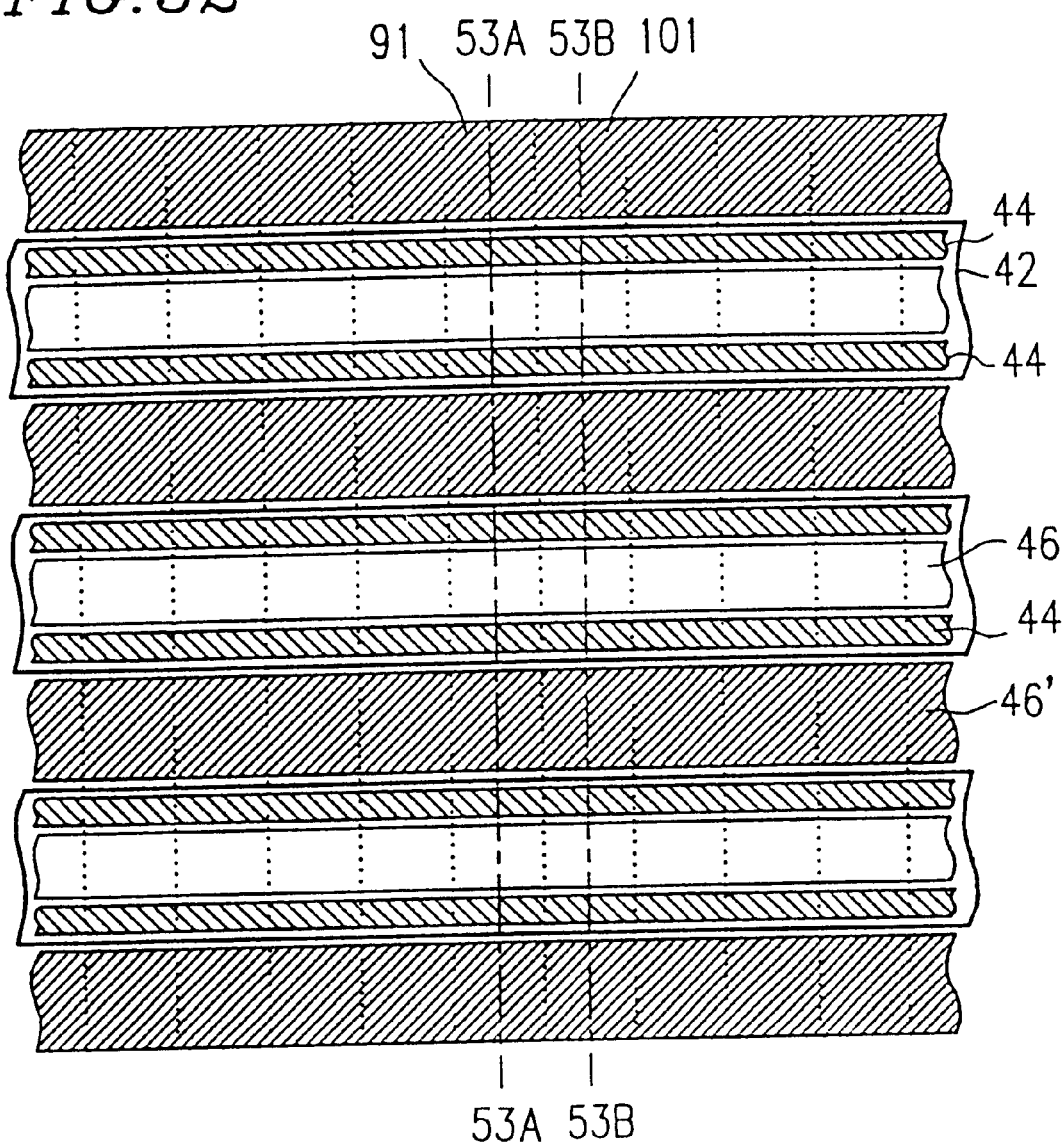

SEMICONDUCTOR MEMORY DEVICE

BACKGROUND OF THE INVENTION

1. Field of the Invention

The present invention relates to a semiconductor device and a method for producing the same. Particularly, the present invention relates to a semiconductor device which has both NAND-type and NOR-type cell transistors as memory cell transistors (hereinafter, referred to as cell transistors) simultaneously present on a single semiconductor substrate, and to a method for producing the same.

2. Description of the Related Art

Conventionally known types of memory cells in a mask ROM are a NAND-type ROM and a NOR-type ROM. The NAND-type ROM has a plurality of columns of transistors, each column being made of a plurality of cell transistors connected in series. In each of the transistor columns, enhancement-type transistors and depletion-type transistors are arranged in accordance with ROM data so that the ROM data can be written.

The NOR-type ROM has a plurality of columns of transistors, each including a plurality of cell transistors connected in parallel with respect to the bit line. In each of the transistor columns, threshold voltages are set above the power source voltage for the transistors selected in accordance with the ROM data so that the ROM data can be written.

In general, NAND-type ROMs are excellent in high integration but poor in high speed operation. Conversely, NOR-type ROMs are excellent in high speed operation but poor in high integration. The reason why the NOR-type ROMs are poor in high integration is as follows. The NOR-type ROM generally requires one contact hole for wire connection for every two cell transistors. This makes it necessary to reserve both a region for contact hole formation and a margin for mask alignment during contact hole formation. Consequently, miniaturization of memory cells becomes difficult.

As a result, NAND-type ROMs have mainly been used for the realization of high integration. The reason for this is that since a plurality of cell transistors are connected in series to configure a plurality of transistor columns, the contact holes need only to be formed at both ends of the transistor columns. The larger the number of transistors to be connected in series, the higher the integration becomes.

However, there still is a growing need for higher integration of memory cells. In order to further pursue high integration using the NAND-type ROMs, it is necessary to reduce displacement of isolation walls.

One conventional example which is to meet such demand is a high integration NOR-type ROM (hereinafter referred to as the first conventional example) in which device isolation is achieved without forming an isolation wall, thereby reducing the step of the isolation wall, and the contact hole for wire connection is not formed for every memory cell. Therefore, advantages of both the NAND-type ROM and the NOR-type ROM are retained.

The high integration NOR-type ROM of the first conventional example will be described a bit further with reference to FIGS. 54A, 54B, 54C and 54D. A plurality of high concentration diffusion layers 202 and 203 which become source/drain regions and bit lines are formed in parallel in a memory cell formation region of a semiconductor substrate 201. Provided over this semiconductor substrate 201 with a gate insulating film 204 inserted therebetween are a plurality of gate electrodes (word lines) 205 which extend perpendicular to the high concentration diffusion layers 202 and 203 which become bit lines. Regions where the gate electrodes 205 or the high concentration diffusion layers 202 and 203 are not formed are ion-implanted with an impurity having conductivity type different from that of the source/drain regions 202. These regions 206 are designated by function as an isolation between the cell transistors. In FIG. 54A, reference numerals 251 and 252 indicate the cell transistor region.

Since memory cells having such a configuration do not have the isolation wall such as a LOCOS (local oxidation of silicon) film, the semiconductor substrate 201 has a planar surface. For this reason, the gate electrodes 205 can be disposed with a pitch which is less than the typical fabrication limit. Furthermore, since the isolation walls 206 can be self-aligningly ion-implanted using the gate electrodes 205 as a mask, high integration of the memory cells is greatly facilitated.

However, even a high integration NOR-type ROM described above has problems to be overcome in order to further achieve higher integration as the above-described conventional NAND-type ROM does. Methods for further achieving higher integration in NAND-type ROMs or NOR-type ROM described above include a method where the gate electrodes have a multi-layer structure and a method where the isolation wall is not provided.

An example of the former is disclosed in Japanese Laid-Open Patent Publication No. 53-41188 (hereinafter, referred to as the second conventional example) and an example of the latter is disclosed in Japanese Laid-Open Patent Publication No. 63-131568 (hereinafter, referred to as the third conventional example).

FIGS. 55A, 55B and 55C illustrate the conventional example suggested in Japanese Laid-Open Patent Publication No. 53-41188. This conventional example was applied to a NAND-type ROM. As illustrated in the figures, a first gate oxide film 304 is formed on a semiconductor substrate 301, and then a plurality of first gate electrodes 305 are provided thereon in the horizontal direction with a separation of prescribed distance, thereby forming first MIS (metal insulator semiconductor)-type transistors. Furthermore, after forming the first gate electrodes 305, a second gate oxide film 306 is formed on the entire surface of the semiconductor substrate 301 so as to cover the first gate electrodes 305. Then, second gate electrodes 307 are provided thereon, thereby forming second MIS-type transistors. In this semiconductor device, the second gate electrodes 307 are provided between the first gate electrodes 305. Therefore, the occupied area for each cell transistor when viewed from above can be made one half of that in the above first conventional example. As a result, the degree of integration can be doubled.

FIGS. 56A, 56B and 56C illustrate the conventional example suggested in Japanese Laid-Open Patent Publication No. 63-131568. This conventional example was applied to a NOR-type ROM. The source regions 402 and the drain regions 403 are formed on the semiconductor substrate 401 in parallel with a separation of a channel length, and then the gate electrodes 405 are formed so as to become perpendicular to the source regions 402, the drain regions 403 and the channel regions 404 formed between the source regions 402 and the channel regions 404. These gate electrodes are also provided in a plurality of numbers in the horizontal direction with a separation of a prescribed distance. Reference numeral 406 designates a gate insulating film. According to this conventional example, since isolation walls are not present between the gate electrodes 405, a pitch between lines can be reduced thereby and higher integration of memory cells can be achieved.

However, in either of the above-described second conventional example and the third conventional example, there is a certain limit in meeting the recent demand for higher integration. Particularly, in the second conventional example, since the step between one layer and another layer becomes large, it is likely that a layer formed on these layers is torn. This complicates the production method and poses some problems when improving production efficiency.

SUMMARY OF THE INVENTION

In one aspect of the present invention, there is provided a semiconductor memory device including: a semiconductor substrate; a plurality of first transistors formed over said semiconductor substrate in a matrix configuration, each of said first transistors having a channel region; a plurality of second transistors formed over said semiconductor substrate in a matrix configuration, each of said second transistors having a channel region; a plurality of word lines formed in parallel in a first direction, each of said word lines functioning as a word line and a gate electrode; wherein at least two channel regions of said plurality of first transistors make contact in a second direction substantially perpendicular with respect to said first direction; and at least two channel regions of said plurality of second transistors make contact in said second direction.

In one embodiment of the invention, said plurality of first transistors are classified into a first group of transistors having a first threshold voltage for making said first transistor conductive and a second group of transistors having a second threshold voltage for making said first transistor conductive; and said plurality of second transistors are classified into a third group of transistors having a third threshold voltage for making said second transistor conductive and a fourth group of transistors having a fourth threshold voltage for making said second transistor conductive.

Alternatively, the semiconductor memory device according to the present invention includes: a semiconductor substrate; a plurality of word lines formed over said semiconductor substrate in parallel in a first direction; a column of transistors including a plurality of first transistors, each of said plurality of first transistors having a gate electrode and a channel region, said gate electrode being a part of one of said plurality of word lines, said plurality of first transistors being connected in series in a second direction which is substantially perpendicular to said first direction and being arranged in parallel in plurality of numbers in said first direction; and a row of transistors including a plurality of second transistors, each of said plurality of second transistors having a gate electrode and a channel region, said gate electrode being a part of one of said plurality of word lines, said channel region of at least one of said plurality of second transistors being connected to said channel region of at least one of said plurality of first transistors, said plurality of second transistors adjoining one another in said second direction, and being arranged in parallel in plurality of numbers in said second direction; wherein a threshold voltage for turning on said plurality of second transistors is higher than a threshold voltage for turning on said plurality of first transistors.

In one embodiment of the invention, a plurality of grooves are formed on said semiconductor substrate in parallel in said second direction, said plurality of grooves having a side surface and a bottom surface; a channel region of said plurality of first transistors of one of said column of transistors is formed over the bottom surface of said groove; a channel region of said plurality of first transistors of another one of said column of transistors is formed over the upper surface of said semiconductor substrate between grooves; and a channel region of one of said plurality of second transistors of one of said column of transistors is formed over the side surface of said groove.

In another embodiment of the invention, a plurality of grooves are formed on said semiconductor substrate in parallel in said second direction, said plurality of grooves having a side surface and a bottom surface; a channel region of said plurality of second transistors of one of said column of transistors is formed over the bottom surface of said groove; a channel region of said plurality of second transistors of another one of said column of transistors is formed over the upper surface of said semiconductor substrate between grooves; and a channel region of one of said plurality of first transistors of one of said column of transistors is formed over the side surface of said groove.

In still another embodiment of the invention, said plurality of word lines are classified into a plurality of first word lines and a plurality of second word lines; a plurality of grooves are formed over said semiconductor substrate in parallel in said first direction, each of said plurality of grooves having a side surface and a bottom surface; at least one of said plurality of first word lines is formed over at least one of the bottom surfaces of said plurality of grooves; at least one of said plurality of first word lines is formed over at least one of the upper surfaces of said semiconductor substrate between said plurality of grooves; at least one of said plurality of second word lines is formed along at least one of the side surfaces of said plurality of grooves; a channel region of said plurality of first transistors of one of said column of transistors is formed over the bottom surface of said groove; a channel region of said plurality of first transistors of one of said column of transistors is formed over the upper surface of said semiconductor substrate between grooves; a channel region of one of said plurality of first transistors of one of said column of transistors is formed over the side surface of said groove; a channel region of said plurality of second transistors of one of said row of transistors is formed over the bottom surface of said groove; a channel region of said plurality of second transistors of one of said row of transistors is formed over the upper surface of said semiconductor substrate between grooves; and a channel region of one of said plurality of second transistors of one of said row of transistors is formed over the side surface of said groove.

In still another embodiment of the invention, said first transistor is a transistor of the NAND type, and said second transistor is a transistor of the NOR type.

In another aspect of the present invention, there is provided a method of producing a semiconductor memory device, wherein: a plurality of channel regions of transistors of the NAND type extend in parallel in one direction, and a channel region of a transistor of the NOR type is formed in said one direction between said plurality of channel regions of said transistors of the NAND type; at least one of said plurality of channel regions of said transistors of the NAND type becomes a source/drain of said transistor of the NOR type, said method including the steps of: forming in parallel over a semiconductor substrate a plurality of first gate electrodes which become a gate electrode of a transistor of the NAND type and a gate electrode of a transistor of the NOR type in another direction which is substantially perpendicular to said one direction; forming over said semiconductor substrate a second gate electrode which becomes a gate electrode of a transistor of the NAND type and a gate electrode of a transistor of the NOR type between said plurality of first gate electrodes; performing ion implantation to an end portion of a memory cell region so as to form a high concentration diffusion layer which becomes a drawing electrode of said memory cell region made of transistors of the NAND type and transistors of the NOR type; performing ion implantation to said memory cell region so as to form a source/drain region of a transistor of the NAND type; connecting said drawing electrode and an end portion of said memory cell region; performing ion implantation to a channel region of a transistor of the NOR type so as to control a threshold voltage of said transistor of the NOR type; performing ion implantation to a channel region of a transistor of the NAND type so as to control a threshold voltage of said transistor of the NAND type; performing ion implantation to said transistor of the NOR type so as to write data in said transistor of the NOR type; performing ion implantation to said transistor of the NAND type so as to write data in said transistor of the NAND type; wherein the above steps can be performed in an arbitrary order.

In one embodiment of the invention, the method further includes the steps of: forming a plurality of grooves in parallel on said semiconductor substrate in said one direction; performing ion implantation to the bottom surface and the side surface of said plurality of grooves and to the upper surface of said semiconductor substrate between said plurality of grooves; forming one of a channel region of said transistor of the NAND type and a channel region of said transistor of the NOR type over the bottom surface of said plurality of grooves and over the upper surface of said semiconductor substrate between said plurality of grooves; forming the other one of a channel region of said transistor of the NAND type and a channel region of said transistor of the NOR type on the side surface of said plurality of grooves; wherein the above steps can be performed in an arbitrary order.

In another embodiment of the invention, the method further includes the steps of: forming a plurality of grooves in parallel on said semiconductor substrate in said another direction; forming one of said first gate electrode and said second gate electrode over the bottom surface of said plurality of grooves and over the upper surface of said semiconductor substrate between said plurality of grooves; forming the other one of said first gate electrode and said second gate electrode over the side surface of said plurality of grooves; forming the channel region of said transistor of the NAND type and the channel region of said transistor of the NOR type over the bottom surface and the side surface of said plurality of grooves and over the upper surface of said semiconductor substrate between said plurality of grooves; wherein the above steps can be performed in an arbitrary order.

Alternatively, the semiconductor memory device according to the present invention includes: a plurality of first transistors each having a channel region; a plurality of second transistors each having a channel region; and a plurality of word lines including said channel regions of said plurality of first transistors and said channel regions of said plurality of second transistors; at least one of said word lines functioning as a word line and a gate electrode; wherein said channel region of at least one of said plurality of first transistors adjoins said channel region of at least one of said plurality of second transistors .

Thus, the invention described herein makes possible the advantages of (1) providing a semiconductor device in which higher integration of memory cells can further be achieved and of (2) providing a method for producing such a semiconductor device.

These an d other advantages of the present invention will become apparent to those skilled in the art upon reading and understanding the following detailed description with reference to the accompanying figures.

BRIEF DESCRIPTION OF THE DRAWINGS

FIGS. 27A and 27B are cross-sectional views taken along the line A–A' and B–B' in FIG. 25, respectively, illustrating a method for producing the semiconductor device according to the ninth embodiment of the present invention;

FIGS. 32A and 32B are cross-sectional views taken along the lines A–A' and B–B' in FIG. 25, respectively, illustrating a method for producing the semiconductor device according to the ninth embodiment of the present invention;

FIGS. 33A and 33B are cross-sectional views taken along the lines C–C' and B–B' in FIG. 25, respectively, illustrating a method for producing the semiconductor device according to the ninth embodiment of the present invention;

FIG. 36B is a cross-sectional view taken along the line B–B' in FIG. 25, and FIG. 36A is a cross-sectional view taken along the line D–D' in FIG. 36B, both figures illustrating a method for producing the semiconductor device according to the ninth embodiment of the present invention;

FIGS. 39A, 39B and 39C are cross-sectional views taken along the line A–A', B–B' and C–C' in FIG. 25, respectively, illustrating the method for producing the semiconductor device according to the ninth embodiment of the present invention;

FIGS. 41A, 41B and 41C are cross-sectional views taken along the lines A–A', B–B' and C–C' in FIG. 25, respectively, illustrating a method for producing a semiconductor device according to a tenth embodiment of the present invention;

FIG. 52 is a plan view of the semiconductor device according to the fifteenth embodiment of the present invention;

DESCRIPTION OF THE PREFERRED EMBODIMENTS

Figure 1:
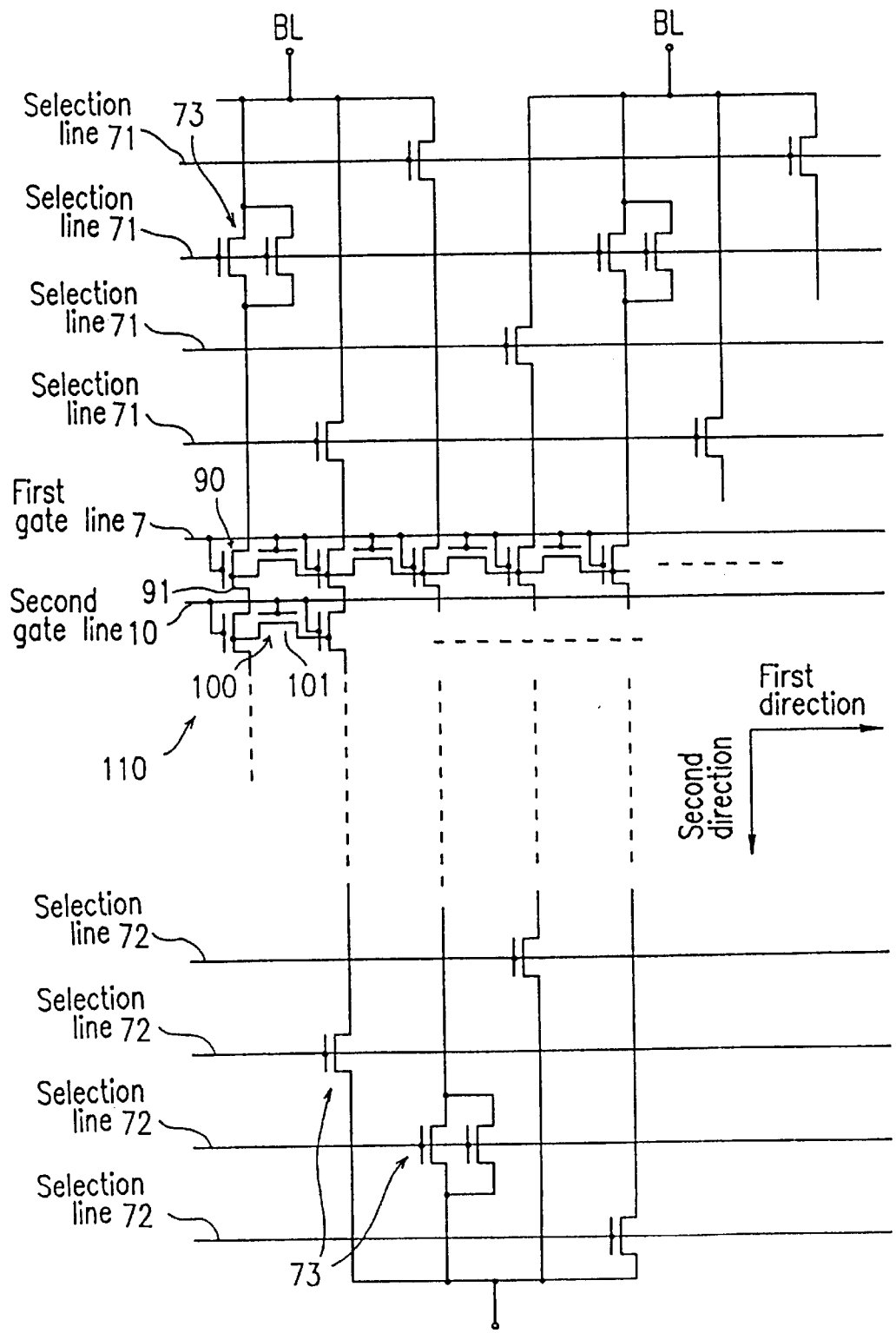
FIG. 1 is an equivalent circuit diagram of a semiconductor device according to a first embodiment of the present invention.

Hereinafter, preferred embodiments of the present invention will be described with reference to the attached figures.

Embodiment 1

FIGS. 1 through 5 illustrate a semiconductor device according to a first embodiment of the present invention.

The semiconductor device of the first embodiment differs from the conventional high integration NOR-type ROM memory cells in that there is no high concentration diffusion wiring region such as sub-bit lines. Instead, it has a configuration where cell transistors 90 of the NAND-type ROMs are disposed. That is, it has a configuration where both cell transistors 100 of the NOR type and cell transistors 90 of the NAND type are present in the memory cell regions 110.

As illustrated in the figures, in the first embodiment, the gate electrode which also functions as a word line is provided in the memory cell region in double layer configuration. That is, first layers of gate electrodes 7 are formed in the horizontal direction parallel to each other with a separation of a prescribed distance, and second layers of gate electrodes 10 are provided between the two neighboring gate electrodes 7. Therefore, the two gate electrodes 7 and 10 are parallel to each other. In the present invention, the expression that the two gate electrodes 7 and 10 are parallel includes not only the case where the two gate electrodes 7 and 10 are parallel to each other with a prescribed distance but also the case where ends of the two neighboring gate electrodes 7 and 10 are stacked on top of one another in the vertical direction.

Using the double layer gate electrodes 7 and 10, a plurality of channel portions 91 of the cell transistors 90 of the NAND type are directly connected and disposed, thereby using the region as the memory cell, which was used only for conventional wiring.

In addition, the channel portions 101 of the cell transistors 100 of the NOR type, which use the same gate electrode as the cell transistor 90, are disposed between the channel portions 91 of the cell transistor 90 of the NAND type. Because of this, the semiconductor device has a configuration where the portion of the semiconductor substrate 1 in the memory cell region under the gate electrodes 7 and 10 can be used as the channel region for each cell transistor. Therefore, high integration of memory cells can be achieved.

The overall configuration of the device will be described a bit further with reference to FIGS. 1 and 2. A plurality of first gate electrodes 7 which also function as the first word lines are provided in the memory cell region 110, the gate electrodes 7 being parallel to each other in the first direction which corresponds to the left-to-right direction in the figures. Then, each of the second gate electrodes 10 which also function as the second word line is provided between the first gate electrodes 7.

A plurality of selection lines 71 and 72 are provided along the first direction in the regions of both ends of the memory cell region 110 in a second direction which is perpendicular to the first direction. One group of the selection lines 71 are provided in the neighborhood of the bit line BL side and the other group of selection lines 72 are provided in the neighborhood of the ground line GL side. Each of the selection lines 71 and 72 is connected to a corresponding transistor 73. In such a configuration, if the selection lines 71 and 72 are selected by the selection line transistor 73 and the word line is selected, then the cell transistor in the prescribed address region is selected.

Figure 2:
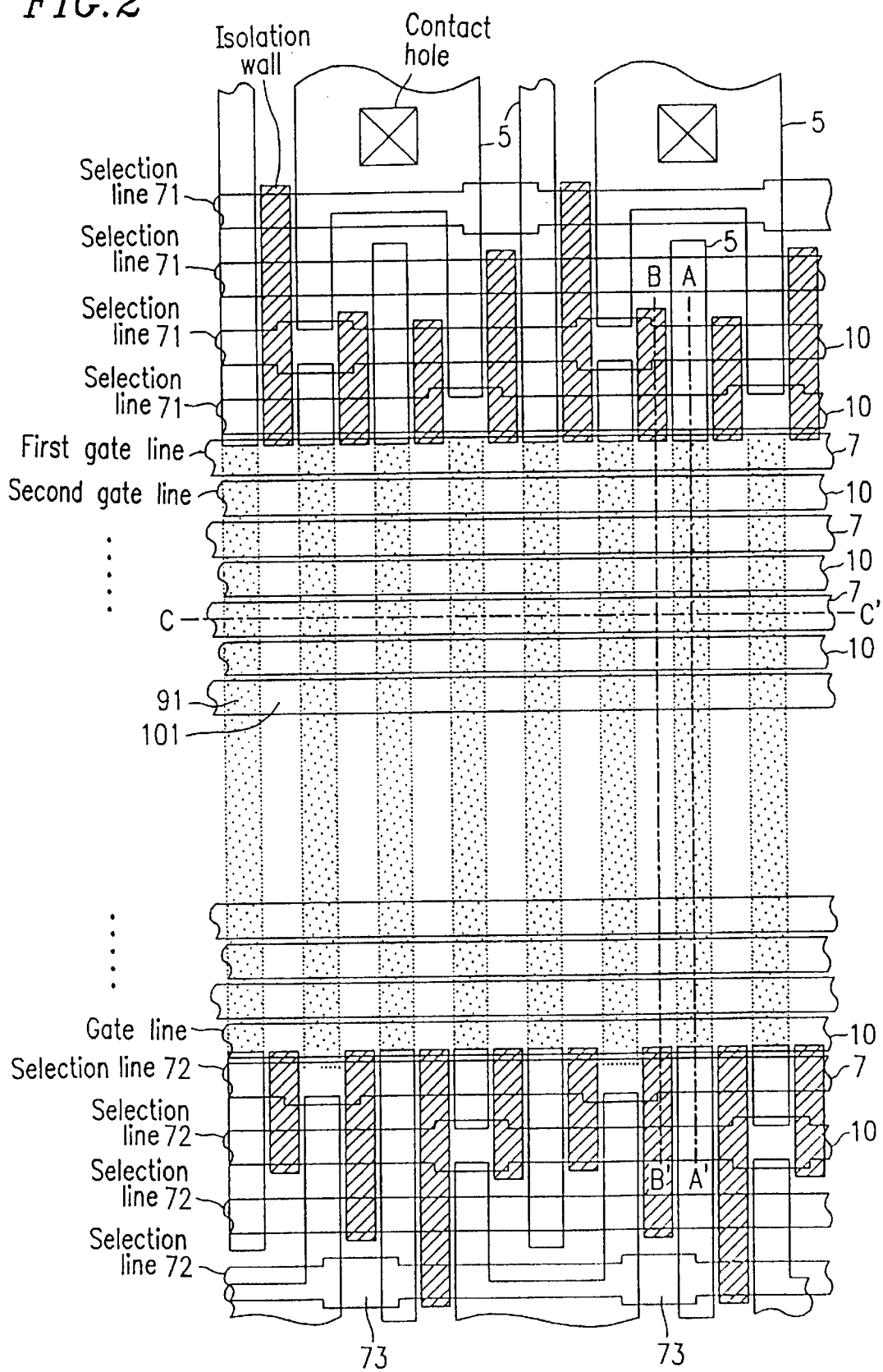
FIG. 2 is a plan view of the semiconductor device according to the first embodiment of the present invention.

As illustrated in FIGS. 1 and 2, the channel portions 91 of the cell transistors 90 of the NAND type extend in the second direction, and the channel portions 101 of the cell transistors 100 of the NOR-type extend in the second direction between the two neighboring channel portions 91. The end portion of the channel portion 91 of the bit line BL side is connected to the drawing electrode 5 (see FIG. 2). As illustrated in FIG. 1, the channel portion 91 of the cell transistor 90 of the NAND type also functions as the source/drain of the cell transistor 100 of the NOR type.

The threshold voltage $V_{th}$ of all the cell transistors 100 of the NOR type is higher than the threshold voltage $V_{th}$ of the cell transistors 90 of the NAND type. The detailed description of the configuration of the above semiconductor device will become clear when the production steps are described later.

Next, a write operation for the ROM data will be described with reference to FIG. 3 and Table 1.

TABLE 1

| Gate voltage | | "L" | "M" | "H" |
|---|---|---|---|---|
| Cell transistor of NAND type | (1) Depression-type | ON | ON | ON |

TABLE 1-continued

| Gate voltage | | "L" | "M" | "H" |
|---|---|---|---|---|
| Cell transistor of NOR type | (2) Enhancement-type | OFF | ON | ON |
| | (3) Middle threshold voltage Vth | OFF | OFF | ON |
| | (4) High threshold voltage Vth | OFF | OFF | OFF |

The write operation for ROM data are performed as follows. All cell transistors of the NAND-type are set at either the cell transistors (1) which become depletion-type or the cell transistors (2) which become enhancement-type. In all cell transistors of the NOR-type, the threshold voltage $V_{th}$ of all cell transistors (3) is set at an intermediate threshold voltage $V_{th}$ which is higher than the threshold voltage of enhancement-type cell transistors. Among the cell transistors (3) with the intermediate threshold voltage $V_{th}$, the threshold voltage $V_{th}$ of selected cell transistor(s) (4) is set at a voltage which is higher than the voltage of the power supply. Accordingly, a selected cell transistor(s) (4) which can maintain a state of complete OFF can be produced.

Next, the read operation for the ROM data will be described based on Table 1 and FIGS. 3 and 4. Before the read operation, all the word lines are set at the "M" level. In this condition, the cell transistors 90 of the NAND type (including depletion-type and enhancement-type) are all ON, and the cell transistors 100 of the NOR type are all OFF.

Figure 3:
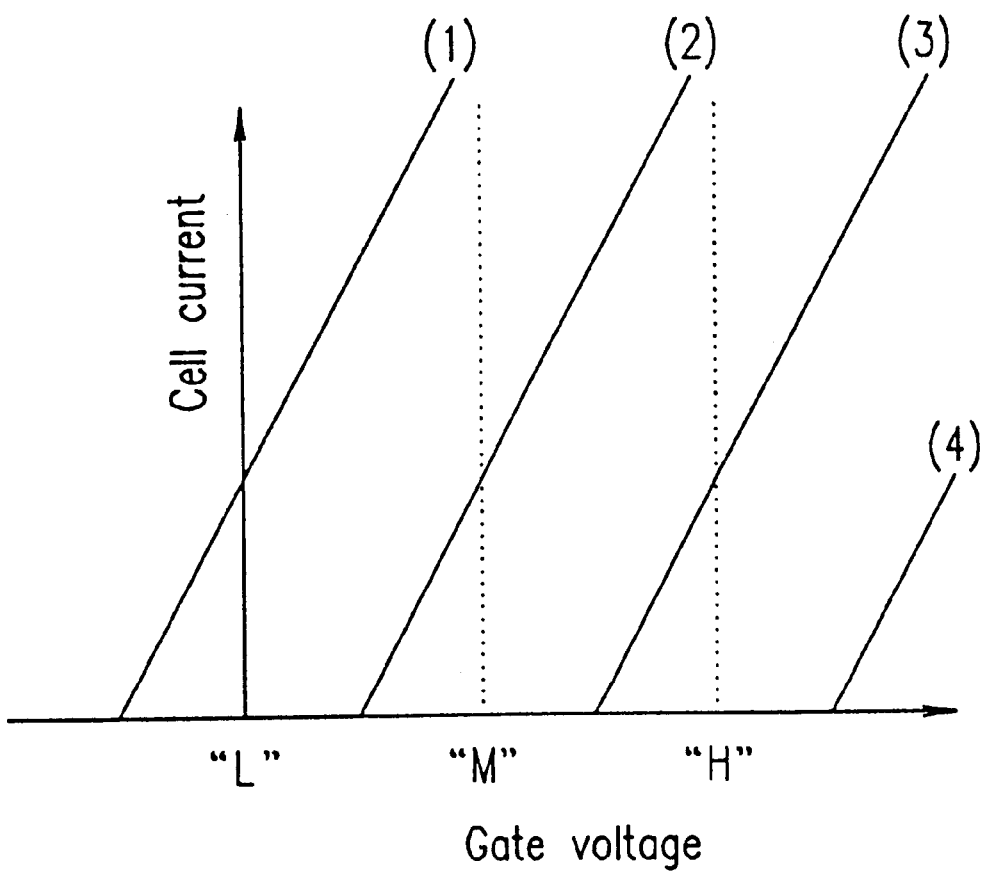
FIG. 3 is a graph illustrating a cell current characteristic of a cell transistor of the semiconductor apparatus according to the first embodiment of the present invention.
Figure 4:
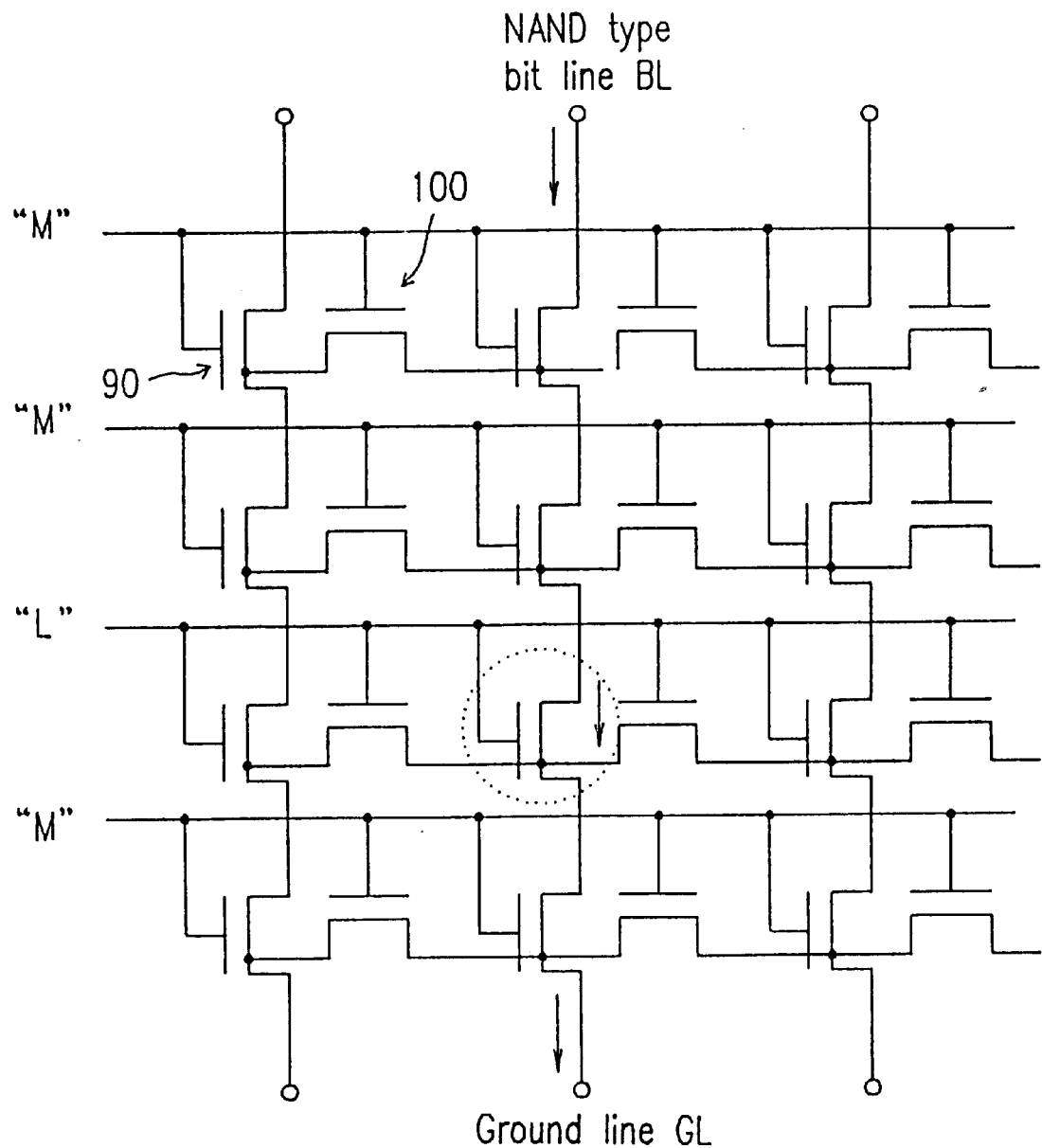
FIG. 4 is a diagram for describing a read-out operation of a cell transistor of the NAND type of the semiconductor device according to the first embodiment of the present invention.

During the read operation on the cell transistors 90 of the NAND type, the selected word lines are set at the "L" level as illustrated in FIGS. 3 and 4. Then, the cell transistor 90 between the bit line BL and the ground line GL corresponding to the cell transistor column of the NAND type to be read-out makes conduction if it is the cell transistor(s) of (1) depletion-type and does not if it is the cell transistor(s) of (2) enhancement-type, thereby enabling the read operation.

Figure 5:
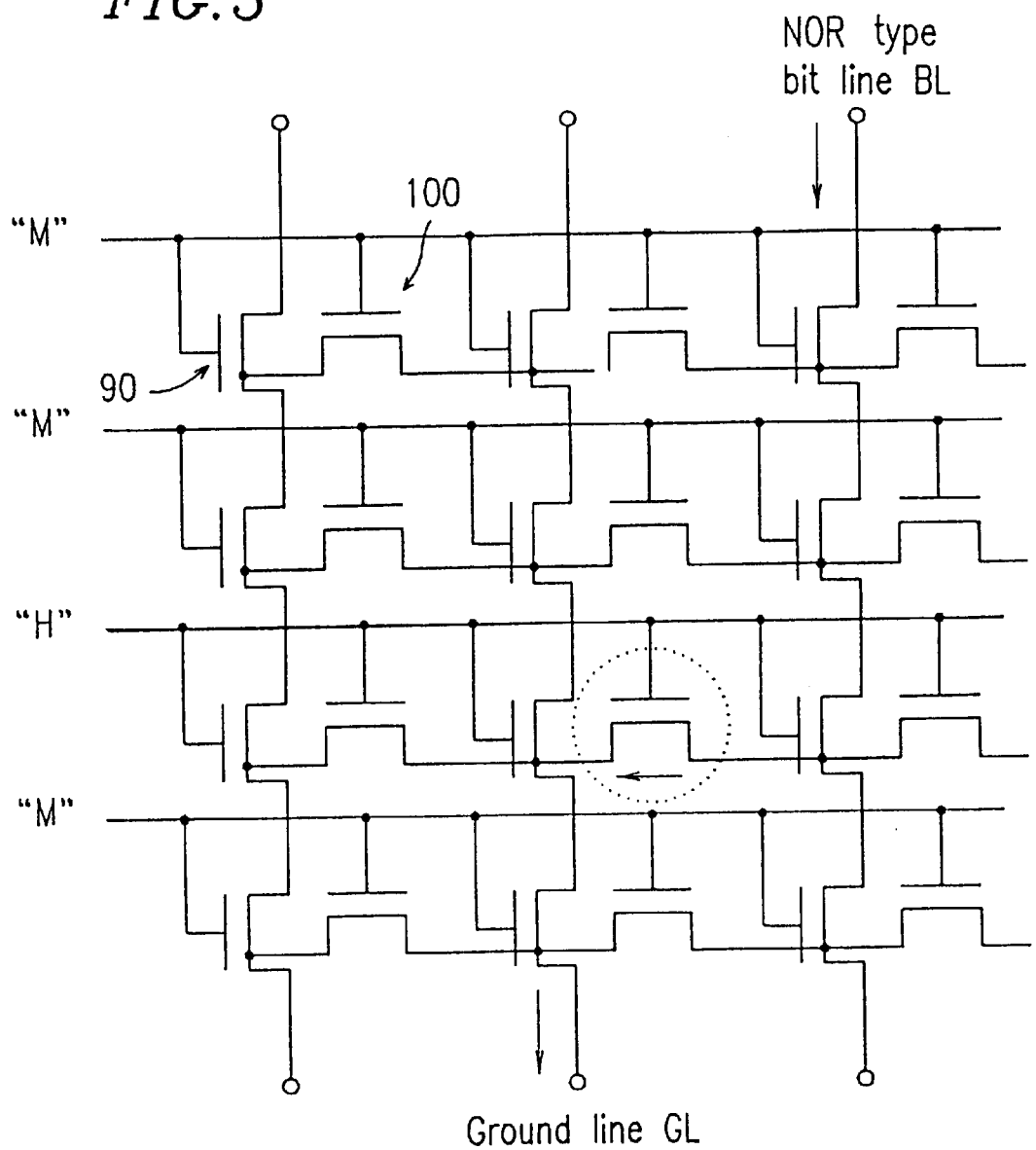
FIG. 5 is a diagram for describing a read-out operation of cell transistor of the NOR type of the semiconductor device according to the first embodiment of the present invention.

Next, during the read operation on the cell transistors 100 of the NOR type, the selected word lines are set at "H" level as illustrated in FIGS. 3 and 5. Then, the cell transistor 100 to be read-out between the bit line BL and the ground line GL corresponding to the cell transistor column of the NOR type to be read-out does not conduct if it is the transistor (4) with high threshold voltage $V_{th}$ of completely OFF and does conduct if it is the transistor (3) with the intermediate level threshold voltage $V_{th}$, thereby enabling the read operation for the ROM data. When this is being done, the cell transistors 90 of the NAND type are all ON and, therefore, can be regarded as the wiring.

In the above description, although the bit lines BL corresponding to the cell transistor column of the NAND type and the bit lines BL corresponding to the cell transistor column of the NOR type are expressed as being separate bit lines, they are actually sharing the same line by selecting the current path by the selection lines 71 and 72 (see FIGS. 4 and 5).

Figure 6:
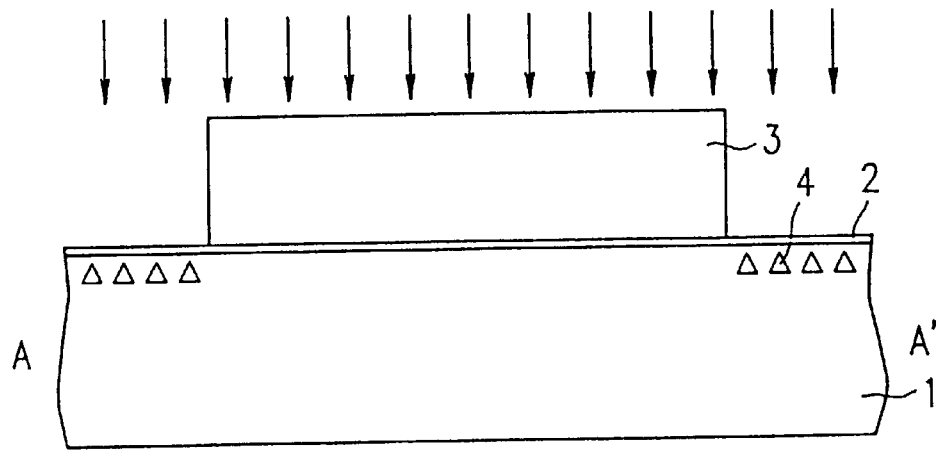
FIG. 6 is a cross-sectional view taken along the line A–A' in FIG. 2 illustrating a method for producing the semiconductor device according to the first embodiment of the present invention.
Figure 7:
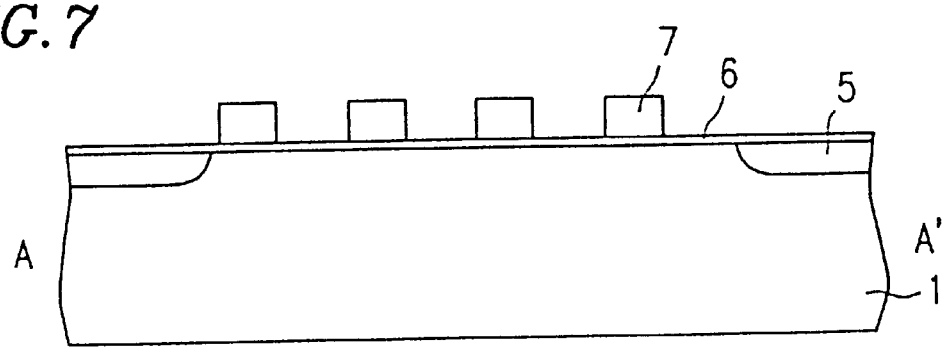
FIG. 7 is a cross-sectional view taken along the line A–A' in FIG. 2 illustrating a method for producing the semiconductor device according to the first embodiment of the present invention.

Next, production steps for the semiconductor device according to the first embodiment will be described with reference to FIGS. 6–8, 9A–9D, 10A–10D, 11A and 11B and 12A–12C. First, an oxide film 2 is formed on the semiconductor substrate 1 as illustrated in FIG. 6. Subsequently, a resist pattern 3 is formed thereon as an ion implantation mask for an impurity having conductivity type reverse to that of the semiconductor substrate 1. Next, ions 4 are implanted into the semiconductor substrate 1 from above the resist pattern 3. This produces a source/drain region 5 in the ion implantation region as illustrated in FIG. 7. This source/drain region 5 is used as the drawing electrode 5 from the cell transistors of the NAND type illustrated in FIG. 2.

When the above-described cell transistors have, for example, the n-channel MOS structure, the above-described ion implantation is performed with arsenic ions ($As^+$) at an implantation density on the order of $10^{15}$ cm$^{-2}$. The implantation energy is, for example, 40 keV.

Next, the oxide film 2 and the resist pattern 3 are removed, and a first gate oxide film 6 having a film thickness of 5 to 30 nm is formed on the semiconductor substrate 1 as illustrated in FIG. 7. Next, a plurality of first gate electrodes 7 which become first word lines are formed parallel to each other on the gate oxide film 6. The first gate electrodes 7 are formed, for example, of an $N^+$ polysilicon film of 200 to 300 nm thickness, or have two-layer structure made of a lower $N^+$ polysilicon film of 100 nm thickness and an upper tungsten silicide film of 100 nm thickness.

Figure 8:
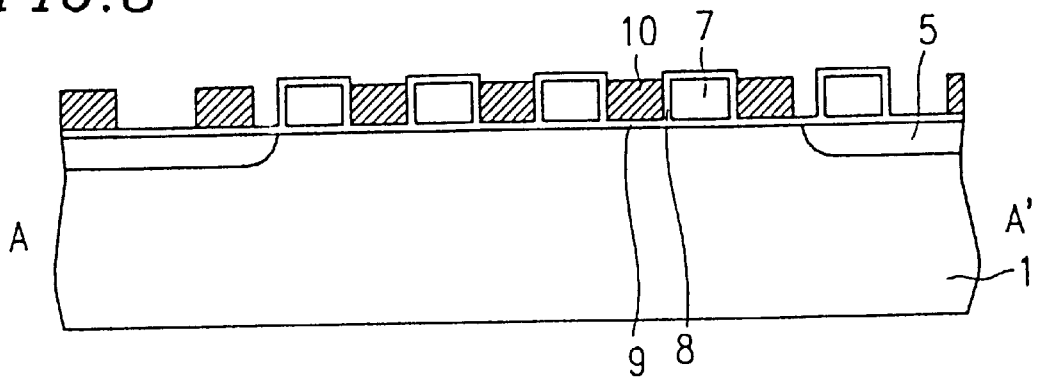
FIG. 8 is a cross-sectional view taken along the line A–A' in FIG. 2 illustrating a method for producing the semiconductor device according to the first embodiment of the present invention.

Next, as illustrated in FIG. 8, an insulating film is formed on the semiconductor substrate 1 so as to cover the first gate electrodes 7. This insulating film becomes a second gate insulating film 9 and an insulating film 8 between the gate electrodes. Next, a plurality of second gate electrodes 10 which become second word lines are formed parallel to each other over the semiconductor substrate 1 through the second gate insulating film 9 and the insulating film 8 between the gate electrodes being inserted therebetween. As illustrated in FIGS. 8 and 2, the second gate electrodes 10 are provided between the first gate electrodes 7 so as to be parallel with the first gate electrodes 7. The second gate electrodes 10 are made, for example, of an $N^+$ polysilicon film of 200 to 300 nm thickness, or have two-layer structure made of a lower $N^+$ polysilicon film of 100 nm thickness and an upper tungsten silicide film of 100 nm thickness.

Incidentally, it is preferable to choose the film material and the film thickness in such a manner that the ion implantation resistivity is the same for the first gate electrode 7 and the second gate electrode 10. If that is the case, the ion implantation to the cell transistors 90 of the NAND type and the cell transistors 100 of the NOR type, both connected to the first gate electrodes 7, and the ion implantation to the cell transistors 90 of the NAND type and the cell transistors 100 of the NOR type, both connected to the second gate electrodes 10, can be simultaneously performed during ion implantation for writing ROM data which is to be performed later. This reduces the number of necessary steps and improves production efficiency.

Methods for forming the gate electrodes 7 and 10 also include a method of burying and etching back besides usual photolithography and dry etching, where the gate electrodes are formed in a self-aligning manner. According to this method, the overlapping of the first gate electrode 7 and the second gate electrode 10 can be prevented. It can also prevent another problem from happening that the implantation amount lacks in the overlapping region during the ion implantation for writing ROM data which is to be performed later.

Figure 9A:
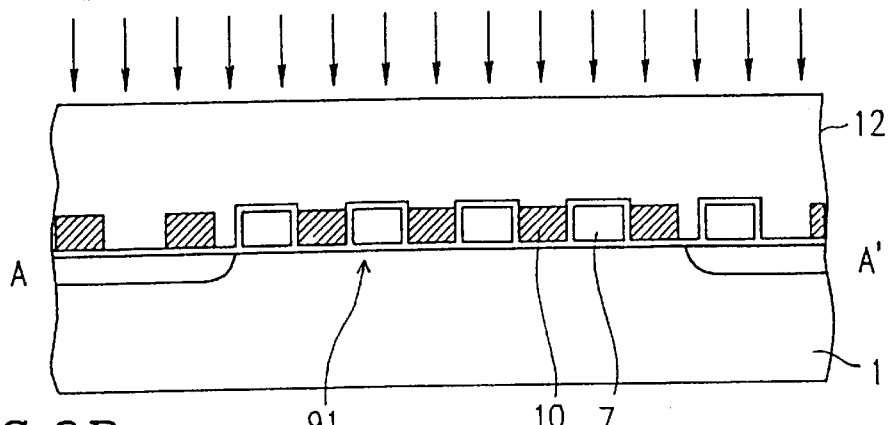
FIGS. 9A, 9B, 9C and 9D are cross-sectional views taken along the lines A–A', B–B', C–C' and B–B' in FIG. 2, respectively, illustrating a method for producing the semiconductor device according to the first embodiment of the present invention.
Figure 9B:
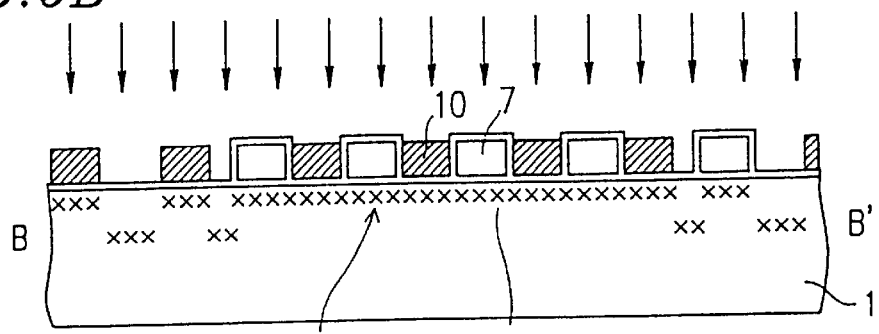
Figure 9C:
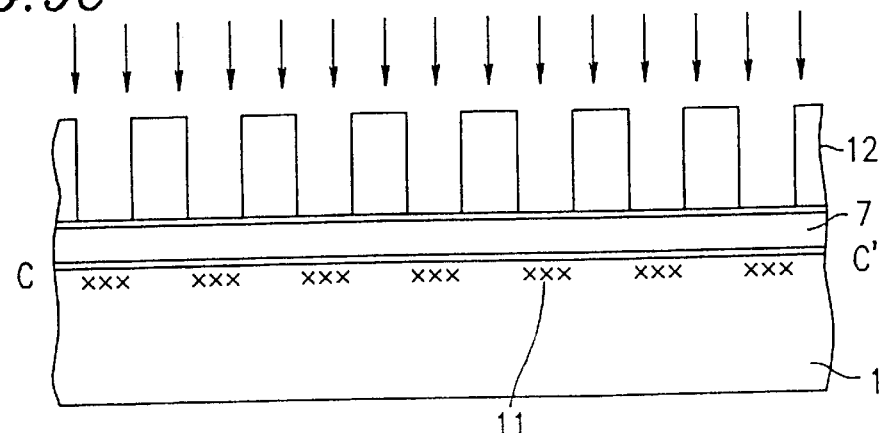
Figure 9D:
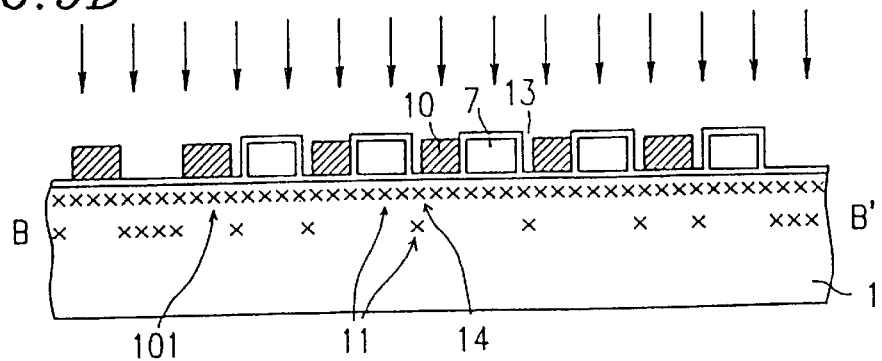

FIGS. 9A to 9D illustrate the steps for producing the cell transistors of the NOR type. In order to raise the threshold voltage $V_{th}$ for all the cell transistors of the NOR type to an intermediate level, implantation of ions 11 having the same conductivity type as the semiconductor substrate 1 is performed to portions (channel portions 101 of the cell transistors 100 of the NOR type) of seniconductor substrate 1 which are under the first gate electrodes 7 and the second gate electrodes 10 as illustrated in FIGS. 9B to 9D. When this is being done, the NAND-type cell transistors 100 are covered with the resist pattern 12 as illustrated in FIGS. 9A and 9C.

If, for example, the cell transistors have the n-channel MOS structure, the above-described ion-implantation onto the channel portions 101 is performed with boron ions (B$^+$) at implantation density on the order of $10^{12}$ cm$^{-2}$. The implantation energy is, for example, 140 keV.

When this is being done, if there is a misalignment between the first gate electrode 7 and the second gate electrode 10, thereby creating a space 13 between the first and the second layers of gate electrodes, a punch-through (isolation wall) voltage of the memory cell of the space 13 becomes a problem.

This problem can be readily solved with a means provided as follows. That is, during the above-described ion implantation for raising the threshold voltage V$_{th}$, the ion implantation 11 into the channel portions through the gate electrodes 7 and 10 with relatively high implantation energy is performed, as well as the punch-through preventing ion implantation 14 is simultaneously performed to the region where there are no gate electrodes with such a low implantation energy that they do not pass through the gate electrodes 7 and 10. If, for example, the cell transistors have the n-channel MOS structure, this punch-through preventing ion implantation is performed with boron ions (B$^+$) at an implantation density on the order of $10^{12}$ to $10^{13}$ cm$^{-2}$. The implantation energy is, for example, 20 to 50 keV.

Moreover, a punch-through voltage between the drawing electrodes 5 from the cell transistors of the NAND type also becomes a problem. However, by employing the above-described method, these steps of ion implantation can be simultaneously performed in a single masking step. Therefore, according to the production steps of the first embodiment, the ion implantation for controlling the threshold voltage V$_{th}$ of the cell transistors of the NOR type and the ion implantation for preventing the punch-through can be performed simultaneously. This reduces the number of masking steps by one, thereby obtaining less expensive processing having simplified steps.

Although the description is given in the first embodiment of the case where the ion implantation is used for the isolation walls of the transistors which are connected to the selection lines, it is also possible to perform isolation using a device isolation oxide film (see FIG. 2).

FIGS. 10A to 10D illustrate the steps for producing the cell transistors of the NAND type. As illustrated in FIGS. 10A to 10D, ion implantation 15 for making all the cell transistors to be depression-type is performed to the channel portions 91 of the cell transistors 90 of the NAND type. ROM data are written by selecting enhancement-type or depression-type transistors. When this is being done, the resist pattern 17 has been formed over the semiconductor substrate 1. Those steps illustrated in FIGS. 10A to 10D and those, steps illustrated in FIGS. 9A to 9D can be performed inter-changeably.

If the cell transistors have the n-channel MOS structure, the ion implantation 15 is performed with phosphorus ions (P$^+$) at the implantation density in the order of $10^{12}$ to $10^{13}$ cm$^{-2}$. The implantation energy is, for example, 300 to 400 keV.

Figure 10A:
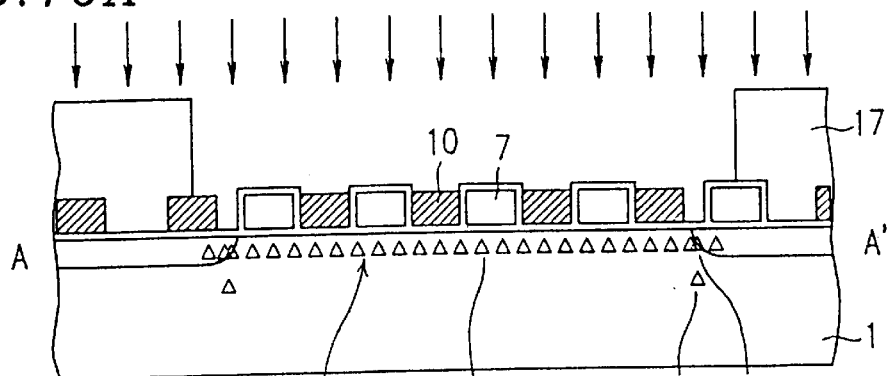
FIGS. 10A, 10B, 10C and 10D are cross-sectional views taken along the lines A–A', B–B', C–C' and B–B' in FIG. 2, respectively, illustrating a method for producing the semiconductor device according to the first embodiment of the present invention.
Figure 10B:
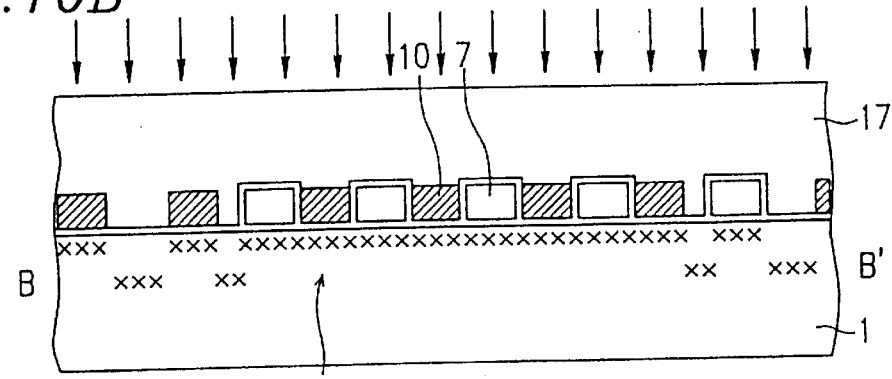
Figure 10C:
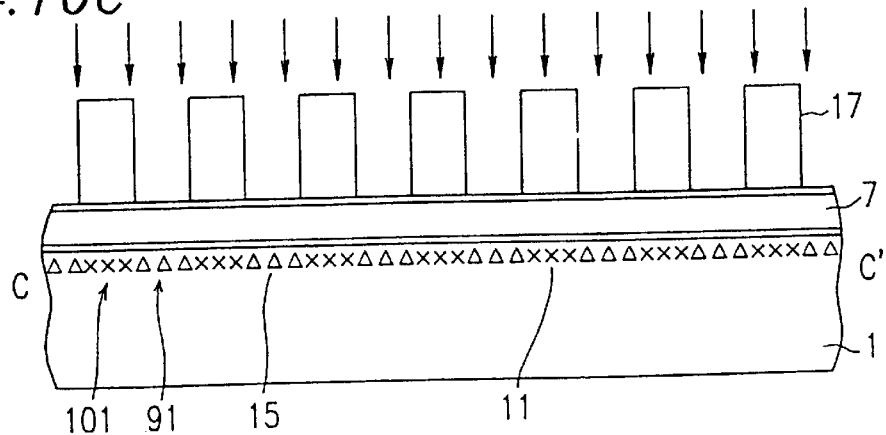
Figure 10D:
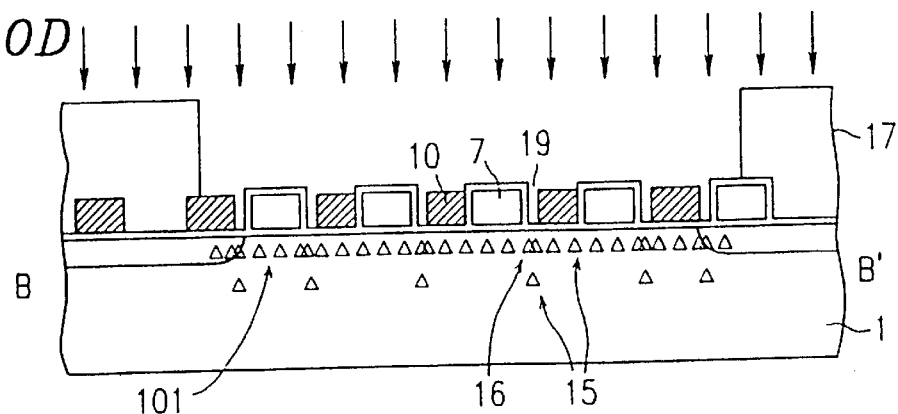

When this is being done, the ion implantation 16 for forming the source/drain of the cell transistors 90 of the NAND type can be performed at the same time as illustrated in FIGS. 10A and 10D. As a result, the diffusion region of the drawing electrode 5 and the source/drain portion 18 of the end region of the memory cells are connected (see FIG. 11A). If the cell transistors of the NAND type have the n-channel MOS structure, the ion implantation for forming the source/drain is performed with arsenic ions (As$^+$) at the implantation density on the order of $10^{15}$ cm$^{-2}$. The implantation energy is, for example, 40 keV.

In the first embodiment, the ion implantation 15 for making depression-type transistors is performed on the channel portions through the gate electrodes 7 and 10 with high implantation energy, as well as the ion implantation 16 for making the source/drain is simultaneously performed on the region where no gate electrodes are present with such low implantation energy that the ions do not pass through the gate electrodes 7 and 10. Therefore, each ion implantation can be performed self-aligningly. This reduces the number of masking steps by one, thereby achieving simplified and less expensive processes.

Figure 11A:
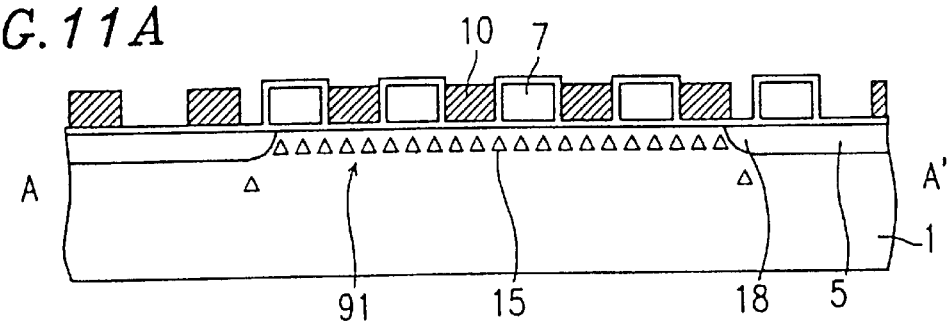
FIGS. 11A and 11B are cross-sectional views taken along the lines A–A' in FIG. 2 illustrating a method for producing the semiconductor device according to the first embodiment of the present invention.

It is also possible to achieve the above-mentioned connection between the diffusion region of the drawing electrode 5 and the source/drain portion 18 of the end region of the memory cells after a heat treatment step. FIG. 11A illustrates the above-mentioned connection after the heat treatment step.

According to the production method of the first embodiment, a sufficient margin can be provided for the misalignment between the gate electrodes 7 and 10 of the first and second layers.

Figure 11B:
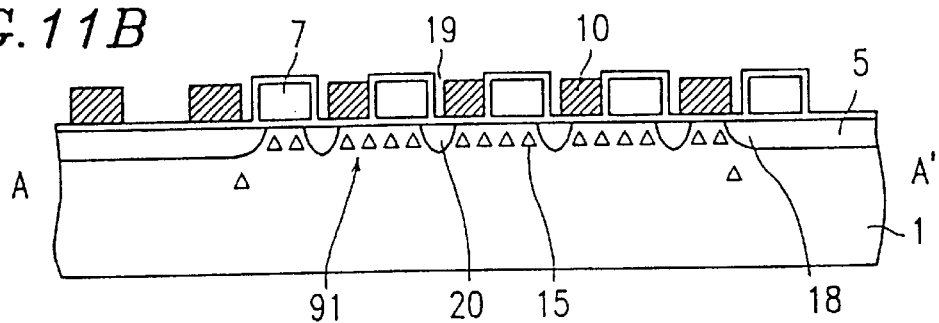

According to the above-mentioned method, the ion implantation 16 for forming the source/drain can be performed on the space 19 where no gate electrodes are present with relatively low implantation energy such that no ions pass through the gate electrode. Therefore, since the cell transistors 90 of the NAND type are connected with the source/drain region 20 implanted in the semiconductor substrate 1 as illustrated in FIG. 11B, non-connection between the cell transistors can be prevented.

When misalignment occurs between the first gate electrode 7 and the second gate electrode 10, a space 19 between the gate electrodes 7 and 10 of the first and second layers is created. However, a connection between the cell transistors can be achieved because of ion implanting with low implantation energy.

Moreover, in order to obtain a cell transistor having smaller gate length, it is also effective to perform the ion implantation step for forming the source/drain after forming an insulating film interposed between the gate electrodes such as side wall insulating films over the second gate electrode 10. The reason is that the diffusion under the gate electrode can be inhibited by the film thickness of the insulating film interposed between the gate electrodes.

Figure 12A:
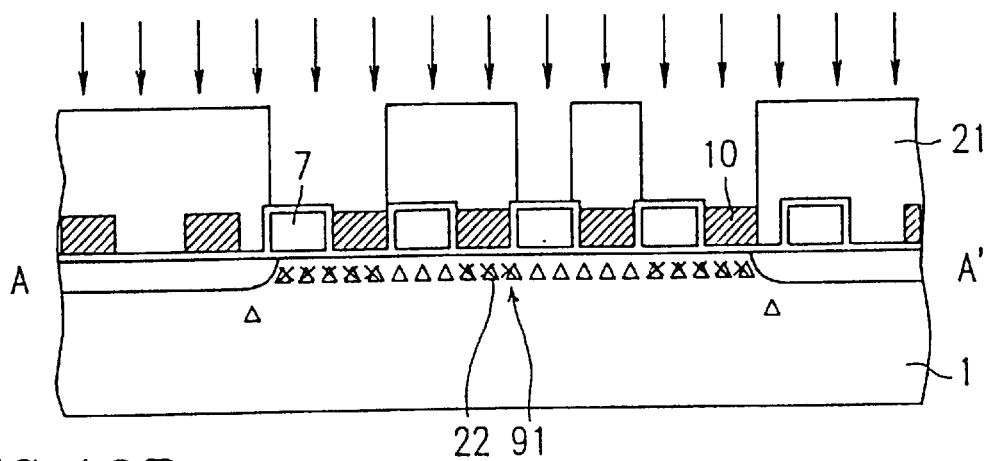
FIGS. 12A, 12B and 12C are cross-sectional views taken along the lines A–A', B–B' and C–C' in FIG. 2, respectively, illustrating a method for producing the semiconductor device according to the first embodiment of the present invention.
Figure 12B:
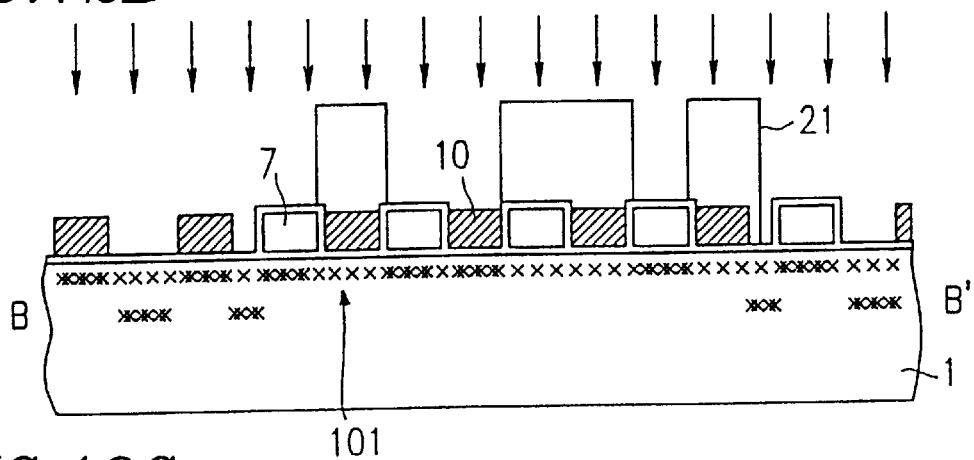

Next, as illustrated in FIGS. 12A and 12B, the ROM data are written simultaneously on the cell transistors 90 of the NAND type and on the cell transistors 100 of the NOR type. Specifically, a resist pattern 21 is formed on the semiconductor substrate 1 as an implantation mask of the write operation for ROM data as illustrated in FIGS. 12A and 12B. Next, part of the cell transistors 90 of the NAND type, which are depression-type transistors, are converted into enhancement-type (indicated by regions marked with Δ and x) by implanting ions 22 (indicated by x) having the same conductivity type as the semiconductor substrate 1.

As to the cell transistors 100 of the NOR type, the threshold voltage V$_{th}$ is selectively set almost the same as that of the power source by implanting ions 22 (indicated by x) having the same conductivity type as the semiconductor substrate 1, thereby selecting the transistors which are always OFF.

Conditions for ion implantation for the write operation for ROM data are as follows. If the cell transistors have the n-channel MOS structure, then the ion implantation is performed with boron ions (B⁺) at the implantation density on the order of $10^{13}$ cm$^{-2}$. The implantation energy is, for example, 140 to 180 keV.

When this is being done, if the cell transistors are of the n-channel MOS structure, the implantation for write operation for ROM data is performed only with boron ions (B⁺). Therefore, the ion implantation can be performed with high implantation energy after stacking interlevel insulators, after opening the contact hole or during the step of forming metal wiring. Such high energy implantation is capable of improving the production efficiency and, therefore, contributes to less expensive production of semiconductor devices.

In the first embodiment, if the threshold value of the cell transistors 100 of the NOR type is allowed to take multiple values, then higher integration can further be achieved. As an example, if the threshold voltage $V_{th}$ of the cell transistors of the NOR type are selectively varied to have four different values, the degree of integration changes from being of the factor of four to six when compared to the conventional single layer polysilicon process, and from two to three when compared to the double layer polysilicon process. Higher integration can further be achieved by having multiple values further.

Figure 12C:
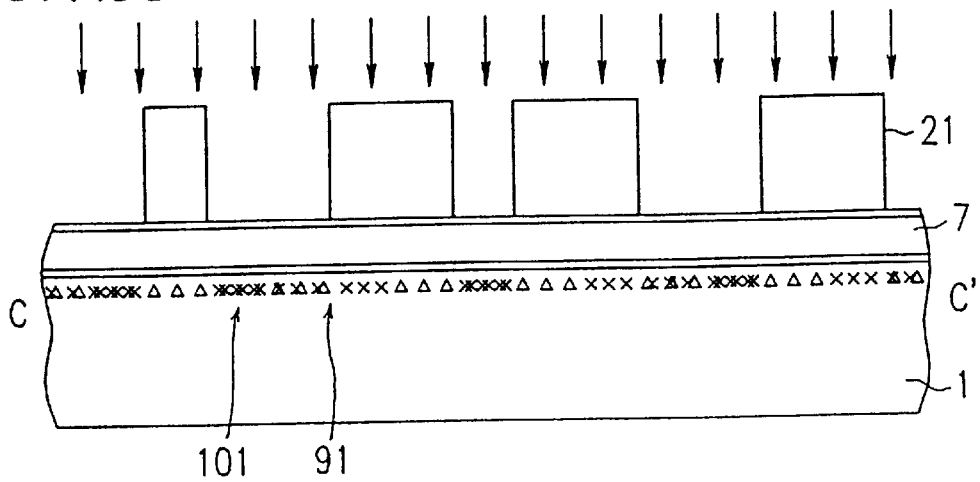

In order to produce the cell transistor 100 of the NOR type, having multiple values for the threshold voltage $V_{th}$, the ion implantation is performed for a plurality of times with differing ion implantation density corresponding to differing values of threshold voltage $V_{th}$ in the ion implantation steps for write operation for ROM data illustrated in FIGS. 12A to 12C.

Moreover, the later in the production steps the write operation for ROM data is, the shorter the steps after the writing of ROM data are. This improves the production efficiency. Therefore, it is more preferable to perform the ion implantation with higher implantation energy after stacking interlevel insulators, after opening the contact hole, or during the step of forming the metal wiring.

Furthermore, when this is being done, the interlevel insulator flattens the surface. Therefore, during the ion implantation for write operation for the ROM data in later steps, even if the first gate electrodes 7 and the second gate electrodes 10 overlap, the insufficient implantation of ions at the overlapped region can be avoided.

After completing a series of the above-mentioned steps, the steps of forming metal wiring and interlevel insulator, forming the contact hole, forming the metal wiring, and forming the protective film are performed, which complete the first half of the production steps for the semiconductor device. Then, assembly steps in the remaining half are performed, and the semiconductor device of the first embodiment is produced.

Embodiment 2

Next, a semiconductor device according to a second embodiment of the present invention will be described. The structure of the semiconductor device of the second embodiment is the same as that of the semiconductor device according to the above-described first embodiment except that the step of writing ROM data differs. Those different steps will be described with reference to FIGS. 13 to 15. The step shown in FIG. 13 corresponds to that shown in FIG. 9C, and the steps shown in FIGS. 14 and 15 correspond to that shown in FIG. 12C.

Figure 13:
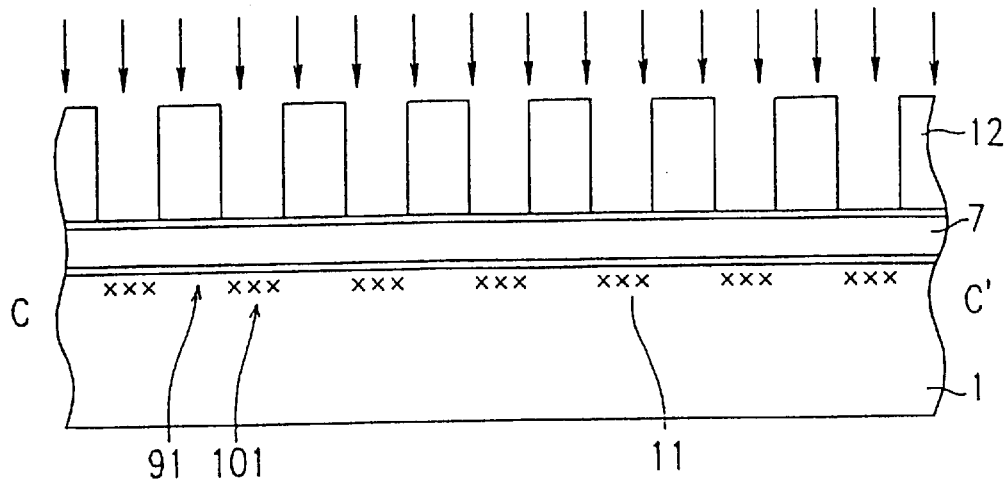
FIG. 13 is a cross-sectional view taken along the line C–C' in FIG. 2 illustrating a method for producing a semiconductor device according to a second embodiment of the present invention.

After forming the second gate electrodes 10 (not shown in the figure) illustrated in the first embodiment, the ion implantation 11 is performed with ions having the same conductivity type as the semiconductor substrate 1 as illustrated in FIG. 13 so that the threshold voltage $V_{th}$ of the cell transistors of the NOR type is raised to an intermediate level. The production steps up to this point are the same as in the first embodiment.

Next, according to the second embodiment, the step illustrated in FIGS. 10A to 10D of making the cell transistors 90 of the NAND type to be depression-type by lowering the threshold voltage $V_{th}$ of the cell transistors differ from those in the first embodiment in that the ion implantation (corresponding to ion implantation 15 as shown in FIGS. 10A, 10C and 10D) for making the transistors to be depression-type is not performed, but only the ion implantation (corresponding to ion implantation 16 as shown in FIGS. 10A and 10D) for forming the source/drain of the cell transistors 90 is performed. When this is being done, the resist pattern 12 has been formed over the semiconductor substrate 1 as shown in FIG. 13 as described above.

Figure 14:
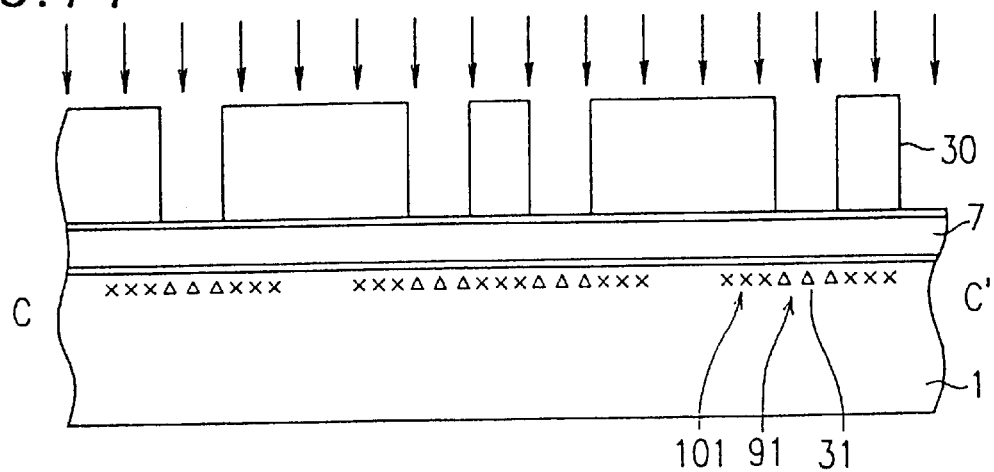
FIG. 14 is a cross-sectional view taken along the line C–C' in FIG. 2 illustrating a method for producing a semiconductor device according to the second embodiment of the present invention.

Next, as shown in FIG. 14, in order to perform the writing of ROM data on the cell transistors 90 of the NAND type, a resist pattern 30 is formed on the semiconductor substrate 1 as an implantation mask for writing ROM data, and parts of the cell transistors 90 of the NAND type, which are enhancement-type, are converted into depression-type by implanting ions 31 (indicated by Δ) having the conductivity type reverse to that of the semiconductor substrate 1. When this is being done, the channel portions 101 of the cell transistors 100 of the NOR type are covered with the resist pattern 30.

Conditions for the ion implantation for writing ROM data on the NAND side are as follows. If the cell transistors 90 are of the n-channel MOS structure, then phosphorus ions (P⁺) are implanted at the implantation density on the order of $10^{12}$ to $10^{13}$ cm$^{-2}$. The implantation energy is, for example, 300 to 400 keV.

Figure 15:
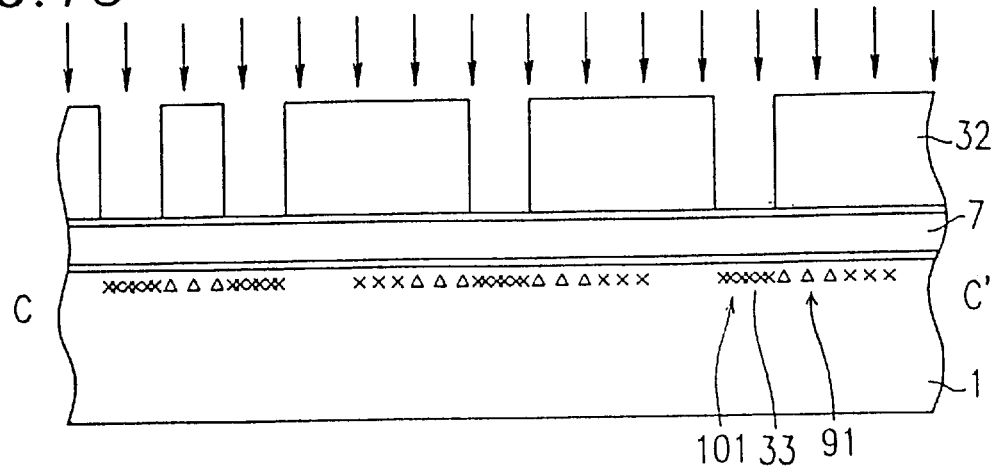
FIG. 15 is a cross-sectional view taken along the line C–C' in FIG. 2 illustrating a method for producing a semiconductor device according to the second embodiment of the present invention.

On the other hand, the write operation for ROM data toward the cell transistors 100 of the NOR type is performed as follows. As illustrated in FIG. 15, a resist pattern 32 is formed on the semiconductor substrate 1 as an implantation mask for writing ROM data. Then, ions 33 (indicated by x) having the same conductivity type as the semiconductor substrate 1 are implanted into the cell transistors 100 of the NOR type, and the threshold voltage $V_{th}$ is selectively made above the power supply voltage to provide transistors which are always OFF (the region indicated by the double x). When this is being done, the channel portions 91 of the cell transistors 90 of the NAND type are covered with the resist pattern 32.

Conditions for the ion implantation for writing ROM data of the NOR type are as follows. If the cell transistors 100 are of the n-channel MOS structure, then boron ions (B⁺) are implanted at the implantation density on the order of $10^{13}$ cm$^{-2}$. The implantation energy is, for example, 140 to 180 keV.

Higher integration can also be achieved with the semiconductor device of the second embodiment as with the semiconductor device of the previously described first embodiment. As a matter of fact, the second embodiment is more advantageous than the first embodiment as to the following points. In producing the enhancement-type cell transistors of the NAND type of the first embodiment, the type of the transistors changes from enhancement-type to depression-type and then again to enhancement-type. That is, the enhancement-type cell transistors are first converted into the depression-type cell transistors, and then back to the enhancement-type cell transistors. On the other hand, in the second embodiment, the enhancement-type cell transistors stay as they are. This simplifies the production steps and keeps the deviations of characteristics low, which are attributable to deviations of production conditions. Therefore, cell transistors having stable characteristics can be obtained.

Embodiment 3

Figure 16:
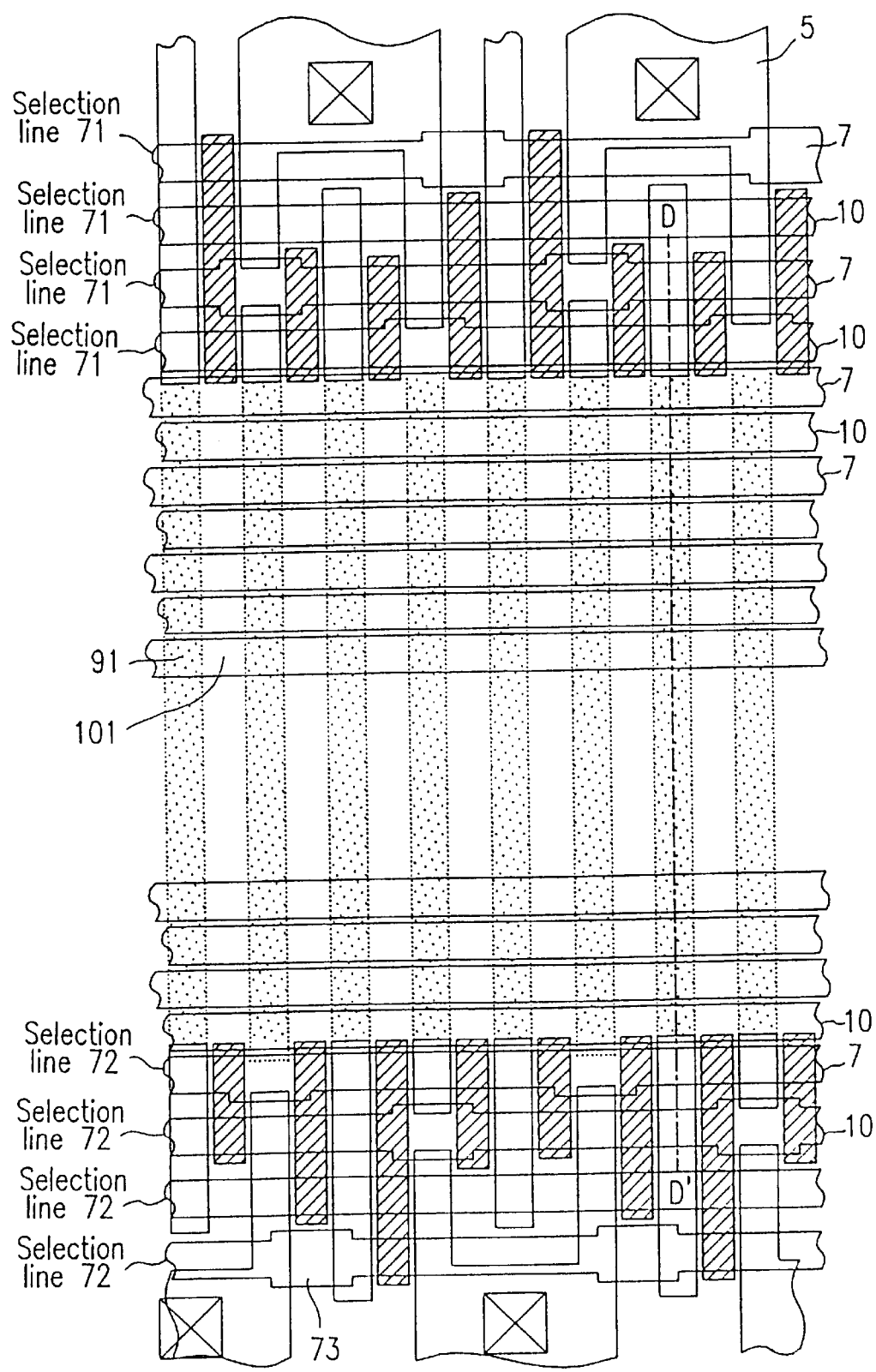
FIG. 16 is a plan view of a semiconductor device according to a third embodiment of the present invention.
Figure 17:
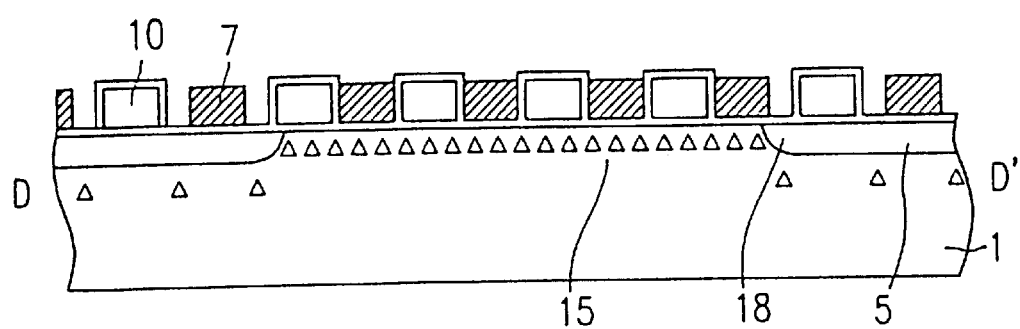
FIG. 17 is a cross-sectional view taken along the line D–D' in FIG. 16 illustrating a method for producing a semiconductor device according to the second embodiment of the present invention.

FIG. 16 illustrates a semiconductor device according to a third embodiment of the present invention, and FIG. 17 illustrates the production step therefor. The production step illustrated in FIG. 17 corresponds to that illustrated in FIG. 11A in the first embodiment. In FIG. 17, portions corresponding to those illustrated in FIG. 11A are designated by the same reference numerals, and the descriptions thereof are omitted.

As apparent from the comparison of FIGS. 17 and 11A, since the memory cell selection lines are configured of the first layer gate electrodes 7 and the second layer gate electrodes 10 alternately disposed, the space between the memory cell selection lines 71 and/or 72 of the third embodiment can be made less than the minimum processing line width of process of the first embodiment. That is, each pitch of the memory cell selection lines 71 and/or 72 of the third embodiment can be made smaller than that in the first embodiment, thereby further achieving higher integration.

Embodiment 4

Figure 18:
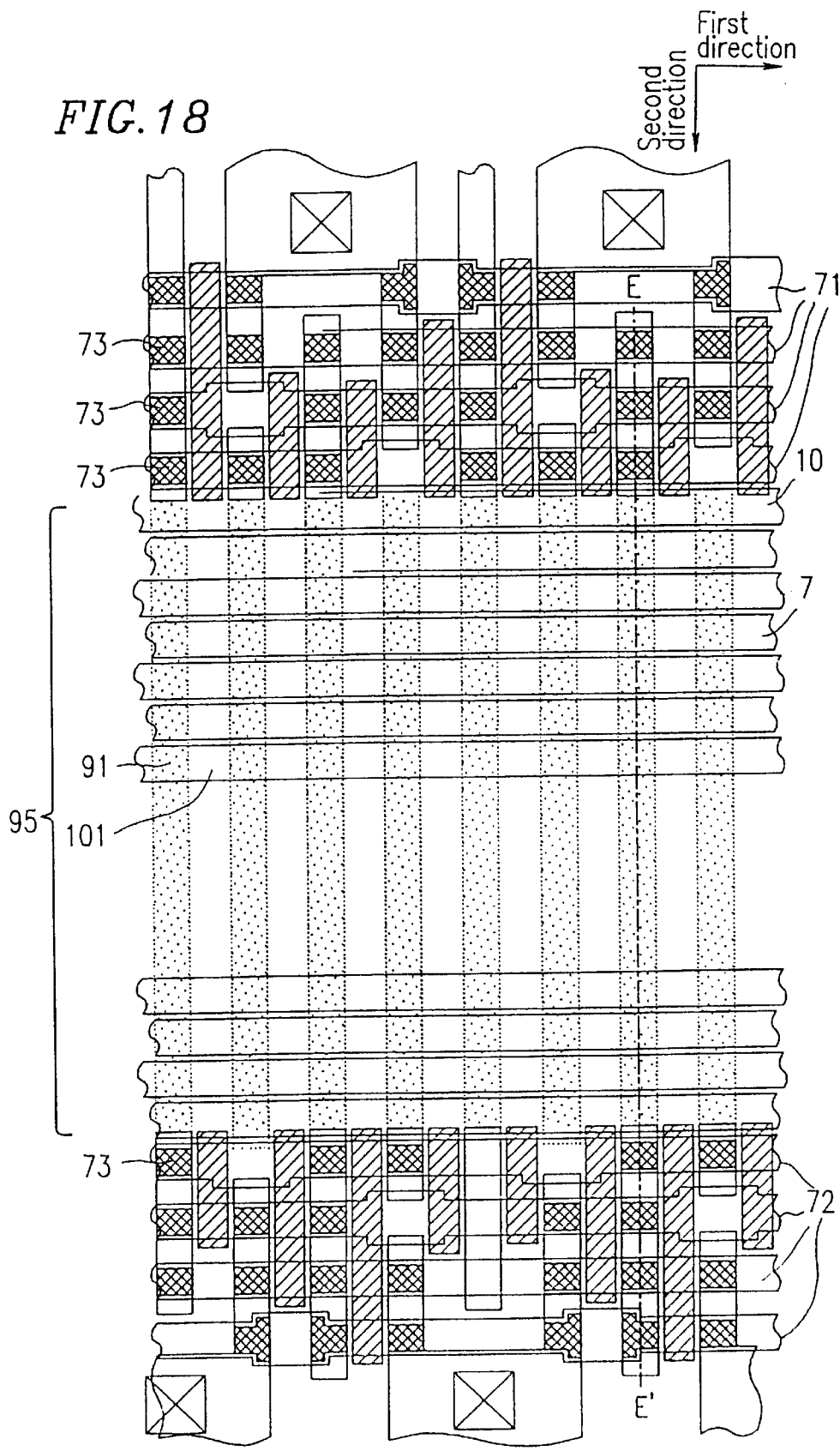
FIG. 18 is a plan view of a semiconductor device according to a fourth embodiment of the present invention.
Figure 19:
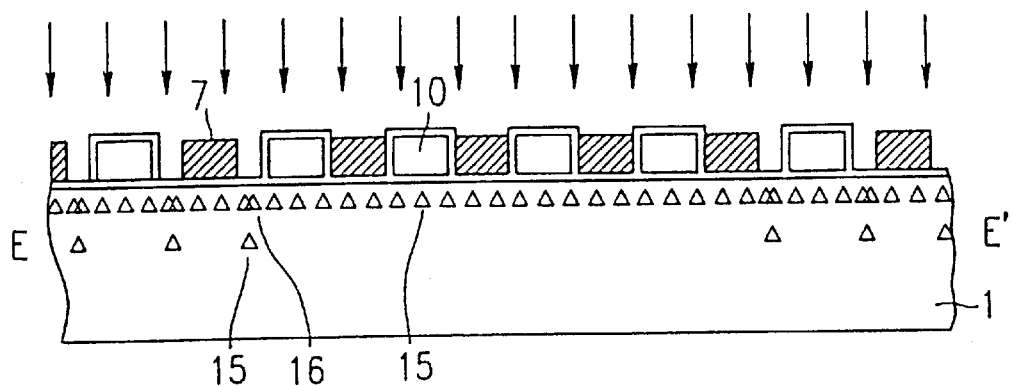
FIG. 19 is a cross-sectional view taken along the line E–E' in FIG. 18 illustrating a method for producing the semiconductor device according to the fourth embodiment of the present invention.
Figure 20:
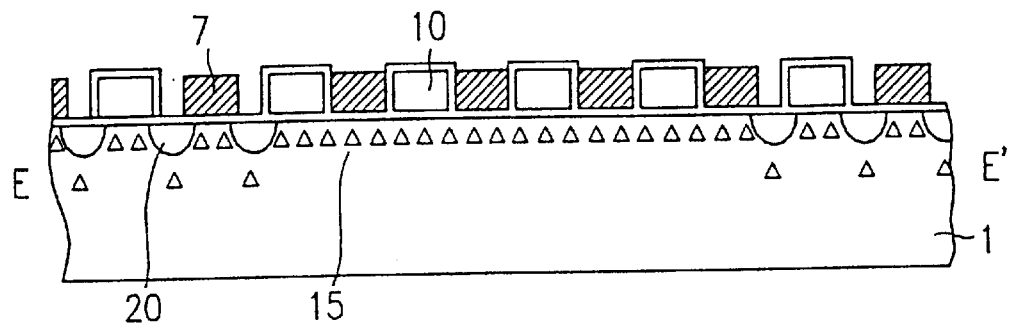
FIG. 20 is a cross-sectional view taken along the line E–E' in FIG. 18 illustrating a method for producing the semiconductor device according to the fourth embodiment of the present invention.

FIGS. 18 to 20 illustrate a semiconductor device according to a fourth embodiment of the present invention. This semiconductor device is such that the selection transistors 73 which select memory cells are depression-type transistors. That is, as illustrated in FIG. 18, portions of the semiconductor substrate 1 outside the memory cell region 95, which are below a plurality of selection lines 71 and 72 provided along the first direction, are connected to a plurality of depression-type transistors 73 (indicated by mesh) for each selection line. These selection transistors 73 are produced simultaneously in the step of forming the cell transistors of the NAND type.

The production steps will be described with reference to FIGS. 19 and 20 as follows. FIGS. 19 and 20 illustrate the cross-section taken along line E–E' in FIG. 18 in the order of the production step. The steps shown in FIGS. 19 and 20 correspond to the steps shown in FIGS. 10A and 11A.

First, as illustrated in FIG. 6 in the first embodiment, an oxide film 2 is formed on the semiconductor substrate 1. Next, a resist pattern 3 is formed as an ion implantation mask for an impurity having the conductivity type reverse to that of the semiconductor substrate 1. Then, using this resist pattern 3, ion implantation 4 for forming the source/drain is performed, thereby forming the source/drain region 5 in the semiconductor substrate 1 as shown in FIG. 7. This source/drain region 5 is used as the drawing electrode 5 from the cell transistors of the NAND type shown in FIG. 2. Then, the steps illustrated in FIGS. 7 to 9 are performed.

Next, the ion implantation 15 for making the cell transistors to be depression-type and the ion implantation 16 for forming the source/drain of the cell transistor of the NAND type are performed at the same time. Here, the resist pattern in the fourth embodiment, which is used as the ion implantation mask during the ion implantation 16, differs from that in the first embodiment in that the pattern has been changed such that the depression-type selection transistors can be formed at the same time (see FIG. 18). For this reason, as illustrated in FIGS. 19 and 20, by performing the ion implantation step similar to that described above, the depression-type selection line transistors 73 can be formed without increasing the number of production steps.

The following steps such as those for writing ROM data are performed in a similar manner as in the first embodiment.

According to the fourth embodiment, by simply changing the resist pattern, the step for forming the selection line transistors 73 can be performed simultaneously with the step for converting the cell transistors of the NAND type into the depression-type transistors. This eliminates one masking step from the production steps in the first embodiment, and therefore, less expensive processing with simplified steps can be obtained.

Embodiment 5

Figure 21:
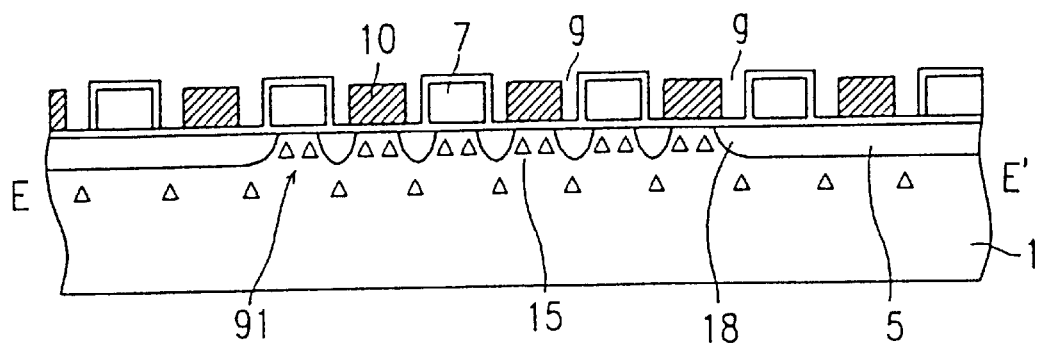
FIG. 21 is a cross-sectional view taken along the line E–E' in FIG. 18 illustrating a method for producing a semiconductor device according to a fifth embodiment of the present invention.

FIG. 21 illustrates a semiconductor device according to a fifth embodiment of the present invention. In the fifth embodiment, the first layer gate electrodes 7 and the second layer gate electrodes 10 of the cell transistors 90 of the NAND type are disposed on the semiconductor substrate 1 in such a manner that they are all separated. The ion implantation for forming the source/drain of the cell transistors 90 of the NAND type is performed on all the cell transistors 90. The step shown in FIG. 21 corresponds to the step shown in FIG. 17. FIG. 21 is a cross-sectional view of a certain transistor taken along line E–E'. The certain transistor is a transistor such as the one shown in FIG. 18, and a distance between the first and the second layer gate electrodes 7 and 10 is larger than a distance between the first and the second gate electrodes 7 and 10 shown in FIG. 18.

According to the fifth embodiment, there is a gap g formed between the first and second layer gate electrodes 7 and 10, through which the ion implantation 15 for forming the source/drain of the cell transistors 90 of the NAND type on the semiconductor substrate 1 can surely be performed. For this reason, according to the fifth embodiment, a semiconductor device from which stable read-out current can be obtained can be realized.

Embodiment 6

Figure 22:
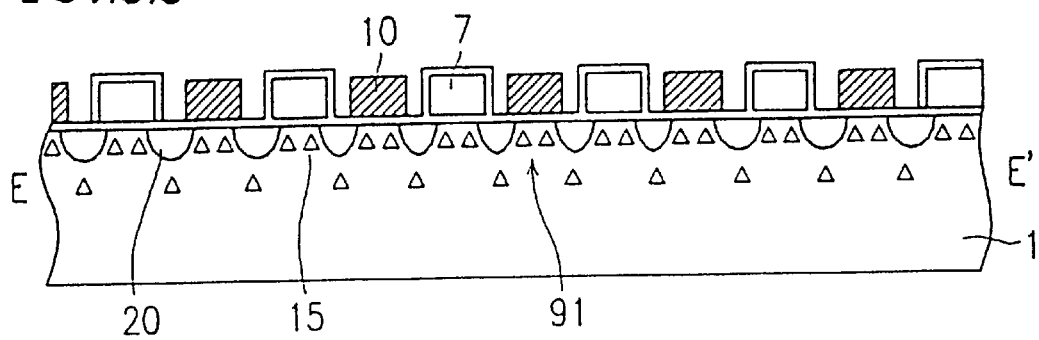
FIG. 22 is a cross-sectional view taken along the line E–E' in FIG. 18 illustrating a method for producing a semiconductor device according to a sixth embodiment of the present invention.

FIG. 22 illustrates a semiconductor device according to a sixth embodiment of the present invention. The step shown in FIG. 22 corresponds to that shown in FIG. 20. The corresponding portions are designated by the same reference numerals and the descriptions thereof as are omitted. FIG. 22 is a cross-sectional view of a certain transistor taken along line E–E'. The certain transistor is a transistor such as the one shown in FIG. 18, and a distance between the first and the second layer gate electrodes 7 and 10 is larger than the distance between the first and the second gate electrodes 7 and 10 shown in FIG. 18. In the sixth embodiment, the configuration in the fifth embodiment is incorporated in that of the fourth embodiment. As in the fifth embodiment, the gate electrode of the first layer and the gate electrode of the second layer are disposed with a predetermined distance. That is, within the configuration of the fourth embodiment where the depression-type selection line transistors 73 are formed simultaneously in the step of forming the cell transistors 90 of the NAND type. In the sixth embodiment, ion implantations for forming parts of the selection line transistors 73 and the cell transistors 90 are performed simultaneously as in the fourth embodiment. The ion implantation for forming the source/drain of the cell transistors 90 of the NAND type on the semiconductor substrate 1 is performed through a gap. The gap has a predetermined separation.

According to the sixth embodiment, a semiconductor device having both the effect described in the fourth embodiment and the effect described in the fifth embodiment can be realized.

Embodiment 7

Figure 23A:
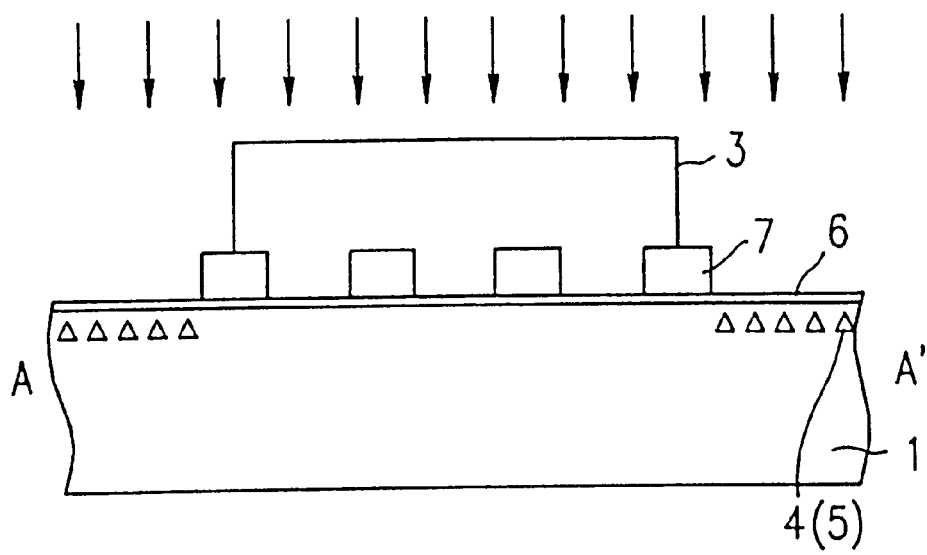
FIGS. 23A and 23B are cross-sectional view taken along the lines A–A' and B–B' in FIG. 2, respectively, illustrating a method for producing a semiconductor device according to a seventh embodiment of the present invention.
Figure 23B:
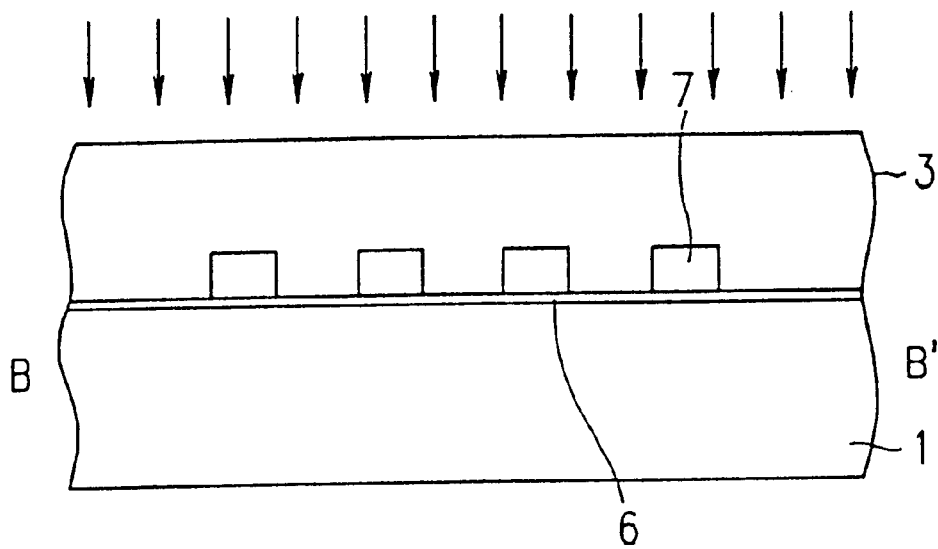

FIGS. 23A and 23B illustrate a semiconductor device according to a seventh embodiment of the present invention. The seventh embodiment differs from the first embodiment in that the drawing electrode 5 is formed after the first gate electrodes 7 are formed. Hereinafter, the production steps will be described.

First, as illustrated in FIGS. 23A and 23B, a first gate oxide film 6 of 5 to 30 nm film thickness is formed on the semiconductor substrate 1, and then a plurality of gate electrodes 7 are formed on this gate oxide film 6 such that they are parallel to each other and extend in the first direction as described in the first embodiment. As in the previous embodiments, an N⁺ polysilicon film of 200 to 300 nm thickness, or a double layer structure film made of a lower N⁺ polysilicon film of 100 nm thickness and an upper tungsten silicide film of 100 nm thickness is used as the gate electrode 7.

Next, a resist pattern 3 is formed on the semiconductor substrate 1 and the first gate electrodes 7 as an ion implantation mask for impurity ions having the conductivity type reverse to that of the semiconductor substrate 1. Then, ions 4 for forming the source/drain are implanted from the above of the resist pattern 3 to form the source/drain region 5 on the semiconductor substrate 1, which are to be used as the drawing electrode 5 from the cell transistors of the NAND type.

Next, the second gate electrodes 9 are formed by the step such as the one shown in FIG. 8 in the first embodiment. Then, after performing the necessary steps similar to those in the first embodiment, the semiconductor device according to the seventh embodiment is produced.

Embodiment 8

Figure 24:
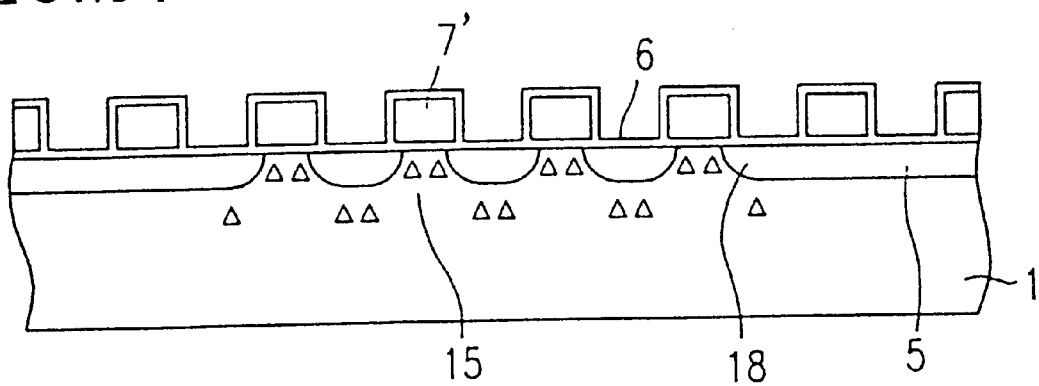
FIG. 24 is a cross-sectional view illustrating a method for producing a semiconductor device according to an eighth embodiment.

FIG. 24 illustrates a semiconductor device according to an eighth embodiment of the present invention. The step shown in FIG. 24 corresponds to the step shown in FIG. 11A of the first embodiment. The corresponding parts are designated by the same reference numerals and the detailed description thereof are omitted. The gate electrodes in the eighth embodiment have a single layer structure. That is, as illustrated in FIG. 24, a plurality of gate electrodes 7' similar to the first gate electrodes 7 of the first to the seventh embodiments are formed above the semiconductor substrate 1. A gate oxide film 6 is inserted between the plurality of gate electrodes 7' and the semiconductor substrate 1.

According to the semiconductor device in the eighth embodiment, since the gate electrodes are of the single layer structure, it is inferior to those in the first to seventh embodiments in terms of high integration. However, since the number of steps is reduced, the production becomes simple and the production efficiency is improved.

Described hereinafter are semiconductor devices according to other embodiments of the present invention, where the degree of integration is raised higher than in the previous embodiments. In the embodiments to be described below, the semiconductor substrate 41 has a plurality of grooves 42 which are formed along the second direction, i.e., the direction perpendicular to the first direction along which the first and second gate electrodes 7 and 10 are provided. The gate electrodes of the cell transistors are formed over the bottom and the side surfaces of these grooves 42, and the channel regions of the cell transistors are formed beneath the bottom and the side surfaces of these grooves 42, so that higher integration is further realized. Embodiments of this type will be described hereinafter.

Embodiment 9

FIGS. 25, 26, 27A, 27B, 28, 29A, 29B, 30A, 30B, 31, 32A, 32B, 33A, 33B, 34, 35A, 35B, 36A, 36B, 37, 38A, 38B, 39A–39C and 40A–40C illustrate a semiconductor device according to a ninth embodiment of the present invention. A plurality of grooves 42 extending in the second direction are formed on the semiconductor substrate 41. A plurality of first gate electrodes (first word lines) 44 extending in the first direction perpendicular to the direction of the grooves 42 are formed in parallel above the semiconductor substrate 41 including the grooves 42 with the first gate insulating film 43 inserted therebetween. Moreover, a plurality of second gate electrodes 46 (second word lines) are formed between the first gate electrodes 44 formed over the semiconductor substrate 41 including the grooves 42 with the second gate insulating film 45 inserted therebetween, the second gate electrodes 46 being parallel with the first gate electrodes 44.

Formed under the first gate electrodes 44 are the channel portions 91 of the first cell transistors 90 of the NAND type. Specifically, the channel portions 91 are formed both beneath the upper surface of the semiconductor substrate 41 between the grooves 42 and beneath the bottom surface of the groove 42. Formed in the side wall of the grooves 42 are the channel portions 101 of third cell transistors 100 of the NOR type. On the other hand, formed under the second gate electrodes 46 are the channel portions 91 of the second cell transistors 90 of the NAND type. Specifically, the channel portions 91 are formed both beneath the upper surface of the semiconductor substrate 41 between the grooves 42 and beneath the bottom surface of the groove 42. Formed in the side wall of the grooves 42 are the channel portions of fourth transistors of the NOR type.

As described above, also in the ninth embodiment, the semiconductor device has a structure where cell transistors 90 of the NAND type and the cell transistors 100 of the NOR type are simultaneously present in the memory cell region. The formation of the grooves 42 results in an increase in the area for forming the channel portions of the cell transistors when viewed from above. As a result, higher degree of integration than in each of the previous embodiments can further be realized.

Figure 26:
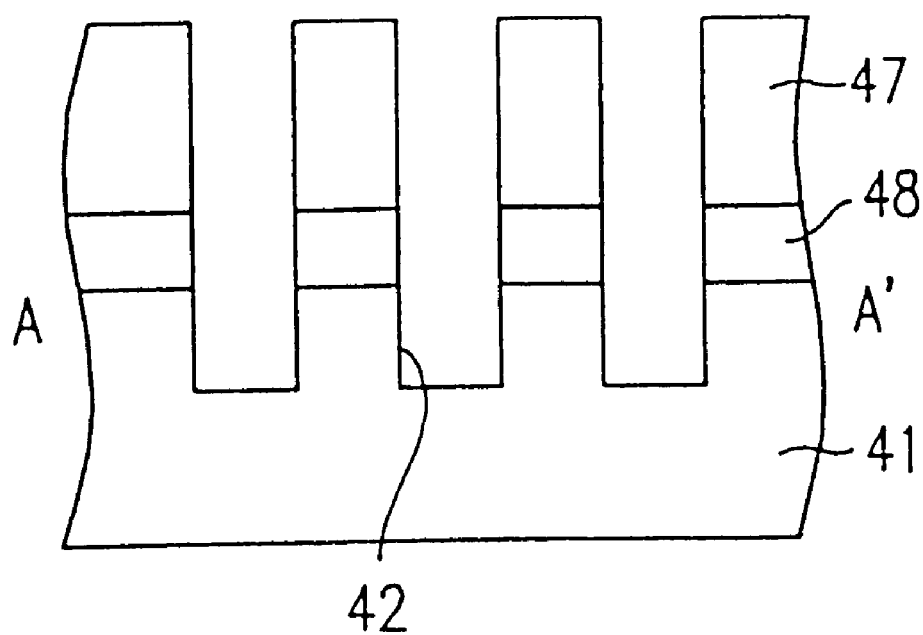
FIG. 26 is a cross-sectional view taken along the line A–A' in FIG. 25 illustrating a method for producing the semiconductor device according to the ninth embodiment of the present invention.

Hereinafter, steps for producing the semiconductor device of the ninth embodiment will be described with reference to FIGS. 26, 27A, 27B, 28, 29A, 29B, 30A, 30B, 31, 32A, 32B, 33A, 33B, 34, 35A, 35B, 36A, 36B, 37, 38A, 38B, 39A–39C and 40A–40C. First, a plurality of grooves 42 are formed on the semiconductor substrate 41 in parallel along the second direction by a known method of etching. When this is being done, it is preferable to form the grooves 42 such that each groove has the depth corresponding to the channel length of the channel portions 101 of the aforementioned third and fourth cell transistors 100 of the NOR type to be formed in the side wall of the groove 42 in the later steps. For example, the depth is preferably about 0.3 to 1.0 $\mu$m. When forming the grooves 42, a resist pattern 47 or an oxide film 48 illustrated in FIG. 26 is used as an etching mask.

Next, as illustrated in FIG. 27A, an oxide film 49 is formed on the inner wall of the groove 42. Then as illustrated in FIG. 27B, the region other than the memory cell region is masked with a resist pattern 50, and ions are implanted into the semiconductor substrate 41 so as to control the threshold voltage $V_{th}$ of the channel portions of the third and fourth cell transistors to be formed in the side wall of the groove 42. Specifically, ions 51 such as boron having the same conductivity type as the semiconductor substrate 41 are implanted at the implantation density on the order of about $10^{12}$ cm$^{-2}$. The implantation energy is, for example, 20 to 50 keV. The ion implantation is performed in two oblique directions, each of which is defined as a direction which (i) constitutes an angle within the range of about 15° to 60° with respect to the normal axis of the semiconductor substrate 41; and (ii) extends on a plane which is perpendicular to both the side wall and the bottom surface of the groove 42.

Specifically, the implantation angle is chosen while taking the width and depth of the groove 42 into consideration such that the ions are implanted only to the side wall of the groove 42. During ion implantation, since the portions of the upper surface of the semiconductor substrate 41 between the grooves 42 are covered with the oxide film 48, the ions are not implanted there. Moreover, since the bottom surface of the groove 42 is blocked by the adjacent protrusion (the portion of the upper surface of the semiconductor substrate 41 between the grooves 42), the ions are not implanted there either.

As illustrated in FIG. 35 (described later), by further rotating the semiconductor substrate 41 around its normal axis while performing the above-mentioned oblique ion implantation in a direction at an angle in the range of about 15° to 60° with respect to the normal axis of the semiconductor substrate 41, it becomes possible to implant ions into the bottom surface (as well as the side wall) of the groove 42.

Figure 28:
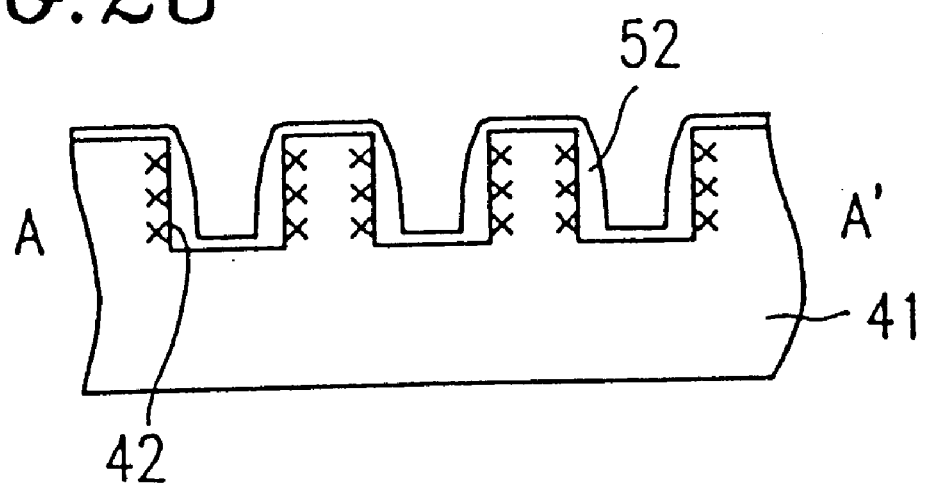
FIG. 28 is a cross-sectional view taken along the line A–A' in FIG. 25 illustrating a method for producing the semiconductor device according to the ninth embodiment of the present invention.
Figure 29B:
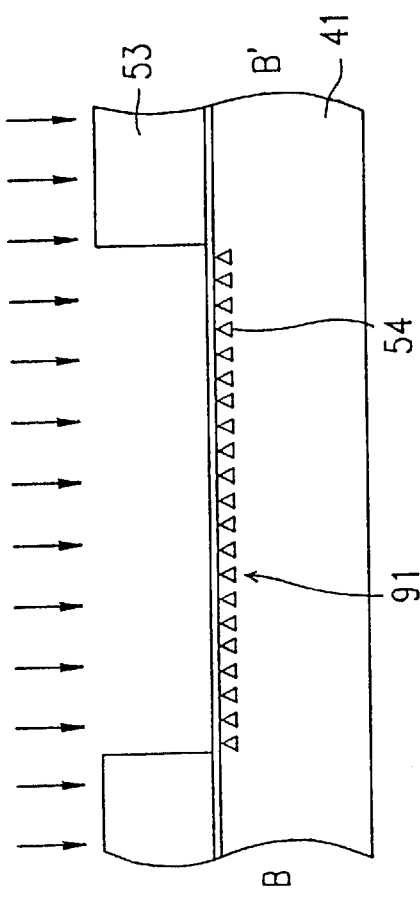
FIGS. 29A and 29B are cross-sectional views taken along the line A–A' and B–B' in FIG. 25, respectively, illustrating a method for producing the semiconductor device according to the ninth embodiment of the present invention.
Figure 29A:
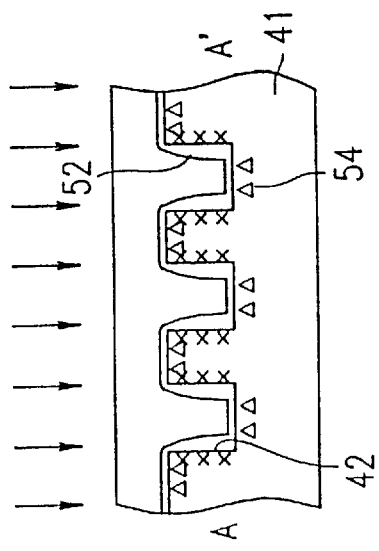

Next, as illustrated in FIG. 28, the oxide film 48 is removed and a side wall insulating film 52 is formed on the side wall of the groove 42. Then, as illustrated in FIGS. 29A and 29B, regions other than the memory cell regions are masked with the resist pattern 53 (see FIG. 29B) and ions 54 having the conductivity type reverse to that of the semiconductor substrate 41, for example phosphorus ions, are implanted so as to control the threshold voltage $V_{th}$ of the channel portions 91 of the aforementioned first and second cell transistors 90 to be formed both beneath the portions of the upper surface of the semiconductor substrate 41 between the grooves 42 and beneath the bottom surface of the groove 42. Specifically, the ions are implanted at the implantation density in the order of $10^{13}$ cm$^{-2}$. The implantation energy is, for example, 20 to 50 keV. The implantation angle is about 0° with respect to a normal to the semiconductor substrate 41. During the ion implantation, since the side walls of the grooves 42 do not face the ion implantation, the phosphorus ions are not implanted there.

As described above, if the threshold voltage $V_{th}$ of all the channel portions 91 of the cell transistors of the NAND type is set at low value, then the ion implantation with boron ions can be performed during the later step of writing ROM data. It is also possible and relatively easy to implant the ions into deeper locations, thereby improving the production efficiency.

Figure 30B:
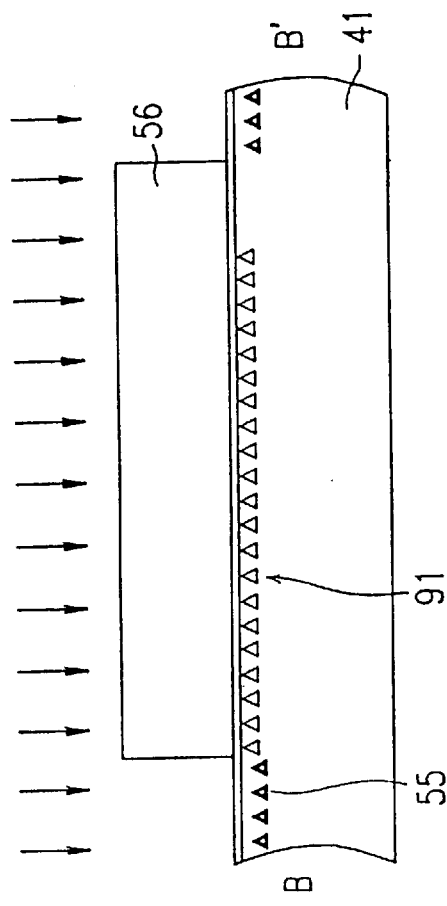
FIGS. 30A and 30B are cross-sectional views taken along the lines A–A' and B–B' in FIG. 25, respectively, illustrating a method for producing the semiconductor device according to the ninth embodiment of the present invention.
Figure 30A:
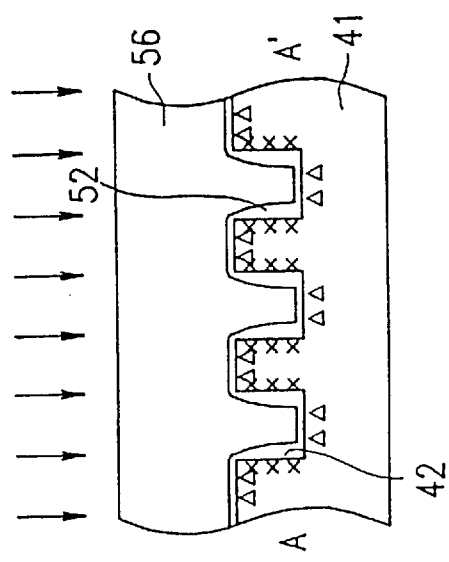

Next, drawing electrodes 59 (see FIG. 25) from the memory cell region are formed. Specifically, as illustrated in FIGS. 30A and 30B, high concentration ions 55 having the conductivity type reverse to that of the semiconductor substrate 41 are implanted to form the drawing electrodes 59. The implantation of ions 55 is performed at the implantation density on the order of $10^{15}$ cm$^{-2}$. When this is being done, regions for the channel portions are masked with the resist pattern 56 as illustrated in FIG. 30B.

Figure 31:
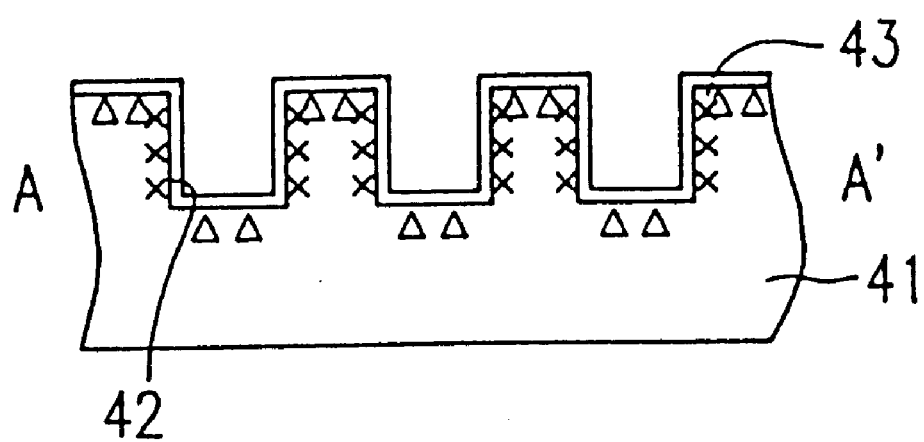
FIG. 31 is a cross-sectional view taken along the line A–A' in FIG. 25 illustrating a method for producing the semiconductor device according to the ninth embodiment of the present invention.

Next, as illustrated in FIG. 31, the side wall insulating film 52 is removed, and a first gate oxide film 43 of 5 to 30 nm film thickness is formed. Then, as illustrated in FIGS. 32A and 32B, a plurality of first gate electrodes 44 are formed in parallel over the semiconductor substrate 41 in the first direction with the first gate oxide film 43 being inserted therebetween. As illustrated in FIG. 32A, the first gate electrodes 44 are within the grooves 42.

Next, as illustrated in FIGS. 33A and 33B, a second gate oxide film 45 of 5 to 30 nm film thickness is formed, and a plurality of second gate electrodes 46 are formed over the semiconductor substrate 41 in parallel in the first direction between the first gate electrodes 44 with the gate oxide film 45 being inserted therebetween. Here, an N$^+$ polysilicon film of 200 to 300 nm thickness or a double layer structure made of a lower N$^+$ polysilicon film of 100 nm thickness and an upper tungsten silicide film of 100 nm thickness is used as the first and second gate electrodes 44 and 46. In this respect, the semiconductor device of the present invention is the same as those in the previous embodiments.

Figure 34:
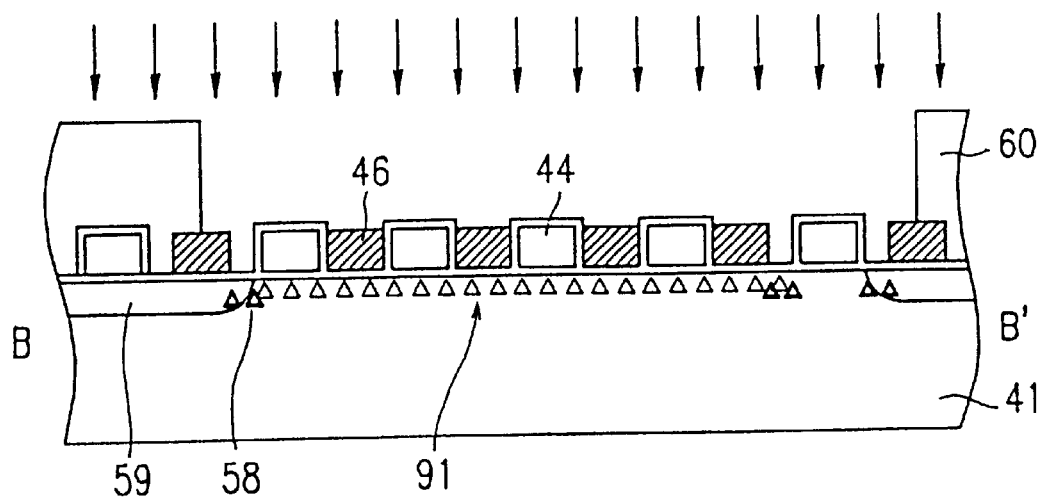
FIG. 34 is a cross-sectional view taken along the line B–B' in FIG. 25 illustrating a method for producing the semiconductor device according to the ninth embodiment of the present invention.

Next, as illustrated in FIG. 34, ions 58 are implanted with an angle of about 0° with respect to a normal to the semiconductor substrate 41 so as to connect the channel ends of the cell transistor of the NAND type and the above-mentioned drawing electrodes 59. Specifically, high concentration ions 58 having conductivity type reverse to that of the semiconductor substrate 41 are implanted at an implantation density on the order of $10^{15}$ cm$^{-2}$ (in FIG. 34, the high concentration ions 58 are represented by Δ). When this is being done, regions other than the channel portions are covered with the resist pattern 60. The ions 58 are not implanted into the channel portions of the cell transistors of the NOR type to be formed in the side wall of the grooves 42 because the side walls do not face the ion implantation. The ions are not implanted there.

Figure 35B:
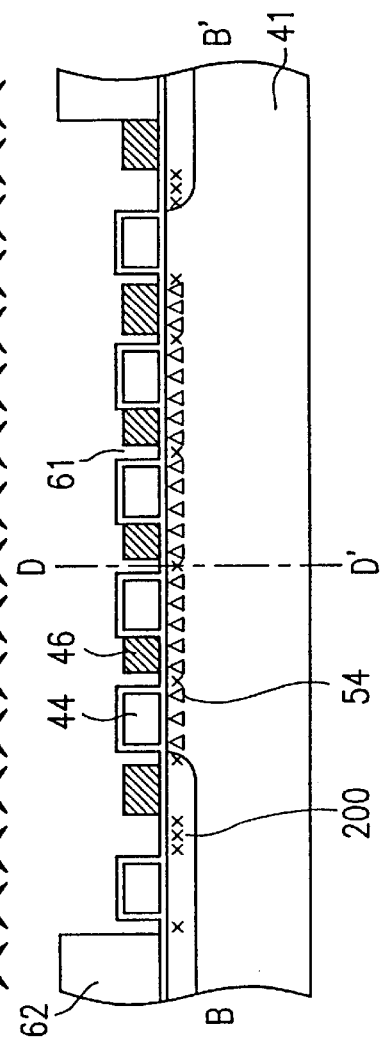
FIG. 35B is a cross-sectional view taken along the line B–B' in FIG. 25.

During the ion implantation, it is assumed that there is a misalignment between the first gate electrodes 44 and the second gate electrodes 46, thereby creating a space 61 between the gate electrodes 44 and 46 as illustrated in FIGS. 35B and 36B. In this case, the device isolation of the channel portions 101 of the cell transistors 100 of the NOR type to be formed in the side walls of the grooves 42 and the connection between the channels of the channel portions 91 of the cell transistors 90 of the NAND type pose problems.

Figure 35A:
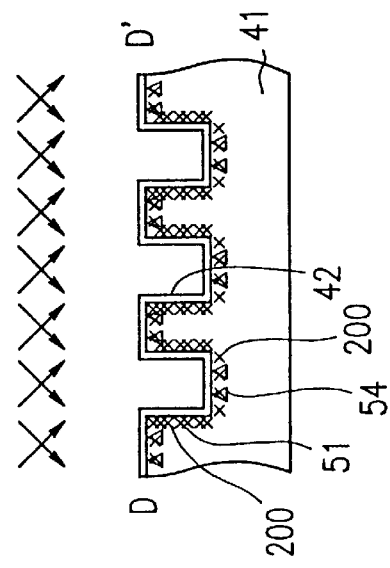
FIG. 35A is a cross-sectional view taken along the line D–D' in FIG. 35B, both figures illustrating a method for producing the semiconductor device according to the ninth embodiment of the present invention.

In the ninth embodiment, in order to improve the device isolation characteristics of the channel portions 101 of the cell transistors 100 of the NOR type, regions other than the memory cell region are masked with the resist pattern 62 as illustrated in FIGS. 35A and 35B. For example, boron ions 200 having the same conductivity type as the semiconductor substrate 41 are implanted under conditions similar to those in the step shown in FIG. 28. In other words, the boron ions 200 are additionally implanted where the boron ions 51 have already been implanted. For this reason, isolation is surely achieved. Moreover, since the resist pattern 62 opens to the grooves 42 between the selection lines on the selection line side. The ions for isolation are also implanted to the side wall portion 63 of the grooves 42 (see FIG. 35). Therefore, the isolation between the upper surface and the bottom surface of the groove 42 are performed at the same time.

On the other hand, since the ions which form the source/drain are also implanted into the space 61 during the above-described ion implantation of the ions 58 (represented by Δ), the connection between the channels of the channel portions 91 of the cell transistors 90 of the NAND type is surely achieved. Moreover, since the ion implantation density for the ions 58 is $10^{15}$ cm$^{-2}$ as described above, this ion implantation cancels the previous ion implantation for the isolation between the upper surface of the semiconductor substrate 41 and the bottom surface of the groove 42.

Figure 37:
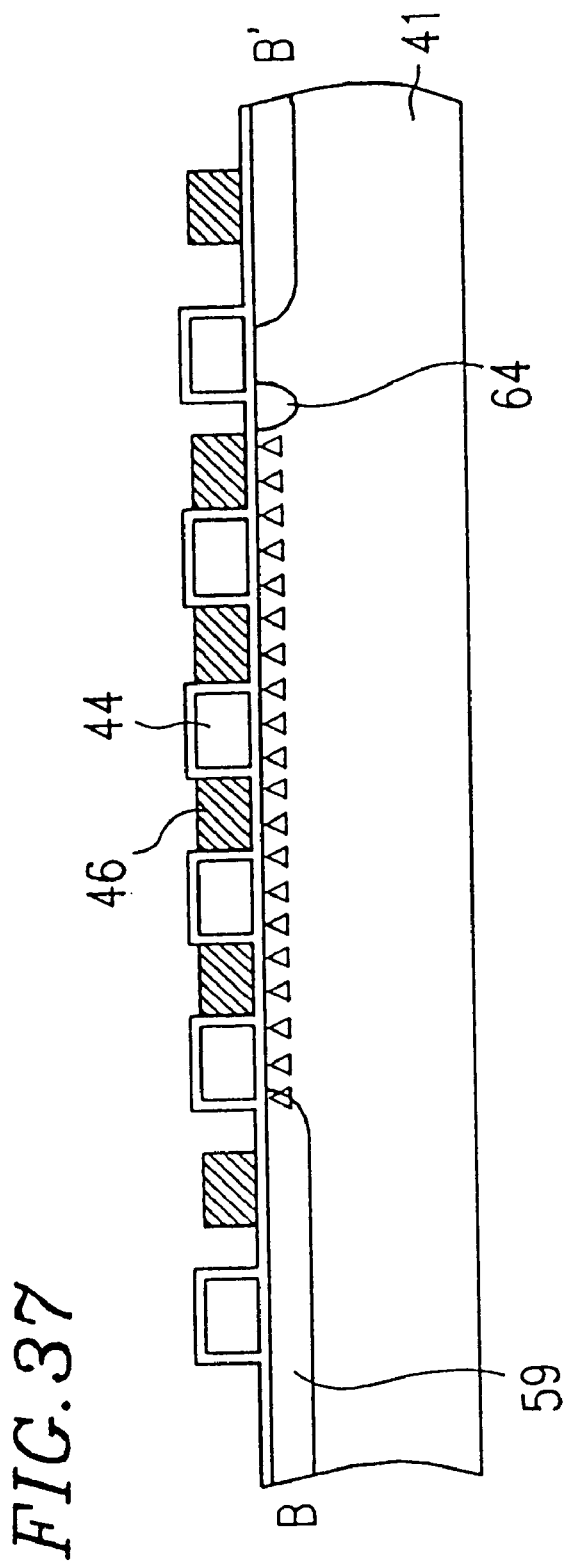
FIG. 37 is a cross-sectional view taken along the line B–B' in FIG. 25 illustrating a method for producing the semiconductor device according to the ninth embodiment of the present invention.
Figures 38A, 38B:
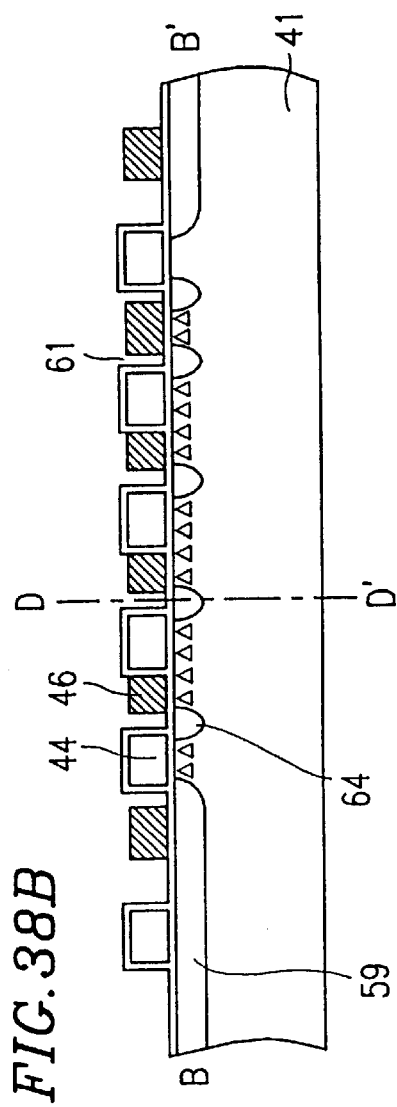
FIG. 38B is a cross-sectional view taken along the line B–B' in FIG. 25.
FIG. 38A is a cross-sectional view taken along the line D–D' in FIG. 38B, both figures illustrating a method for producing the semiconductor device according to the ninth embodiment of the present invention.

Next, after heat treatment in the later steps, a high concentration diffusion layer 64 having the conductivity type reverse to that of the semiconductor substrate 41 is formed as illustrated in FIGS. 37, 38A and 38B, thereby connecting the channel ends of the cell transistors 90 of the NAND type and the drawing electrodes 59. FIG. 37 illustrates a situation where there is no space resulting from the misalignment between the first and second gate electrodes 44 and 46, and FIGS. 38A and 38B illustrate a situation where there is a space 61 resulting from the misalignment.

Next, write operation for ROM data is performed on the channel portions 91 of the cell transistors 90 of the NAND type. The writing is performed as illustrated in FIGS. 39A–39C. First, a resist pattern 65 for writing ROM data corresponding to the ROM data to be written is formed, and ions 66 having the same conductivity type as the semiconductor substrate 41 such as boron ions are implanted from the above into the channel portions 91 of the cell transistors 90 of the NAND type beneath the upper surface of the groove 42 with relatively low implantation energy. On the other hand, ions 67 are implanted into the channel portions 91 of the cell transistors 90 of the NAND type beneath the bottom surface of the groove 42 to write the ROM data with relatively high implantation energy. Since the ion implantations into the upper surface of the groove 42 and into the bottom surface of the groove 42 have different implantation depths, one of the ion implantations does not affect the other.

Figure 40A:
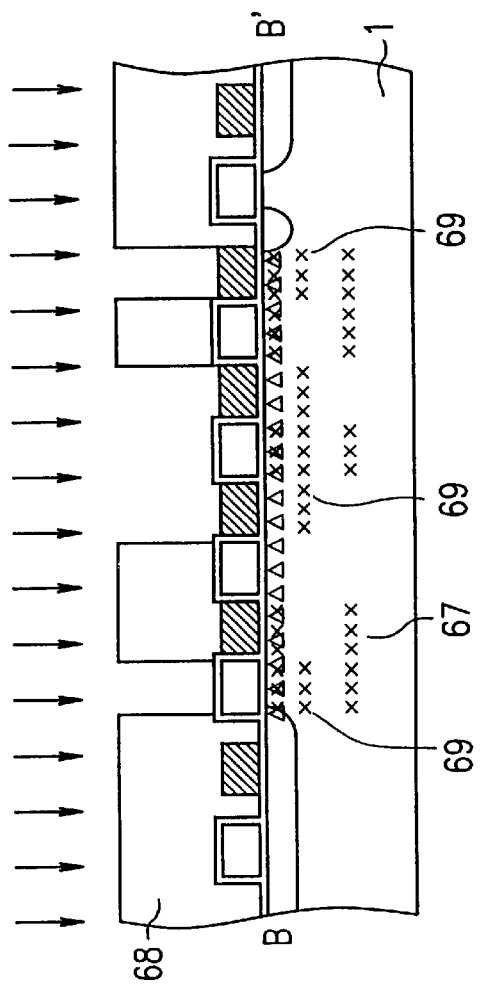
FIGS. 40A, 40B and 40C are cross-sectional views taken along the lines A–A', B–B' and C–C' in FIG. 25, respectively, illustrating the method for producing the semiconductor device according to the ninth embodiment of the present invention.
Figure 40B:
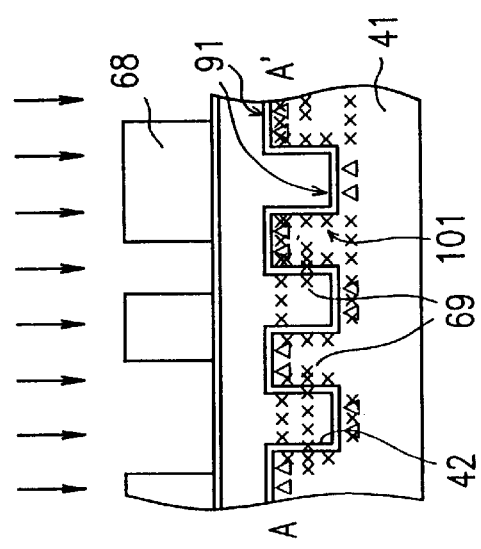
Figure 40C:
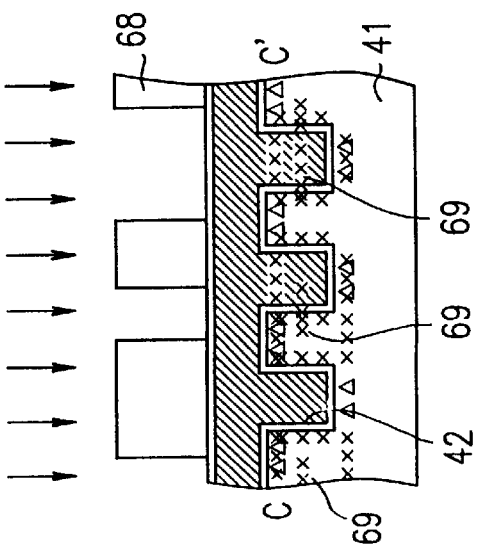

Next, the write operation for ROM data is performed on the channel portions 101 of the cell transistors 100 of the NOR type. The writing is performed as illustrated in FIGS. 40A–40C. First, a resist pattern 68 for writing ROM data corresponding to the ROM data to be written is formed, and ions 69 having the same conductivity type as the semiconductor substrate 41 such as boron ions are implanted from the above into the side walls of the groove 42 with an intermediate implantation energy. The intermediate implantation energy is between the implantation energy to the upper surface of the groove 42 and the implantation energy to the bottom surface of the groove 42. Since this ion implantation also has the implantation depth different from the above-mentioned implantation depth, it does not affect the other.

As described above, since the ion implantations performed on the upper surface, the bottom surface and the side surface of the groove 42 during the write operation for the ROM data are independent in a sense that any one of the three does not affect the remaining two, the writing of the ROM data can be performed accurately on each surface of the groove 42.

Figure 25:
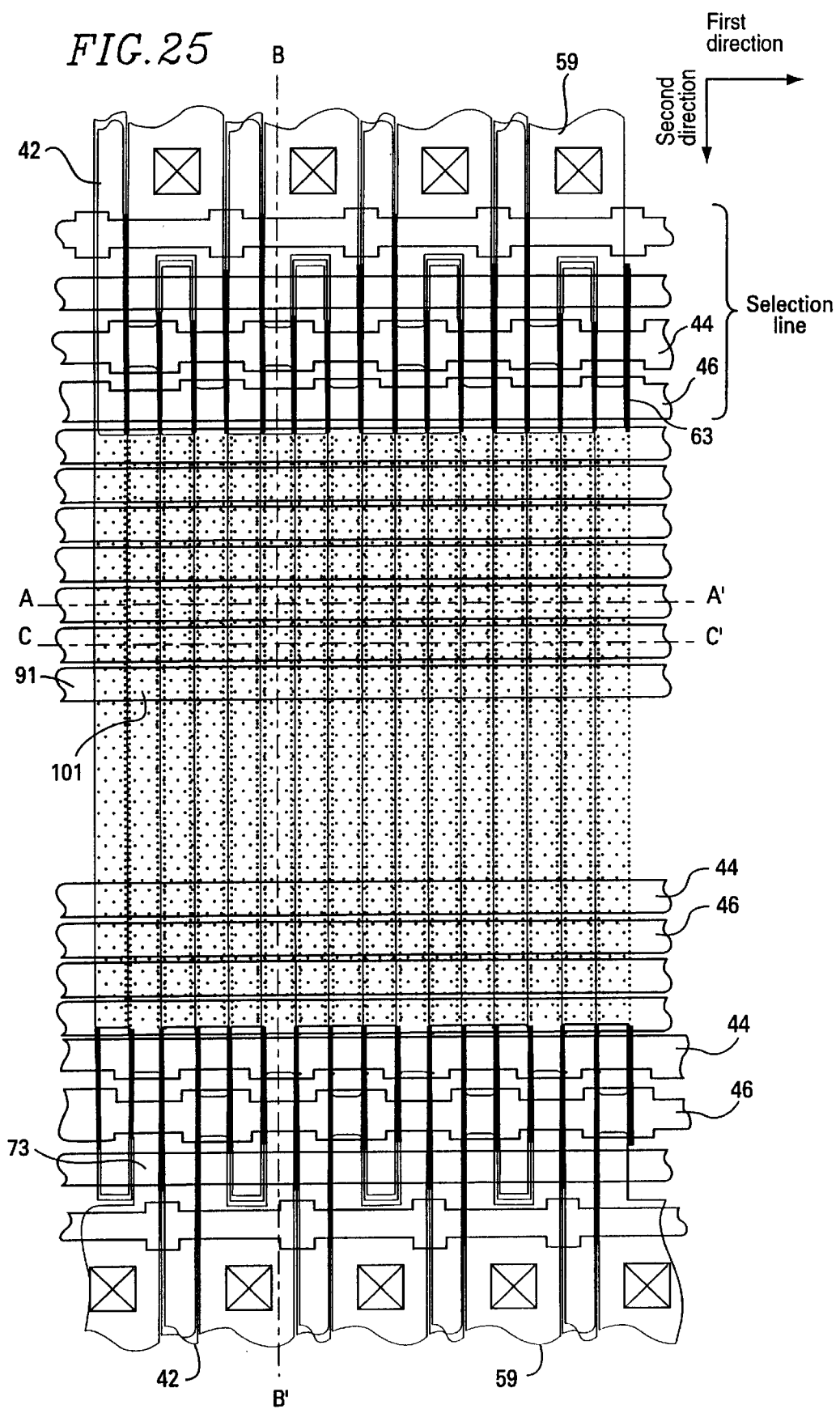
FIG. 25 is a plan view of a semiconductor device according to a ninth embodiment of the present invention.

After a series of steps such as the formation of interlevel insulators, contact holes, metal wiring and protective films, the first half of the production steps for the semiconductor device of the ninth embodiment is finished. Then, the last half of the production steps, i.e., the assembling steps are performed and the semiconductor device of the ninth embodiment illustrated in FIG. 25 is produced.

Embodiment 10

FIGS. 41A–41C and 42A–42C illustrate a semiconductor device according to a tenth embodiment of the present invention. The semiconductor device in the tenth embodiment has the same configuration as the semiconductor device in the ninth embodiment, but the production steps are different as described below. The steps shown in FIGS. 41A to 41C correspond to the steps of writing ROM data shown in FIGS. 39A to 39C, and the steps shown in FIGS. 42A to 42C correspond to the steps of writing ROM data shown in FIGS. 40A to 40C. Parts corresponding to those in the ninth embodiment are designated by the same reference numerals, and the detailed descriptions thereof are omitted.

Figure 42B:
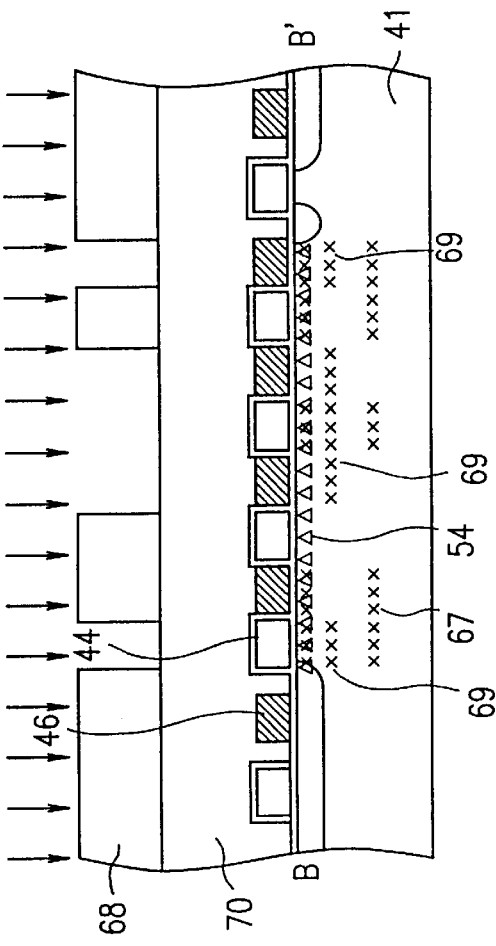
FIGS. 42A, 42B and 42C are cross-sectional views taken along the lines A–A', B–B' and C–C' in FIG. 25, respectively, illustrating the method for producing the semiconductor device according to the tenth embodiment of the present invention.
Figure 42A:
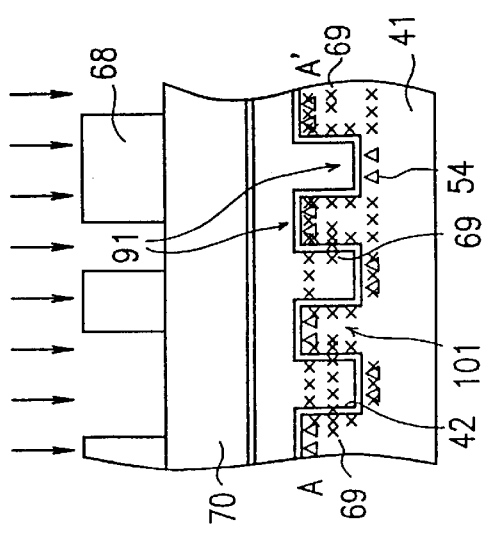
Figure 42C:
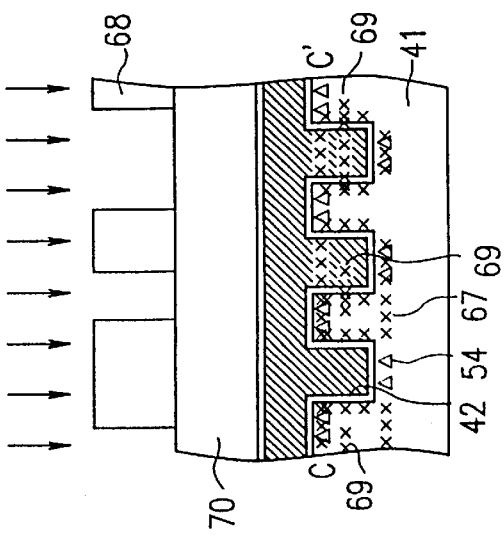

In the tenth embodiment, as illustrated in FIGS. 41B and 42B, an interlevel insulator 70 is formed on the semiconductor substrate 41 so as to cover the first gate electrode 44 and the second gate electrode 46. Then, after opening a contact hole in the interlevel insulator 70, or after forming metal wiring, the write operation for ROM data is performed on the upper surface, bottom surface and side surface of the groove 42 by performing ion implantation with each implantation energies. The implantation energy to the upper surface of the groove 42 in the tenth embodiment is higher than that in the ninth embodiment. Moreover, the implantation energy to the side surface of the groove 42 in the tenth embodiment is higher than that in the ninth embodiment, and the implantation energy to the bottom surface of the groove 42 in the tenth embodiment is higher than that in the ninth embodiment.

The later in the production steps the writing step of ROM data is, the shorter the production steps become after the step of writing ROM data, improving the production efficiency. According to the tenth embodiment, the production efficiency is improved compared to the ninth embodiment.

Embodiment 11

FIGS. 43A, 43B, 44A, 44B, 45A–45C and 46A–46C illustrate a semiconductor device according to an eleventh embodiment of the present invention. The semiconductor device in the eleventh embodiment has a configuration such that the thicknesses of the first gate electrodes 44 and the second gate electrodes 46 are smaller than those in the previous embodiments. The production steps shown in FIGS. 43A and 43B correspond to the steps of forming the first gate electrodes in the ninth embodiment illustrated in FIGS. 32A and 32B, and the production steps shown in FIGS. 44A and 44B correspond to the steps of forming the second gate electrodes illustrated in FIGS. 33A and 33B. The production steps shown in FIGS. 45A to 45C correspond to the step of writing ROM data illustrated in FIGS. 39A to 39C, and the production steps shown in FIGS. 46A to 46C correspond to the step of writing ROM data shown in FIGS. 40A to 40C. In these figures, the corresponding parts are designated by the same reference numerals. Parts corresponding to those in the ninth embodiment are designated by the same reference numerals, and the detailed description thereof are omitted.

Figure 43B:
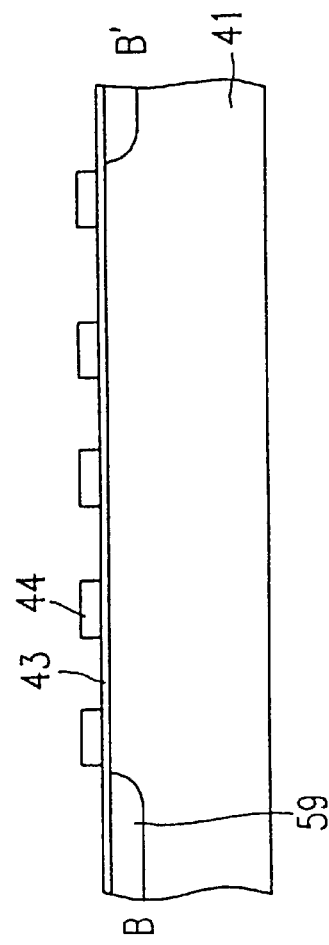
FIGS. 43A and 43B are cross-sectional views taken along the lines A–A' and B–B' in FIG. 25, respectively, illustrating a method for producing a semiconductor device according to an eleventh embodiment of the present invention.
Figure 43A:
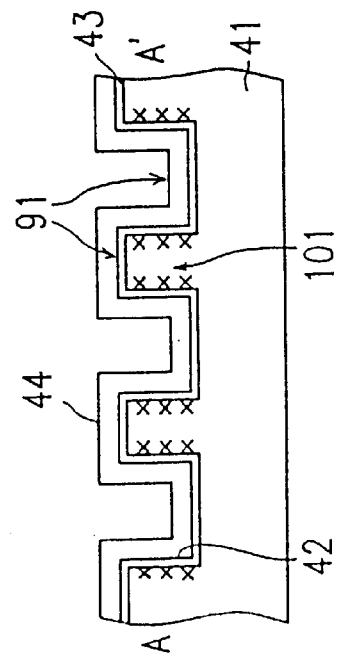
Figure 44B:
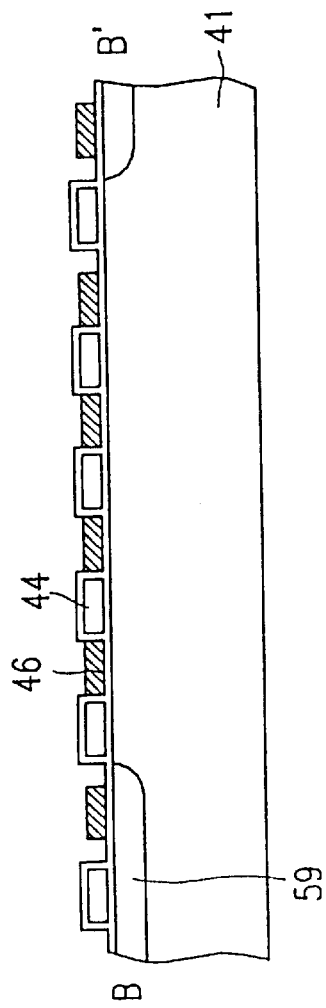
FIGS. 44A and 44B are cross-sectional views taken along the lines C–C' and B–B' in FIG. 25, respectively, illustrating the method for producing the semiconductor device according to the eleventh embodiment of the present invention.
Figure 44A:
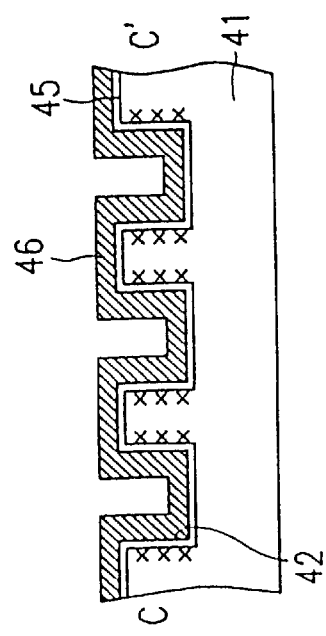
Figure 45B:
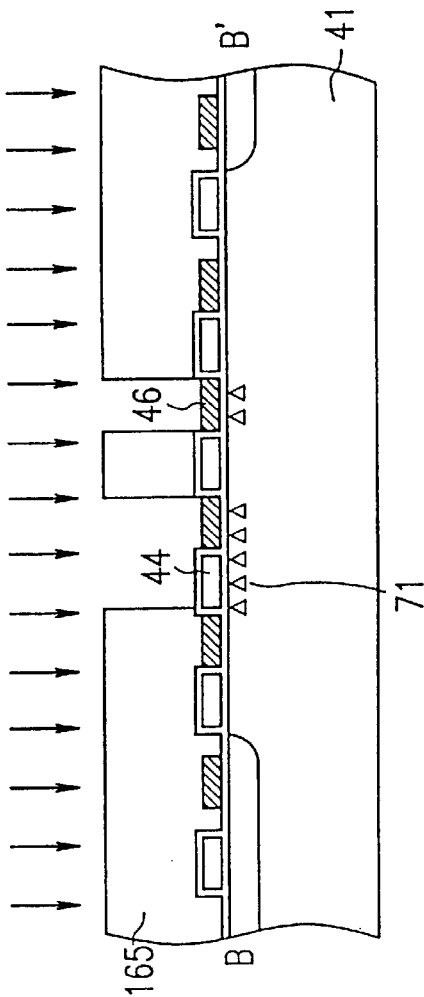
FIGS. 45A, 45B and 45C are cross-sectional views taken along the lines A–A', B–B' and C–C' in FIG. 25, respectively, illustrating the method for producing the semiconductor device according to the eleventh embodiment of the present invention.
Figure 45A:
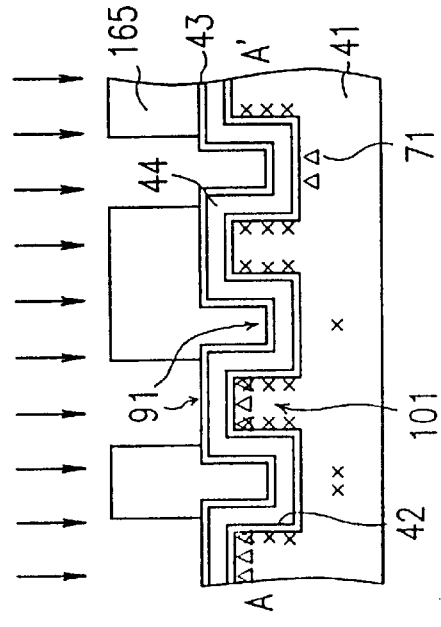
Figure 45C:
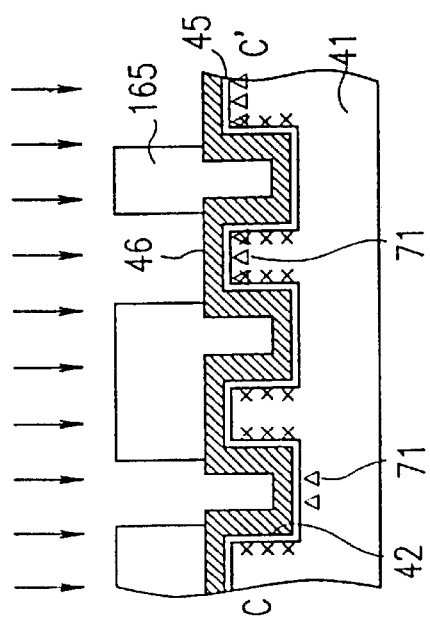

The eleventh embodiment illustrates a situation where the depth of the groove 42 is too wide particularly for the thickness of the gate electrodes 44 and 46 and, therefore, the gate electrodes 44 and 46 cannot be flattened perfectly (see FIGS. 43A and 44A). Because of this, in the eleventh embodiment, the steps of implanting ions having the conductivity type reverse to that of the semiconductor substrate 41 illustrated in FIGS. 28, 29A and 29B are omitted. And, when the writing of ROM data shown in FIGS. 45A to 45C is performed on the channel portions 91 of the cell transistors 90 of the NAND type, the ROM data are written by implanting ions 71, e.g., phosphorus ions having the conductivity type reverse to that of the semiconductor substrate 41, through a mask 165. When this is being done, since the thicknesses of the gate electrodes are almost the same for the upper surface of the semiconductor substrate 41 between the grooves 42 and the bottom surface of the groove 42 as illustrated in FIG. 43A, two procedures of writing ROM data can be simultaneously performed, one being performed on the channel portions 91 of the cell transistors 90 of the NAND type beneath the upper surface of the semiconductor substrate 41 between the grooves 42 and the other being performed on the channel portions 91 of the cell transistors 90 of the NAND type beneath the bottom surface of the groove 42. Therefore, according to the eleventh embodiment, the number of production steps can be reduced, thereby improving production efficiency.

Figure 46B:
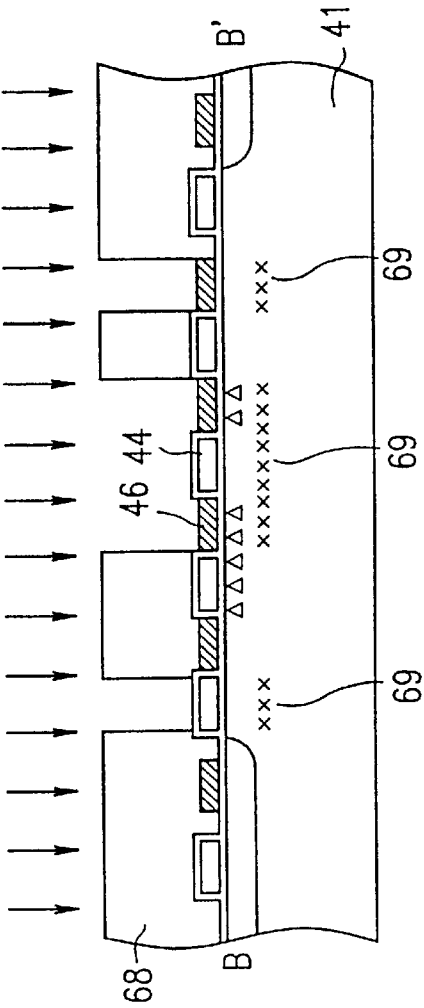
FIGS. 46A, 46B and 46C are cross-sectional views taken along the lines A–A', B–B' and C–C' in FIG. 25, respectively, illustrating the method for producing the semiconductor device according to the eleventh embodiment of the present invention.
Figure 46A:
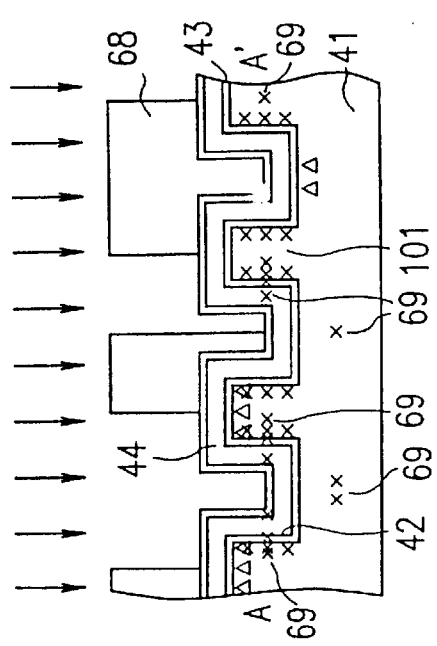
Figure 46C:
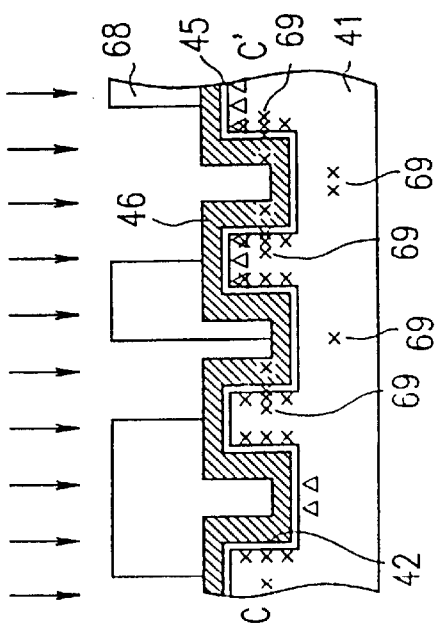

The write operation for ROM data on the channel portions 101 of the cell transistors 100 of the NOR type is performed as illustrated in FIGS. 46A to 46C by forming a resist pattern 68 which is patterned according to the ROM data and by implanting ions 69 such as boron ions as previously described.

Also in the eleventh embodiment, the ion implantation depths are different for the channel portions 91 of the cell transistors 90 of the NAND type and for the channel portions 101 of the cell transistors 100 of the NOR type. Therefore, one does not affect the other and the writing of ROM data can be accurately performed as in the eighth embodiment previously described.

Embodiment 12

Figure 47:
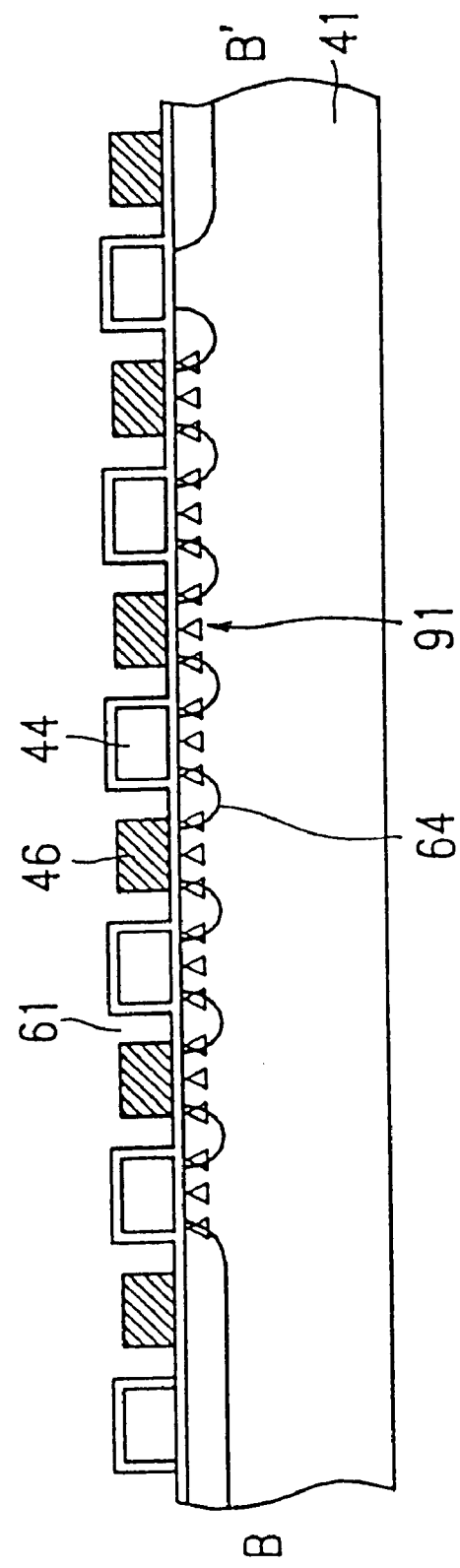
FIG. 47 is a cross-sectional view taken along the line B–B' in FIG. 25 illustrating a method for producing a semiconductor device according to a twelfth embodiment of the present invention.

FIG. 47 illustrates a semiconductor device according to a twelfth embodiment of the present invention. The twelfth embodiment assumes that a semiconductor device has a space 61 between the first gate electrode 44 and the second gate electrode 46. Also in the twelfth embodiment, a high concentration diffusion layer 64 is formed by implanting ions 58 which form the source/drain in the space 61 as in the above-described ninth embodiment, thereby surely connecting channels.

Embodiment 13

Figure 48:
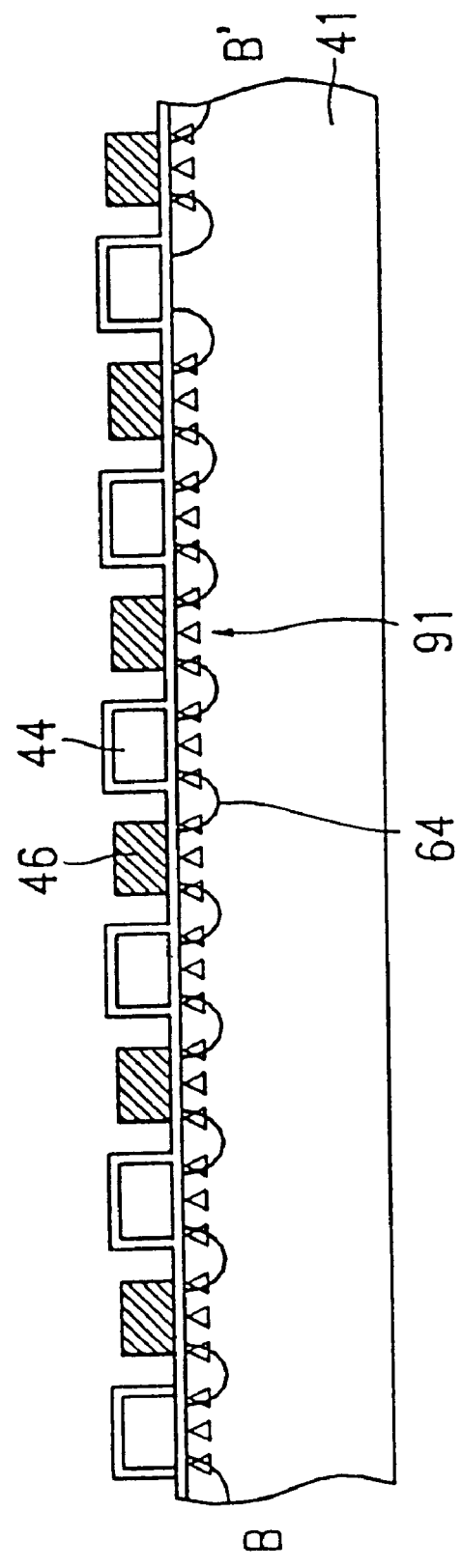
FIG. 48 is a cross-sectional view taken along the line B–B' in FIG. 25 illustrating a method for producing a semiconductor device according to a thirteenth embodiment of the present invention.

FIG. 48 illustrates a semiconductor device according to a thirteenth embodiment of the present invention. Also in the thirteenth embodiment, the semiconductor device has a space 61 between the first gate electrode 44 and the second gate electrode 46 similarly as in the twelfth embodiment, and a high concentration diffusion layer 64 which becomes the source/drain is formed in the space 61.

The thirteenth embodiment differs in the following points from each of the above-described embodiments where the semiconductor device has the groove 42. In the thirteenth embodiment, the step of forming the drawing electrode illustrated in FIGS. 30A and 30B is omitted, and the drawing electrodes 59 are simultaneously formed in the step of forming the source/drain region illustrated in FIG. 34.

Although the end of the memory cell region are taken as the drawing electrodes in FIG. 47, the drawing electrode wiring in the thirteenth embodiment are made of depression-type cell transistors.

Embodiment 14

Figure 49:
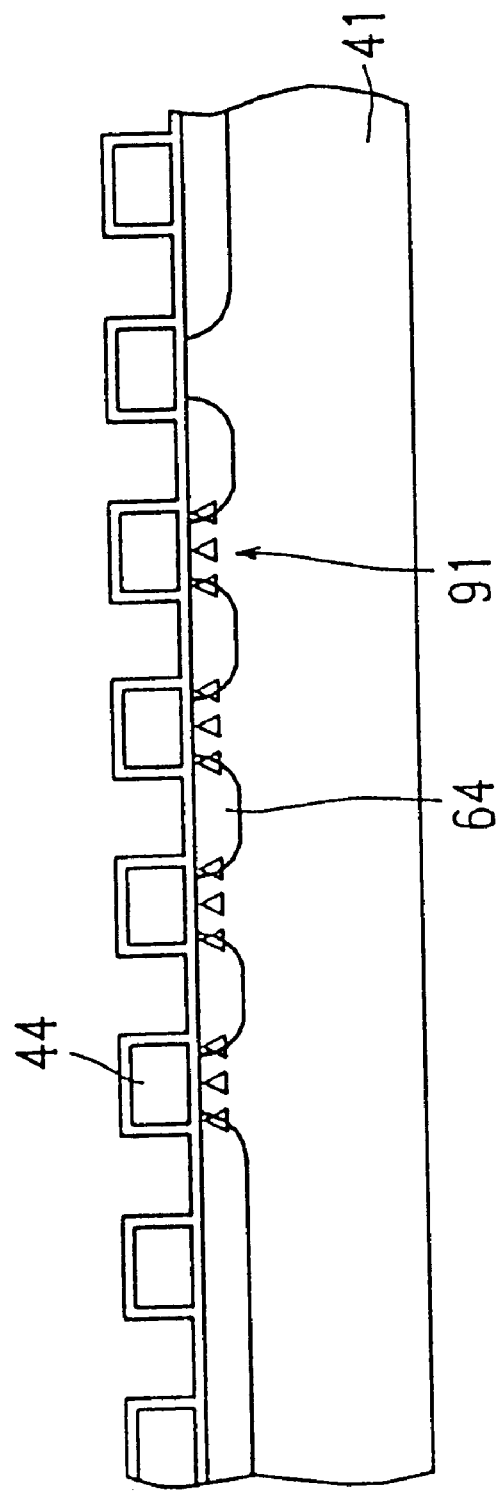
FIG. 49 is a cross-sectional view illustrating a method for producing a semiconductor device according to a fourteenth embodiment of the present invention.

FIG. 49 illustrates a semiconductor device according to a fourteenth embodiment of the present invention. The semiconductor device in the fourteenth embodiment differs from those in the ninth to thirteenth embodiments in that the gate electrodes are of a single layer structure. The production step shown in FIG. 49 corresponds to the production steps before the ion implantation for writing ROM data illustrated in FIG. 47.

According to the semiconductor device in the fourteenth embodiment, since the gate electrodes are of the single layer structure, it is inferior to those in the ninth to thirteenth embodiments in terms of high integration. However, the production steps are simplified and the production efficiency can be improved.

Embodiment 15

Figure 50:
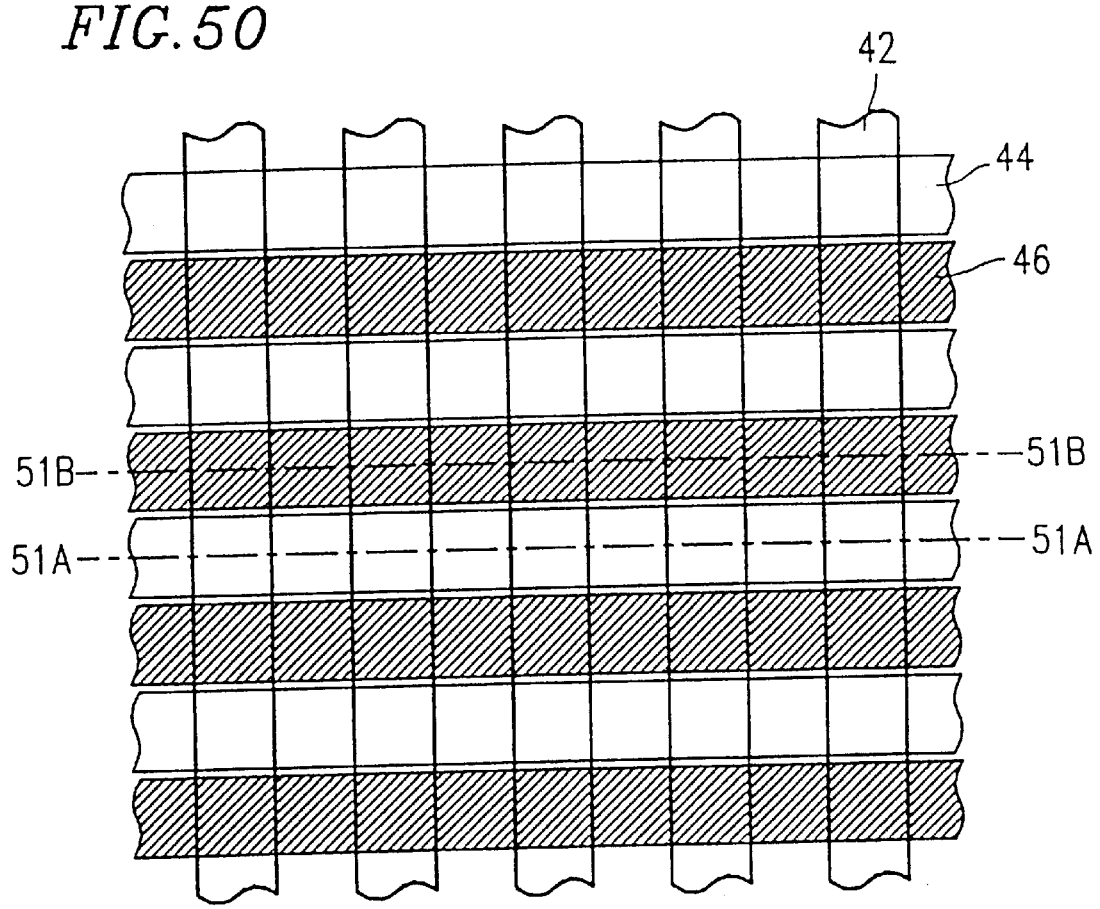
FIG. 50 is a plan view of a semiconductor device according to a fifteenth embodiment of the present invention.
Figure 51A:
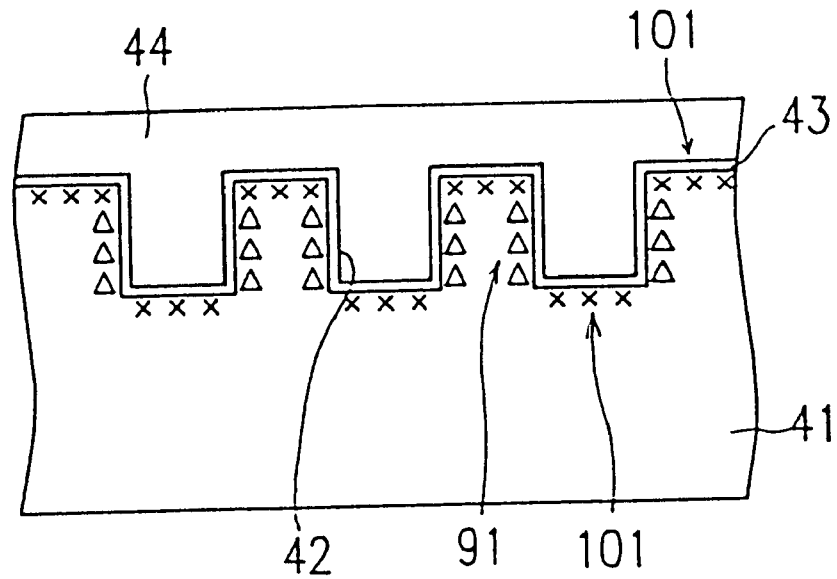
FIGS. 51A and 51B are cross-sectional views taken along the lines 51A—51A and 51B—51B in FIG. 50, respectively, illustrating the method for producing the semiconductor device according to the fifteenth embodiment of the present invention.
Figure 51B:
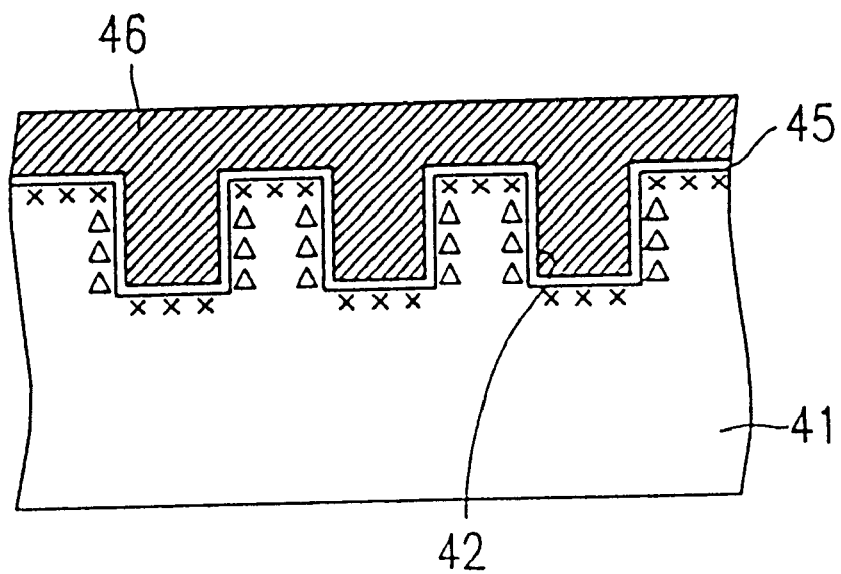

FIGS. 50, 51A and 51B illustrate a semiconductor device according to a fifteenth embodiment of the present invention. The semiconductor device in the fifteenth embodiment has the same structure as the semiconductor device in the ninth embodiment except the following. The corresponding parts are designated by the same reference numerals and the descriptions thereof are omitted. Only the portions which are different will be described below.

As illustrated in FIGS. 51A and 51B, the channel portions of the first cell transistors 90 of the NAND type are formed in the side wall of the groove 42 under the first gate electrode 44, and the channel portions of the third cell transistors 100 of the NOR type are formed both beneath the upper surface of the semiconductor substrate 41 between the grooves 42 and beneath the bottom surface of the groove 42. Moreover, the channel portions 91 of the second cell transistors 90 of the NAND type are formed in the side wall of the groove 42 under the second gate electrode 46, and the channel portions 101 of the fourth cell transistors 100 of the NOR type are formed both beneath the upper surface of the semiconductor substrate 41 between the grooves 42 and beneath the bottom surface of the groove 42. That is, the locations of the formation of the channel portions 91 of the cell transistors 90 of the NAND type and of the channel portions 101 of the cell transistors 100 of the NOR type with respect to the groove 42 in the semiconductor device in the ninth embodiment are reversed for the semiconductor device in the fourteenth embodiment.

Also in the semiconductor device of the fifteenth embodiment, the same effect as in the above-described embodiment can be obtained.

Embodiment 16

Figure 53A:
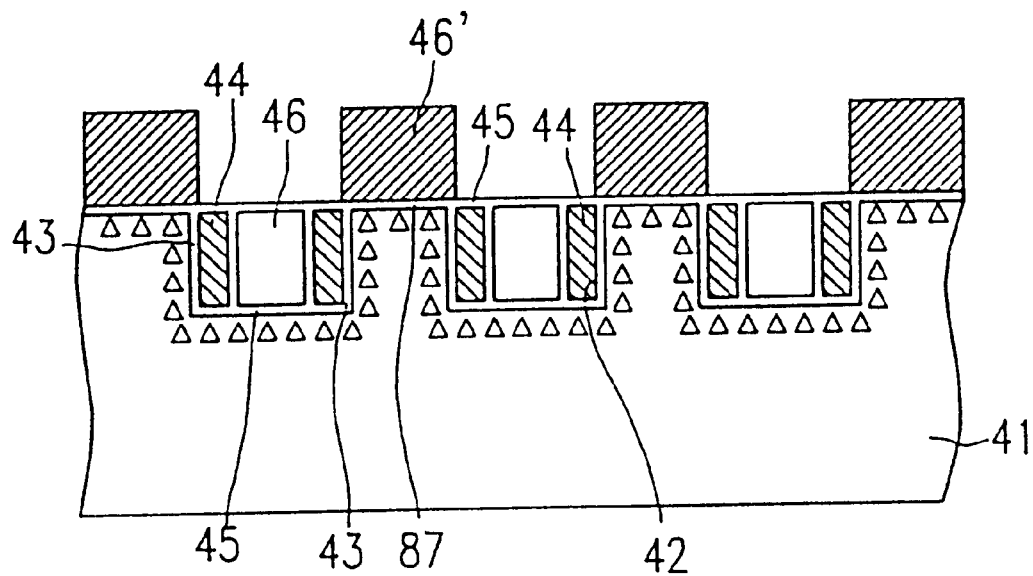
FIGS. 53A and 53B are cross-sectional views taken along the lines 53A—53A and 53B—53B in FIG. 52, respectively, illustrating a method for producing a semiconductor device according to a sixteenth embodiment of the present invention.
Figure 53B:
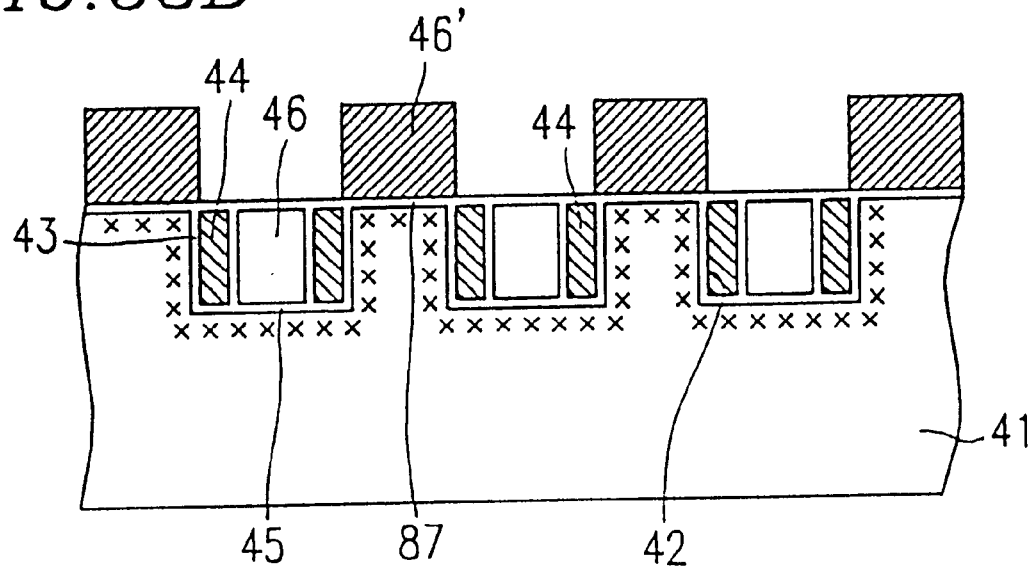
Figure 54A:
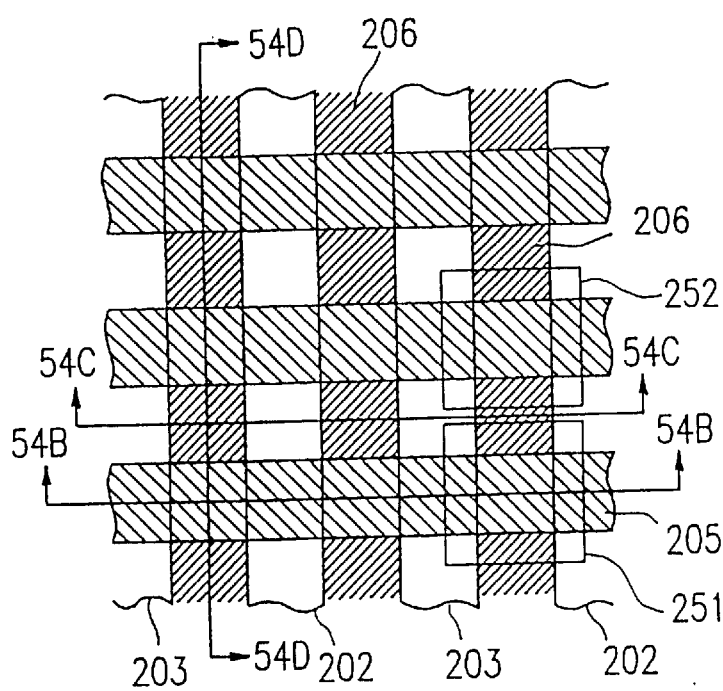
FIG. 54A is a plan view illustrating a first conventional example.
Figure 54D:
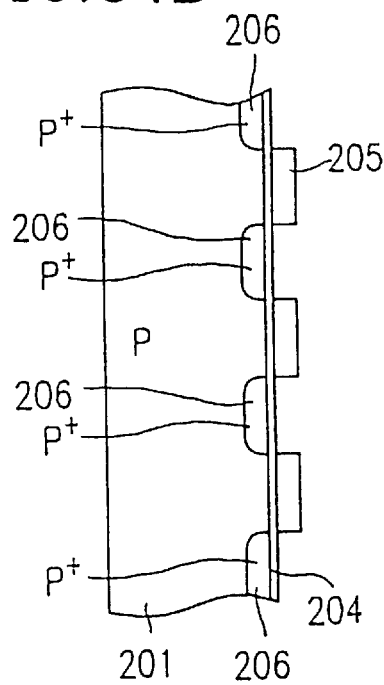
FIGS. 54B, 54C and 54D are cross-sectional views taken along the lines 54B—54B, 54C—54C and 54D—54D in FIG. 54A, respectively.
Figure 54B:
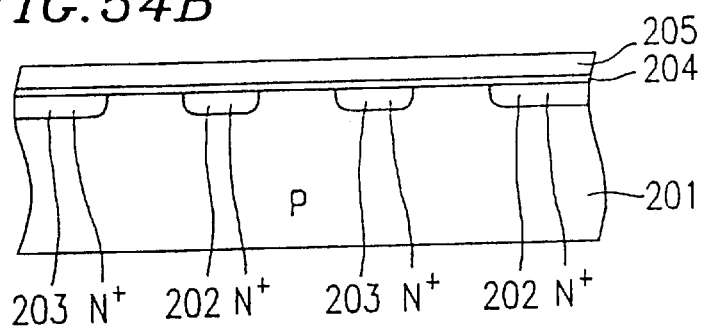
Figure 54C:
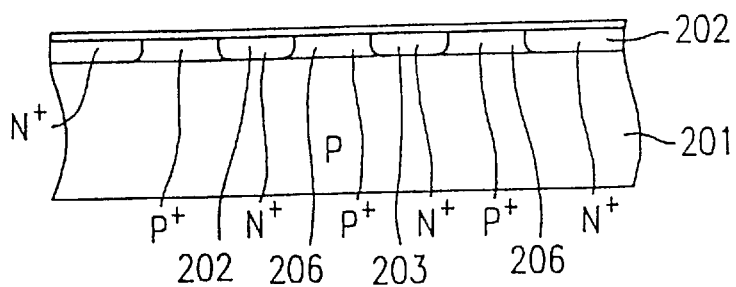
Figure 55A:
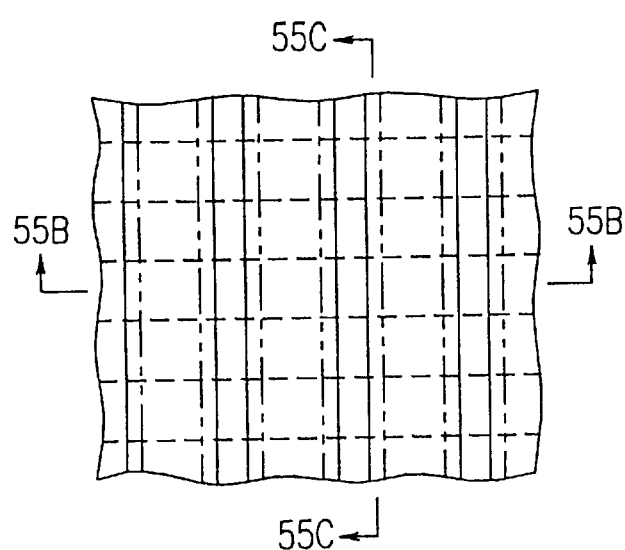
FIG. 55A is a plan view illustrating a second conventional example.
Figure 55C:
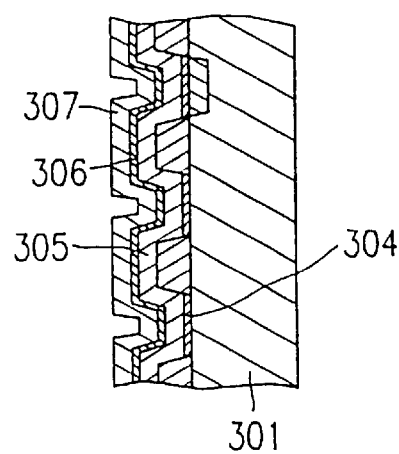
FIGS. 55B and 55C are cross-sectional views taken along the lines 55B—55B and 55C—55C in FIG. 55A, respectively.
Figure 55B:
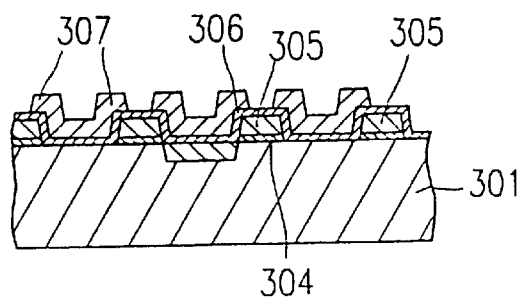
Figure 56A:
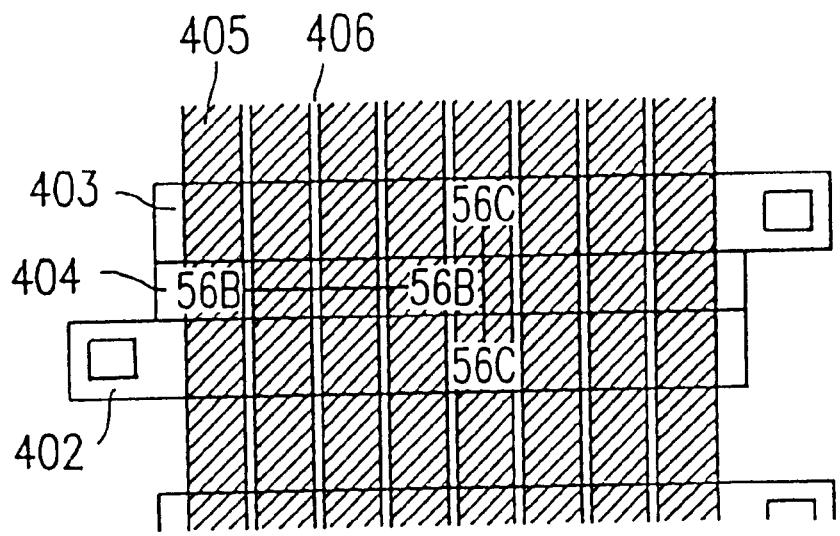
FIG. 56A is a plan view illustrating a third conventional example.
Figure 56B:
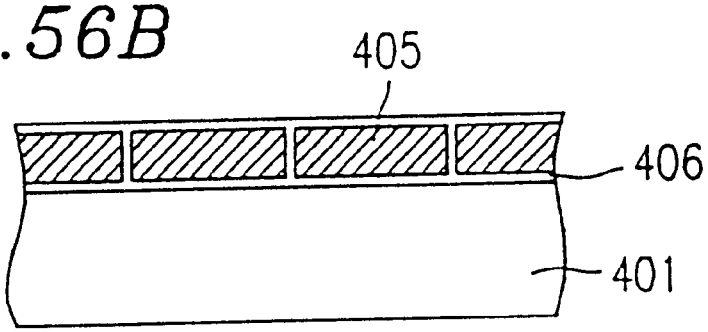
FIGS. 56B and 56C are cross-sectional views taken along the lines 55B—55B and 55C—55C in FIG. 56A, respectively.
Figure 56C:
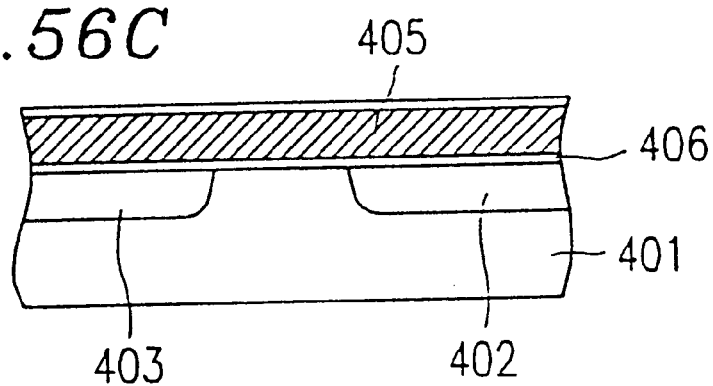

FIGS. 52, 53A and 53B illustrate a semiconductor device according to a sixteenth embodiment of the present invention. In the sixteenth embodiment, the first gate electrodes 44 which become the first word lines are formed over both side walls of the groove 42, and the second gate electrodes 46 and 46' which become the second word lines are formed over the bottom surface of the groove 42 and over the upper surface of the semiconductor substrate 41 between the grooves 42, thereby achieving a structure where higher integration of memory cells can be realized.

Specific description will be given below. The semiconductor device in the sixteenth embodiment differs from those in the ninth to fifteenth embodiments in that the grooves 42 are formed in the first direction. In addition, formed over the both side walls of each of the grooves 42 are the side wall gate electrodes (first gate electrodes) 44 which become the first word lines with the first gate insulating films 43 being inserted therebetween. Moreover, the bottom surface gate electrodes (second gate electrodes) 46 which become the second word lines are formed on the bottom surface of the grooves 42 with the second gate insulating film 45 being inserted therebetween. Similarly, the upper surface gate electrodes 46' which become the second word lines are also formed over the upper surface of the semiconductor substrate 41 between the groove 42 with the second gate insulating film 45 being inserted therebetween.

In addition, the channel portions 91 of the cell transistors 90 of the NAND type and the channel portions 101 of the cell transistors 100 of the NOR type are alternately formed in the second direction which is perpendicular to the first direction over the upper surfaces, side walls and the bottom surfaces of the semiconductor substrate 41 between the grooves 42.

In the sixteenth embodiment, higher integration of the memory cells compared to the first embodiment can also be achieved as in the above-described ninth embodiment.

Other Embodiments

All the contents of the embodiments illustrated in the attached figures are as described above. However, in the method according to the present invention, the sequences of production steps are not limited to those presented in the above-described embodiments, but each step can be carried out in an arbitrary order.

According to the present invention described above, NAND-type cell transistors and NOR-type cell transistors are simultaneously present, and they are disposed in the memory cell region of the semiconductor substrate such that the channel region of each cell transistor makes contact with the neighboring channel region. Therefore, the degree of integration of the cell transistors both in the first direction which is the wiring direction of the word lines and in the second direction which is perpendicular to the first direction can be improved, thereby realizing high integration of the memory cells. Therefore, according to the present invention, larger storage capacity of the semiconductor device including mask ROMs can be achieved, and the production cost can be considerably reduced due to the smaller size of a chip.

Moreover, by storing multi-value information in the cell transistor of the NOR type, high integration of memory cells is further achieved. For example, if the threshold voltage of the cell transistor of the NOR type selectively differs, then the threshold voltage takes, for example, four values and the integration is four times to six times greater as compared to the first embodiment. The reason is as follows. Because of the cell transistor of the NOR type, the integration becomes four times greater than that of the first conventional example, and because of the cell transistor of the NAND type, the integration becomes two times greater than that of the first conventional example. For this reason, according to the present invention, the integration which is six times greater (4 times+2 times=6 times) than that of the first conventional example can be achieved.

Moreover, by storing multi-valued information in the cell transistors of the NOR type, higher integration of the memory cells can further be achieved.

Moreover, in accordance with a semiconductor device in one embodiment of the present invention, a plurality of grooves are formed on the semiconductor substrate. The gate electrodes of the cell transistors are formed over the upper surface of the semiconductor substrate between the grooves and the bottom surface and side wall of the groove, and the channel regions of the cell transistors are formed beneath the upper surface of the semiconductor substrate between the grooves and the bottom surface and side wall of the groove. With this configuration, more number of cell transistors can be provided per unit area of the substrate when viewed from above, thereby further improving the degree of integration of the memory cells.

Moreover, in accordance with a semiconductor device in another embodiment of the present invention, either of the first word lines or the second word lines are formed over the upper surface of the semiconductor substrate between the grooves and over the bottom surface of the groove with an insulating film being inserted therebetween, and the other word lines are formed on the side walls of the grooves. Therefore, the wiring pitch in the plan view can further be made small, thereby further achieving the higher integration.

Moreover, according to a method for producing the semiconductor device of the present invention, each of the production steps described above can be performed in an arbitrary order. Therefore, if the ion implantation step for writing ROM data is to be performed simultaneously for both the NAND side and the NOR side using one mask, the write operation for ROM data requires only one step of ion implantation. This simplifies the production steps, thereby improving the production efficiency for the semiconductor device.

Moreover, as to the write operation for ROM data for the mask ROM to which the present invention is applied, the later the writing of ROM data is in the production steps, the shorter the production steps become after the writing of ROM data. Therefore, if this step is performed at the end of the production steps, production efficiency can be improved accordingly.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:

a semiconductor substrate;

a plurality of first transistors formed over said semiconductor substrate in a matrix configuration, each of said first transistors having a channel region;

a plurality of second transistors formed over said semiconductor substrate in a matrix configuration, each of said second transistors having a channel region;

a plurality of word lines formed in parallel in a first direction, said word lines functioning as word lines and gate electrodes for said plurality of first transistors and said plurality of second transistors;

wherein at least two channel regions of said plurality of first transistors make contact in a second direction substantially perpendicular with respect to said first direction;

at least two channel regions of said plurality of second transistors make contact in said second direction; and the channel regions of said plurality of first transistors function as source/drain regions for said plurality of second transistors.

2. A semiconductor memory device according to claim 1, wherein:

said plurality of first transistors are classified into a first group of transistors having a first threshold voltage for making said first transistors conductive and a second group of transistors having a second threshold voltage for making said first transistors conductive; and said plurality of second transistors are classified into a third group of transistors having a third threshold voltage for making said second transistors conductive and a fourth group of transistors having a fourth threshold voltage for making said second transistor conductive.

3. A semiconductor memory device, comprising:

a semiconductor substrate;

a plurality of word lines formed over said semiconductor substrate in parallel in a first direction;

a column of transistors including a plurality of first transistors, each of said plurality of first transistors having a gate electrode and a channel region, said gate electrode being part of one of said plurality of word lines, said plurality of first transistors being connected in series in a second direction which is substantially perpendicular to said first direction and being arranged in parallel in said first direction; and a row of transistors including a plurality of second transistors, each of said plurality of second transistors having a gate electrode and a channel region, said gate electrode being a part of one of said plurality of word lines, said channel region of at least one of said plurality of second transistors being connected to said channel region of at least one of said plurality of first transistors, said plurality of second transistors adjoining one another in said second direction, and being arranged in parallel in said second direction; wherein a threshold voltage for turning on said plurality of second transistors is higher than a threshold voltage for turning on said plurality of first transistors.

4. A semiconductor memory device according to claim 3, wherein:
  a plurality of grooves are formed on said semiconductor substrate in parallel in said second direction, each of said plurality of grooves having a side surface and a bottom surface;
  channel regions of said plurality of first transistors of one of said columns of transistors are formed over the bottom surface of one of said grooves;
  channel regions of said plurality of first transistors of another one of said columns of transistors are formed over the upper surface of said semiconductor substrate between grooves; and
  a channel region of one of said plurality of second transistors of one of said columns of transistors is formed over the side surface of one of said grooves.

5. A semiconductor memory device according to claim 3, wherein:
  a plurality of grooves are formed on said semiconductor substrate in parallel in said second direction, each of said plurality of grooves having a side surface and a bottom surface;
  channel regions of said plurality of second transistors of one of said columns of transistors are formed over the bottom surface of one of said grooves;
  channel regions of said plurality of second transistors of another one of said columns of transistors are formed over the upper surface of said semiconductor substrate between grooves; and
  a channel region of one of said plurality of first transistors of one of said columns of transistors is formed over the side surface of one of said grooves.

6. A semiconductor memory device according to claim 3, wherein:
  said plurality of word lines are classified into a plurality of first word lines and a plurality of second word lines;
  a plurality of grooves are formed over said semiconductor substrate in parallel in said first direction, each of said plurality of grooves having a side surface and a bottom surface;
  at least one of said plurality of first word lines is formed over at least one of the bottom surfaces of said plurality of grooves;
  at least one of said plurality of first word lines is formed over at least one of the upper surfaces of said semiconductor substrate between said plurality of grooves;
  at least one of said plurality of second word lines is formed along at least one of the side surfaces of said plurality of grooves;
  channel regions of said plurality of first transistors of one of said columns of transistors are formed over the bottom surface of one of said grooves;
  channel regions of said plurality of first transistors of one of said columns of transistors are formed over the upper surface of said semiconductor substrate between grooves;
  a channel region of one of said plurality first transistors of one of said columns of transistors is formed over the side surface of one of said grooves;
  channel regions of said plurality of second transistors of one of said rows of transistors are formed over the bottom surface of one of said grooves;
  channel regions of said plurality of second transistors of one of said rows of transistors are formed over the upper surface of said semiconductor substrate between grooves; and
  a channel region of one of said plurality of second transistors of one of said rows of transistors is formed over the side surface of one of said grooves.

7. A semiconductor memory device according to claim 3, wherein said first transistor is a transistor of the NAND type, and said second transistor is a transistor of the NOR type.

8. A semiconductor memory device according to claim 4, wherein said first transistor is a transistor of the NAND type, and said second transistor is a transistor of the NOR type.

9. A semiconductor memory device according to claim 5, wherein said first transistor is a transistor of the NAND type, and said second transistor is a transistor of the NOR type.

10. A semiconductor memory device according to claim 6, wherein said first transistor is a transistor of the NAND type, and said second transistor is a transistor of the NOR type.

11. A semiconductor memory device, comprising:
  a plurality of first transistors each having a channel region;
  a plurality of second transistors each having a channel region; and
  a plurality of word lines insulated from said channel regions of said plurality of first transistors and said channel regions of said plurality of second transistors;
  at least one of said word lines functioning as a word line and a gate electrode;
  wherein said channel region of at least one of said plurality of first transistors adjoins said channel region of at least one of said plurality of second transistors; and
  the channel regions of said plurality of first transistors function as source/drain regions for said plurality of second transistors.

12. A semiconductor memory device, comprising:
  a semiconductor substrate;
  a plurality of first transistors formed over said semiconductor substrate in a matrix configuration, each of said first transistors having a channel region;
  a plurality of second transistors formed over said semiconductor substrate in a matrix configuration, each of said second transistors having a channel region;
  a plurality of word lines formed in parallel in a first direction, said word lines functioning as word lines and gate electrodes for said plurality of first transistors and said plurality of second transistors; wherein
    at least two channel regions of said plurality of first transistors make contact in a second direction substantially perpendicular with respect to said first direction;
    at least two channel regions of said plurality of second transistors make contact in said second direction; and
    the channel length direction of said first transistors is the second direction and the channel length direction of said second transistors is the first direction.

13. A semiconductor memory device, comprising:
  a semiconductor substrate;
  a first plurality of memory cells formed on said semiconductor substrate and arranged in a NOR configuration; and
  a second plurality of memory cells formed on said semiconductor substrate and arranged in a NAND configuration,
  wherein channel regions of the memory cells arranged in the NAND configuration function as source/drain regions for the memory cells arranged in the NOR configuration.

14. A semiconductor memory device according to claim 13, wherein the threshold voltages of the memory cells arranged in the NOR configuration are higher than the threshold voltages of the memory cells arranged in the NAND configuration.

15. A semiconductor memory device according to claim 13, wherein:
the memory cells arranged in the NAND configuration include depression-type memory cells and enhancement-type memory cells, and
the memory cells arranged in the NOR configuration include memory cells having a middle threshold voltage higher than the threshold voltage of the enhancement-type memory cells, and memory cells having a high threshold voltage higher than the middle threshold voltage.

16. A semiconductor memory device according to claim 13, wherein the memory cells arranged in the NOR configuration store multi-value information.

17. A semiconductor memory device according to claim 13, wherein the channel length direction of the memory cells arranged in the NOR configuration is perpendicular to the channel length direction of the memory cells arranged in the NAND configuration.

18. A semiconductor memory device comprising:
a semiconductor substrate;
parallel grooves formed in said semiconductor substrate;
a first plurality of memory cells formed on said semiconductor substrate and arranged in a NOR configuration; and
a second plurality of memory cells formed on said semiconductor substrate and arranged in a NAND configuration,
wherein channel regions for said memory cells arranged in one of the NOR configuration and the NAND configuration are formed in side surfaces of said parallel grooves, and
wherein channel regions for said memory cells arranged in the other of the NOR configuration and the NAND configuration are formed in bottom surfaces of said parallel grooves and in surfaces of said semiconductor substrate between said parallel grooves.

19. A semiconductor memory device according to claim 18, wherein channel regions of the memory cells arranged in the NAND configuration function as source/drain regions for the memory cell transistors arranged in the NOR configuration.

20. A semiconductor memory device according to claim 18, wherein the threshold voltages of the memory cells arranged in the NOR configuration are higher than the threshold voltages of the memory cells arranged in the NAND configuration.

21. A semiconductor memory device according to claim 18, wherein:
the memory cells arranged in the NAND configuration include depletion-type memory cells and enhancement-type memory cells, and
the memory cells arranged in the NOR configuration include memory cells having a middle threshold voltage higher than the threshold voltage of the enhancement-type memory cells, and memory cells having a high threshold voltage higher than the middle threshold voltage.

22. A semiconductor memory device according to claim 18, wherein the memory cells arranged in the NOR configuration store multi-value information.

23. A semiconductor memory device according to claim 18, wherein the channel length direction of the memory cells arranged in the NOR configuration is perpendicular to the channel length direction of the memory cells arranged in the NAND configuration.

24. A semiconductor memory device according to claim 23, wherein word lines for the memory cells arranged in the NOR configuration and for the memory cells arranged in the NAND configuration extend in a direction perpendicular to said parallel grooves.

25. A semiconductor memory device according to claim 24, wherein a thickness of the word lines for the memory cells arranged in the NAND configuration is almost the same for those portions of these word lines that are insulated from the channel regions formed in bottom surfaces of said parallel grooves and for those portions of these word lines that are insulated from the channel regions formed in surfaces of said semiconductor substrate between said parallel grooves.

26. A semiconductor memory device according to claim 24, wherein spaces are provided between said word lines.

27. A semiconductor memory device according to claim 26, wherein high concentration diffusion layers are formed in said semiconductor substrate at positions corresponding to said spaces.

28. A semiconductor memory device according to claim 18, wherein a depth of an ion implantation for the channel regions of the memory cells arranged in the NAND configuration is different than a depth of an ion implantation for the channel region of the memory cells arranged in the NOR configuration.

29. A semiconductor memory device, comprising:
a semiconductor substrate;
word lines; and
memory cells formed on said semiconductor substrate and connected to said word lines, said memory cells including a first plurality of memory cells arranged in a NOR configuration and a second plurality of memory cells arranged in a NAND configuration,
wherein channel regions of those ones of said memory cells arranged in the NOR configuration that are connected to one of said word lines are disposed between channel regions of those ones of said memory cells arranged in the NAND configuration that are connected to the same one of said word lines.

30. A semiconductor memory device according to claim 28, wherein the memory cells arranged in the NOR configuration store multi-value information.

31. A semiconductor memory device according to claim 28, wherein the channel length direction of the memory cells arranged in the NOR configuration is perpendicular to the channel length direction of the memory cells arranged in the NAND configuration.

32. A semiconductor memory device according to claim 28, wherein channel regions of the memory cells arranged in the NAND configuration function as source/drain regions for the memory cells arranged in the NOR configuration.

* * * * *